US009515086B2

(12) United States Patent
Yon et al.

(10) Patent No.: US 9,515,086 B2
(45) Date of Patent: Dec. 6, 2016

(54) SEMICONDUCTOR DEVICE, ELECTRONIC DEVICE, AND METHOD OF FABRICATING THE SAME

(71) Applicants: Gukhyon Yon, Hwaseong-si (KR); Jaeyoung Ahn, Seongnam-si (KR); Bio Kim, Seoul (KR); Young-Jin Noh, Suwon-si (KR); Kwangmin Park, Seoul (KR); Dongchul Yoo, Seongnam-si (KR)

(72) Inventors: Gukhyon Yon, Hwaseong-si (KR); Jaeyoung Ahn, Seongnam-si (KR); Bio Kim, Seoul (KR); Young-Jin Noh, Suwon-si (KR); Kwangmin Park, Seoul (KR); Dongchul Yoo, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/834,454

(22) Filed: Aug. 25, 2015

(65) Prior Publication Data
US 2016/0118398 A1    Apr. 28, 2016

(30) Foreign Application Priority Data
Oct. 24, 2014 (KR) ........................ 10-2014-0145348

(51) Int. Cl.
*H01L 27/115* (2006.01)
*H01L 29/51* (2006.01)
(Continued)

(52) U.S. Cl.
CPC ..... *H01L 27/11582* (2013.01); *H01L 21/0214* (2013.01); *H01L 21/0217* (2013.01);
(Continued)

(58) Field of Classification Search
CPC  H01L 29/792; H01L 29/66833; H01L 27/115; H01L 27/11582; H01L 27/11578; H01L 29/7926; H01L 27/11551; H01L 29/7883; H01L 29/42348; H01L 27/11563; H01L 27/11517; G11C 16/10
See application file for complete search history.

(56) References Cited

U.S. PATENT DOCUMENTS

| 7,692,196 B2 | 4/2010 | Jeon et al. |
| 7,867,850 B2 | 1/2011 | Bhattacharyya |

(Continued)

FOREIGN PATENT DOCUMENTS

| KR | 10-2014-0037455 | 3/2004 |
| KR | 10-2010-0018751 | 2/2010 |

(Continued)

*Primary Examiner* — Karen Kusumakar
(74) *Attorney, Agent, or Firm* — Muir Patent Law, PLLC

(57) ABSTRACT

Provided are a three dimensional semiconductor memory device and a method of fabricating the same. In the three dimensional semiconductor memory device, a stack of gate electrodes and insulating layers may be formed on a substrate, a channel structure may extend through the stack and connect to the substrate. A blocking insulating layer, a charge storing layer and a tunnel insulating layer may be formed between each gate electrode and the channel structure. The tunnel insulating layer may include a high-k dielectric layer with a low charge trap site density. The tunnel insulating layer may also include a first and a second tunnel insulating layers, and the high-k dielectric layer is provided between the first and second tunnel insulating layers.

18 Claims, 45 Drawing Sheets

(51) Int. Cl.
*H01L 21/02* (2006.01)
*H01L 21/28* (2006.01)
*H01L 29/792* (2006.01)

(52) U.S. Cl.
CPC .. *H01L 21/02164* (2013.01); *H01L 21/28282* (2013.01); *H01L 29/511* (2013.01); *H01L 29/517* (2013.01); *H01L 29/518* (2013.01); *H01L 29/7926* (2013.01); *H01L 21/28273* (2013.01); *H01L 27/11556* (2013.01)

(56) References Cited

U.S. PATENT DOCUMENTS

| | | |
|---|---|---|
| 8,415,715 B2 | 4/2013 | Bhattacharyya |
| 8,460,999 B2 | 6/2013 | Baik et al. |
| 8,674,430 B2 * | 3/2014 | Yasuda ............. H01L 21/28282 257/316 |
| 2006/0261401 A1 * | 11/2006 | Bhattacharyya ....... B82Y 10/00 257/316 |
| 2013/0234222 A1 | 9/2013 | Yasuda et al. |
| 2013/0270625 A1 * | 10/2013 | Jang ................... H01L 29/7926 257/324 |
| 2014/0073099 A1 | 3/2014 | Park et al. |

FOREIGN PATENT DOCUMENTS

| | | |
|---|---|---|
| KR | 10-1151153 B1 | 6/2012 |
| KR | 10-2013-0013777 | 2/2013 |

* cited by examiner

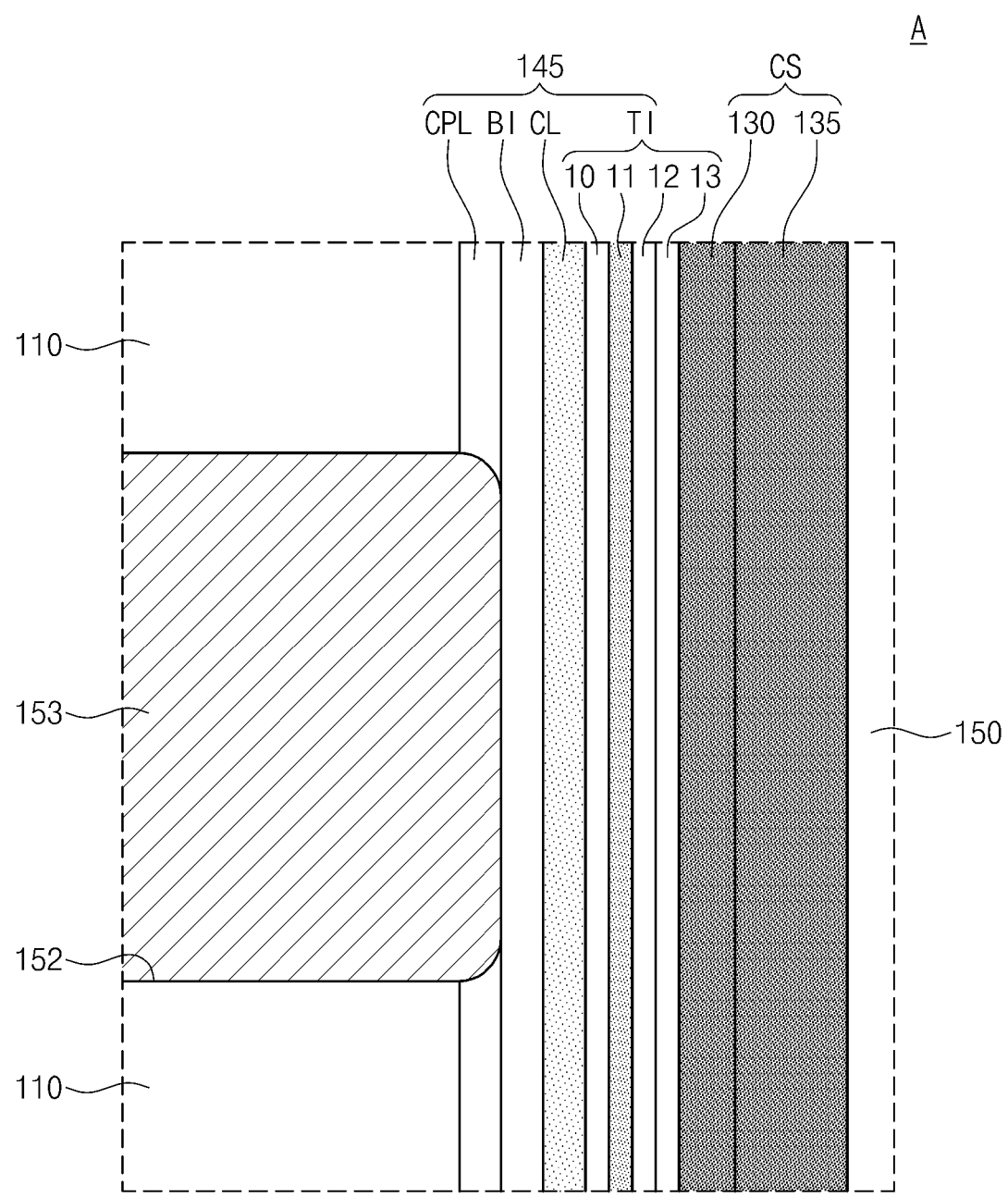

US 9,515,086 B2

SEMICONDUCTOR DEVICE, ELECTRONIC DEVICE, AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0145348, filed on Oct. 24, 2014, in the Korean Intellectual Property Office, the entire contents of which are hereby incorporated by reference.

BACKGROUND

Example embodiments of the inventive concept relate to a semiconductor device and a method of fabricating the same. For example, this disclosure relates to a three-dimensional semiconductor memory device, in which memory cells are three-dimensionally arranged. The disclosure also relates to a method of fabricating the same.

Higher integration of semiconductor devices is being used to satisfy consumer demands for superior performance and lower prices. In the case of semiconductor devices, since a higher integration of a product may make its price lower, increased integration is highly useful. In the case of typical two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, there have been recently proposed three-dimensional semiconductor memory devices having three-dimensionally arranged memory cells. However, in order to send three-dimensional semiconductor memory devices into mass-production, a new process technology should be developed in such a manner that it can provide a lower manufacturing cost per bit than two-dimensional memory devices while maintaining or exceeding their level of reliability.

SUMMARY

Example embodiments of the inventive concept provide a 3D semiconductor memory device provided with improved retention and endurance characteristics.

Other example embodiments of the inventive concept provide a method of fabricating a 3D semiconductor memory device provided with improved retention and endurance characteristics.

According to example embodiments of the inventive concept, a semiconductor device may include a stack including gate electrodes and insulating layers alternately and repeatedly stacked on a substrate, a channel structure connected to the substrate and extending through the stack, for each gate electrode, a charge storing layer between the channel structure and the gate electrode, a tunnel insulating layer between the charge storing layer and the channel structure, and a blocking insulating layer between the charge storing layer and the gate electrode, wherein the tunnel insulating layer comprises a first tunnel insulating layer between the charge storing layer and the channel structure, a high-k dielectric layer between the charge storing layer and the first tunnel insulating layer, and a second tunnel insulating layer between the first tunnel insulating layer and the high-k dielectric layer, The first tunnel insulating layer may include a silicon oxide layer, and the second tunnel insulating layer may include a silicon nitride layer or a silicon oxynitride layer. The high-k dielectric layer may have an energy band gap smaller than those of the first and second tunnel insulating layers. The high-k dielectric layer may include ScAlO, HfAlO, or a multiple layer of HfO/Oxide/HfO. The high-k dielectric layer may have a charge trap site density smaller than that of the second tunnel insulating layer. The tunnel insulating layer may include a third tunnel insulating layer between the charge storing layer and the high-k dielectric layer, and the third tunnel insulating layer may have an energy band gap greater than that of the second tunnel insulating layer.

The third tunnel insulating layer may include a silicon nitride layer or a silicon oxynitride layer, and the third tunnel insulating layer may have a nitrogen concentration lower than that of the second tunnel insulating layer. The first tunnel insulating layer, the second tunnel insulating layer, and the high-k dielectric layer may constitute a single continuous structure extending between the stack and the channel structure. The charge storing layer may extend between the stack and the channel structure.

At each gate electrode, the blocking insulating layer may extend between the gate electrode and its corresponding insulating layers. The blocking insulating layer may extend between the stack and the channel structure. At each gate electrode, the charge storing layer and the blocking insulating layer may extend between the gate electrode and its corresponding insulating layers. At each gate electrode, the charge storing layer, the blocking insulating layer, and the third tunnel insulating layer may extend between the gate electrode and its corresponding insulating layers, and the first tunnel insulating layer, the second tunnel insulating layer, and the high-k dielectric layer may constitute a single structure extending between the stack and the channel structure. At each gate electrode, the charge storing layer, the blocking insulating layer, and the tunnel insulating layer may constitute a single structure extending between the gate electrode and its corresponding insulating layers.

In some embodiments, a method of fabricating a semiconductor device includes steps alternately and repeatedly stacking sacrificial layers and insulating layers on a substrate to form a layered structure, forming a channel hole to penetrate the layered structure and expose the substrate, and sequentially forming a tunnel insulating layer and a channel structure in the channel hole, wherein the forming of the tunnel insulating layer includes sequentially forming a high-k dielectric layer, a second tunnel insulating layer, and a first tunnel insulating layer on an inner side surface of the channel hole, the first tunnel insulating layer includes a silicon oxide layer, and the second tunnel insulating layer includes a silicon nitride layer or a silicon oxynitride layer. The steps may further include, before the forming of the channel structure, performing a curing process on the first tunnel insulating layer, wherein the second tunnel insulating layer may prevent the high-k dielectric layer from being oxidized during the curing process.

In some other embodiments, an electronic device includes a stack including gate electrodes and insulating layers alternately and repeatedly stacked in a first direction on a substrate, a channel structure connected to the substrate and extending in the first direction through the stack, and a blocking insulating layer, a charge storing layer, and a tunnel insulating layer sequentially stacked in a second direction perpendicular to the first direction between a gate electrode and the channel structure, wherein the tunnel insulating layer includes a high-k dielectric layer, a first tunnel insulating layer, and a second tunnel insulating layer sequentially stacked in the second direction, the first tunnel insulating layer includes a silicon nitride layer or a silicon oxynitride layer, and the second tunnel insulating layer includes a silicon oxide layer.

The second tunnel insulating layer may have a thickness greater than that of the first tunnel insulating layer. The high-k dielectric layer may have an energy band gap smaller than those of the first and second tunnel insulating layers. The tunnel insulating layer may further includes a third tunnel insulating layer between the charge storing layer and the high-k dielectric layer, and the third tunnel insulating layer has an energy band gap greater than that of the first tunnel insulating layer. The stack of gate electrodes may form a part of a memory cell array, and the electronic device may further include a memory controller, a modem, or a central processing unit in communication with the memory cell array.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 10A through 10D are enlarged sectional views of portions A of FIGS. 9A, 9B, 9C, and 9E, respectively.

Figure 1:
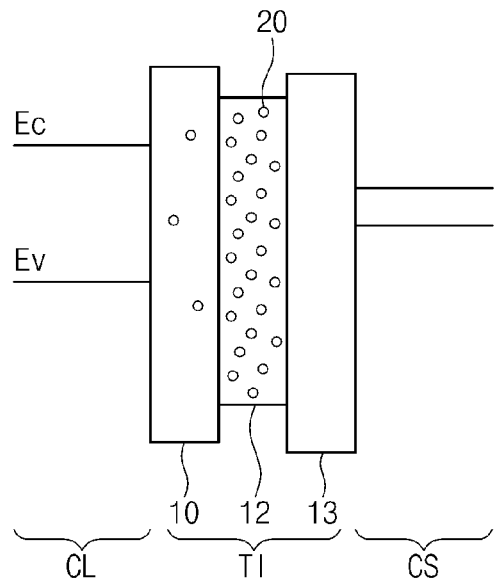
FIG. 1 is an energy band diagram of a tunnel insulating layer of a three-dimensional (3D) semiconductor memory device according to an embodiment of this disclosure.

It should be noted that these figures are intended to illustrate the general characteristics of methods, structure and/or materials utilized in certain example embodiments and to supplement the written description provided below. These drawings are not, however, to scale and may not precisely reflect the specific structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their repeated description may be omitted.

It will be understood that when an element is referred to as being "connected" or "coupled" to another element, it can be directly connected or coupled to the other element or intervening elements may be present. In contrast, unless the context indicates otherwise, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed in one section of the specification could be termed a second element, component, region, layer or section in another section of the specification without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, a semiconductor device may refer to any of the various devices such as shown in FIGS. 3 through 12B, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an energy band diagram of a tunnel insulating layer of a three-dimensional (3D) semiconductor memory device according to an embodiment of the disclosure.

Referring to FIG. 1, a tunnel insulating layer TI may be formed on a charge storing layer CL. The charge storing layer CL may be a charge trap layer or an insulating layer with nano particles. For example, the charge storing layer CL may include a silicon nitride layer, a silicon oxynitride layer, a silicon-rich nitride layer, a nanocrystalline silicon layer, or a laminated trap layer. As another example, the charge storing layer CL may be a floating gate, for example formed of polysilicon. The tunnel insulating layer TI may have an energy band gap greater than that of the charge storing layer CL.

The tunnel insulating layer TI may include a first tunnel insulating layer 10, a second tunnel insulating layer 12, and a third tunnel insulating layer 13, which are sequentially stacked on the charge storing layer CL. The second tunnel insulating layer 12 may have an energy band gap smaller than those of the first and third tunnel insulating layers 10 and 13. The third tunnel insulating layer 13 may have an energy band gap greater or smaller than that of the first tunnel insulating layer 10, but example embodiments of the inventive concept may not be limited thereto.

The first tunnel insulating layer 10 and the second tunnel insulating layer 12 may include a nitrogen-containing material (e.g., silicon nitride or silicon oxynitride). The nitrogen concentration of the second tunnel insulating layer 12 may be higher than that of the first tunnel insulating layer 10. The third tunnel insulating layer 13 may include, for example, a silicon oxide layer. In certain embodiments, the first to third tunnel insulating layers 10, 12, and 13 may be a silicon oxynitride layer with a low nitrogen concentration, a silicon oxynitride layer with a high nitrogen concentration, and a silicon oxide layer, respectively.

The first tunnel insulating layer 10 and the second tunnel insulating layer 12 may be formed to have charge trap sites 20 therein. Here, since the nitrogen concentration of the second tunnel insulating layer 12 is higher than that of the first tunnel insulating layer 10, the density of the charge trap sites 20 in the second tunnel insulating layer 12 may be higher than the density of the charge trap sites 20 in the first tunnel insulating layer 10. For example, the charge trap sites 20 of the second tunnel insulating layer 12 may be formed to have a density between $3.0 \times E19/cm^3$ and $6.0 \times E19/cm^3$. Here, the concentration or the density in a layer or a region may refer a representative value of concentration or density in the layer or the region. For example, the concentration or the density may refer an average value or a median value of the concentration or the density.

A channel structure CS serving as a channel region may be formed on the tunnel insulating layer TI. The channel structure CS may include a semiconductor layer (e.g., a silicon layer).

The tunnel insulating layer TI may be, for example, a reverse-type tunnel insulating layer. Here, before the formation of the channel structure CS, a curing process may be performed on the third tunnel insulating layer 13. By performing the curing process, the interfacial characteristics between the third tunnel insulating layer 13 and the channel structure CS may be improved. The reverse-type tunnel insulating layer will be described in more detail below.

In the above 3D semiconductor memory device, an erase operation may be performed in such a way that holes are stored in the charge storing layer CL by a tunneling effect passing through the tunnel insulating layer TI. Since the third tunnel insulating layer 13 (e.g., of a silicon oxide layer) has a valence band level (Ev) higher than a conduction band level (Ec), the voltage required for an erase operation performed by hole tunneling may be higher than that for a program operation performed by electron tunneling. This may lead to a deterioration in retention and/or endurance characteristics of a 3D semiconductor memory device.

Figure 2:
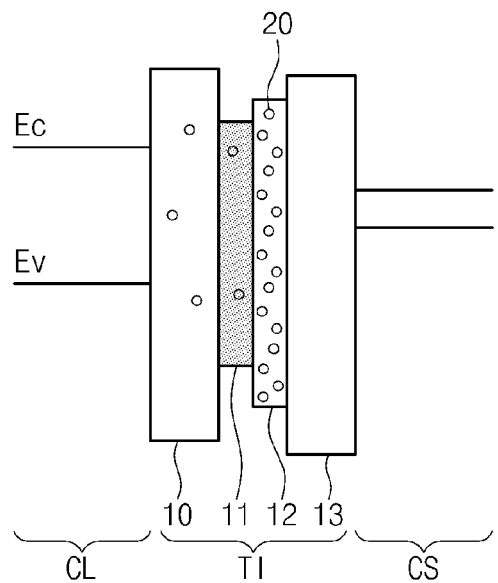
FIG. 2 is an energy band diagram of a tunnel insulating layer of a 3D semiconductor memory device according to certain embodiments of the inventive concept.

In certain embodiments of the inventive concept, to avoid this technical issue, the first and second tunnel insulating layers 10 and 12 may be formed of nitrogen-containing materials. Since the first and second tunnel insulating layers 10 and 12 are formed of the nitrogen-containing materials, the valence band level (Ev) of the first and second tunnel insulating layers 10 and 12 may be smaller than that of the third tunnel insulating layer 13. However, in this case, since the first and second tunnel insulating layers 10 and 12 have high densities of the charge trap sites 20, electric charges may be trapped in the first and second tunnel insulating layers 10 and 12. This may lead to deterioration in retention property of a 3D semiconductor memory device FIG. 2 is an energy band diagram of a tunnel insulating layer of a 3D semiconductor memory device according to certain embodiments of the inventive concept. In the following description, an element previously described with reference to FIG. 1 may be identified by a similar or identical reference number without repeating an overlapping description thereof, for the sake of brevity.

Referring to FIG. 2, a tunnel insulating layer TI may include a high-k dielectric layer 11 in addition to layers constituting the tunnel insulating layer TI of FIG. 1. For example, the tunnel insulating layer TI may include a first tunnel insulating layer 10, a high-k dielectric layer 11, a second tunnel insulating layer 12, and a third tunnel insulating layer 13 that are sequentially stacked on a charge storing layer CL. The high-k dielectric layer 11 may have an energy band gap that is smaller than those of the first to third tunnel insulating layers 10, 12, and 13. For example, the high-k dielectric layer 11 may be formed to have charge trap sites 20. The charge trap site density of the high-k dielectric layer 11 may be lower than those of the first and second tunnel insulating layers 10 and 12. For example, the charge trap sites 20 of the high-k dielectric layer 11 may have a density between $1.0 \times E17/cm^3$ and $1.0 \times E19/cm^3$. The high-k dielectric layer 11 may include, for example, ScAlO, HfAlO, or a multiple layer of HfO/Oxide/HfO.

The second tunnel insulating layer 12 may be provided to have a reduced thickness due to the added high-k dielectric layer 11. Hence, the number of the charge trap sites 20 in the second tunnel insulating layer 12 can be reduced, compared with a case there is not the high-k dielectric layer 11.

In one embodiment, to improve a retention property of a 3D semiconductor memory device, the second tunnel insulating layer 12 may be separated from the channel structure CS. Since the second insulating layer 12 has a reduced thickness, it is helpful to increase the thickness of the third tunnel insulating layer 13. For example, the third tunnel insulating layer 13 may have a thickness greater than that of the second insulating layer 12. Accordingly, the distance from the second tunnel insulating layer 12 to the channel structure CS may increase by increasing the thickness of the third tunnel insulating layer 13.

The tunnel insulating layer TI may be, for example, a reverse-type tunnel insulating layer. Before the formation of the channel structure CS, a curing process may be performed on the third tunnel insulating layer 13. By performing the curing process, it is possible to improve an interface property between the third tunnel insulating layer 13 and the channel structure CS.

For example, a curing process may be performed to remove impurities from the third tunnel insulating layer 13 and thereby improving the film quality of the third tunnel insulating layer 13. For example, the third tunneling insulating layer 13 is formed of silicon oxide. The curing process may include a thermal treatment step performed at a temperature between about 400° C. and about 900° C. for 10 min to 1 hour. For example, the curing process may be performed under an oxidation ambient, which may be formed by supplying at least one of $H_2O$, $O_2$, $N_2$, $H_2$ and $N_2O$. Accordingly, organic element and/or other elements, except for silicon may be removed from the third tunnel insulating layer 13, and silicon atoms remaining in the third tunnel insulating layer 13 may be oxidized. Here, the second tunnel insulating layer 12 may prevent the high-k dielectric layer 11 from being oxidized in the curing process.

According to certain embodiments, the tunnel insulating layer TI may include a high-k dielectric layer 11 having a low charge trap site density, thereby preventing electric charges being excessively trapped in the tunnel insulating layer TI. For example, the high-k dielectric layer 11 may have a valence band level (Ev) lower than those of the first to third tunnel insulating layers 10, 12, and 13. Accordingly, it is possible to improve retention and endurance characteristics of a 3D semiconductor memory device.

Figure 3:
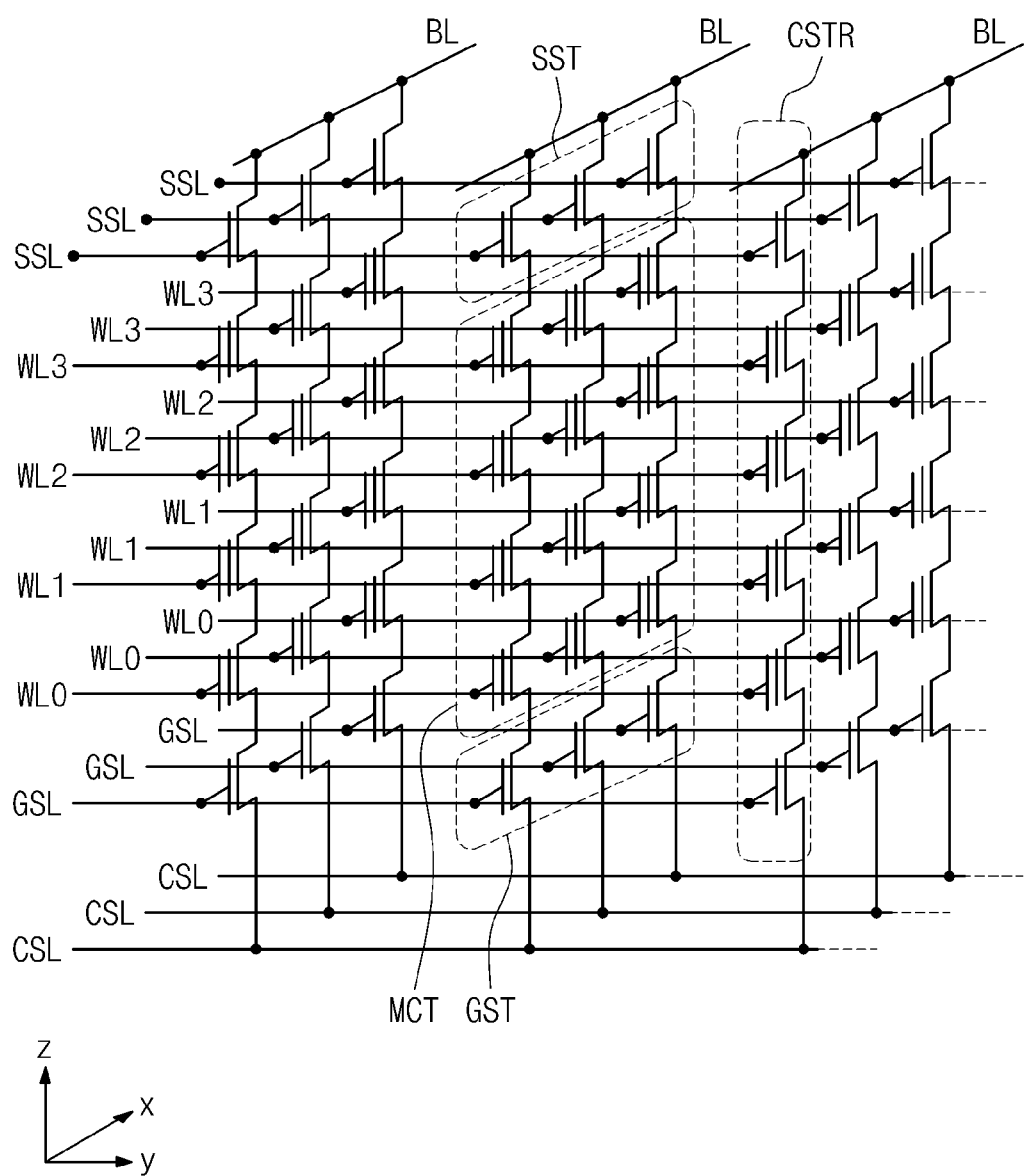
FIG. 3 is a schematic circuit diagram illustrating a cell array of a 3D semiconductor memory device according to certain embodiments of the inventive concept.

FIG. 3 is a schematic circuit diagram illustrating a cell array of a 3D semiconductor memory device according to certain embodiments of the inventive concept.

Referring to FIG. 3, a 3D semiconductor memory device may include a cell array, in which at least one common source line CSL, a plurality of bit lines BL, and a plurality of cell strings CSTR are provided. The cell strings CSTR may be disposed between the common source line CSL and the bit lines BL.

The common source line CSL may be a conductive thin-film disposed on a substrate or on an impurity region formed in the substrate. In certain embodiments, the common source line CSL may be conductive patterns (e.g., metal lines), which are provided on or over the substrate. The bit lines BL may be conductive patterns (e.g., metal lines) spaced apart from the substrate and disposed over the substrate. In certain embodiments, the bit lines BL may be disposed to cross over the common source line CSL. A plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In certain embodiments, a plurality of common source lines CSL may be provided on the substrate. In certain embodiments, the common source lines CSL may be applied with the same voltage. In some other embodiments, the common source lines CSL may be separated from each other and thereby may be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. For example, the ground selection transistor GST, the string selection transistor SST, and the memory cell transistors MCT may be connected in series.

The common source line CSL may be connected in common to source regions of the ground selection transistors GST. For example, a ground selection line GSL, a plurality of word lines WL0-WL5, and a plurality of string selection lines SSL may be disposed between the common source line CSL and the bit lines BL to serve as gate electrodes of the ground selection transistor GST, the memory cell transistors MCT, and the string selection transistors SST, respectively. In addition, each of the memory cell transistors MCT may include a data storage element.

Figure 4:
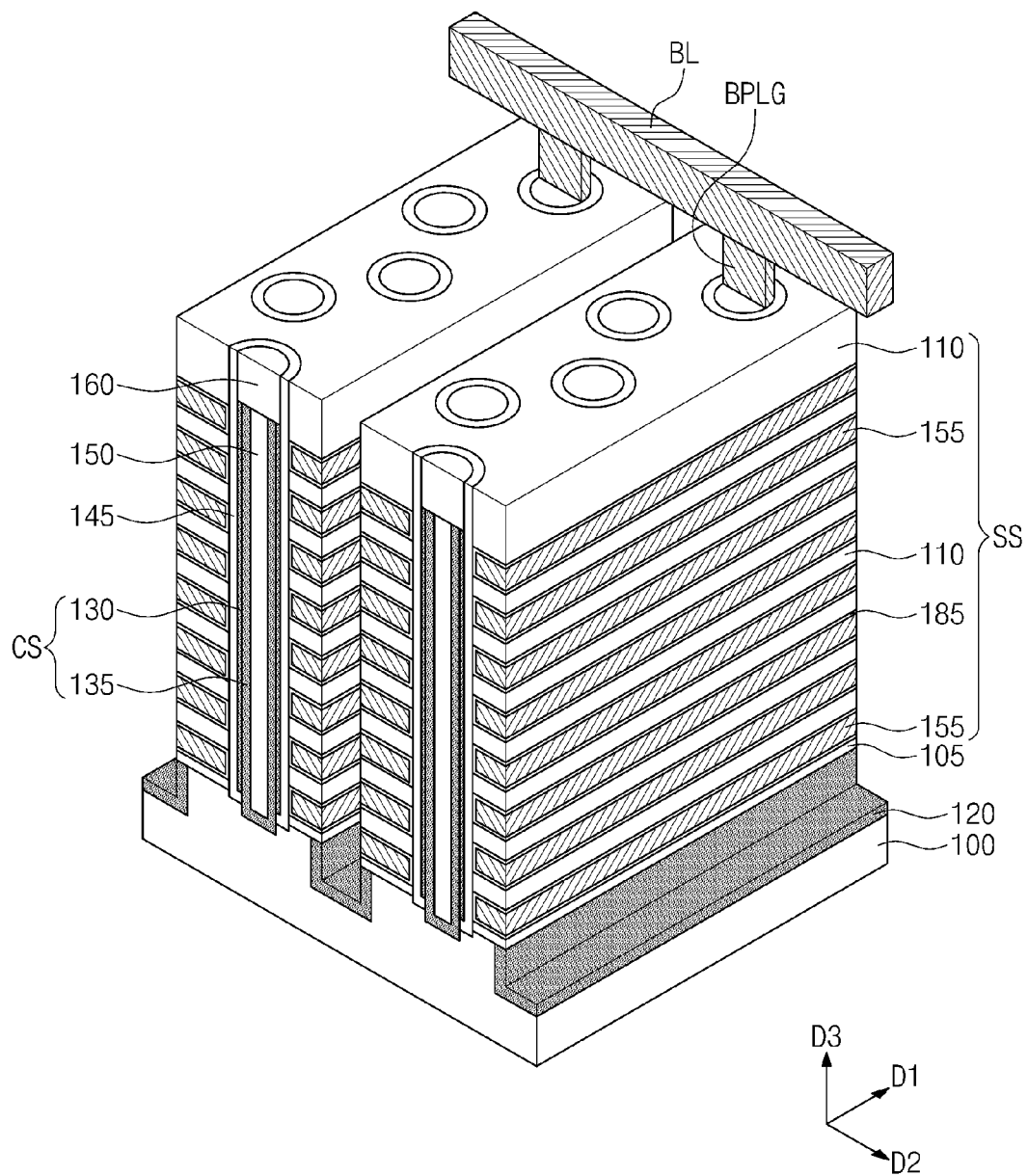
FIG. 4 is a perspective view illustrating a 3D semiconductor memory device according to certain embodiments of the inventive concept.

FIG. 4 is a perspective view illustrating a 3D semiconductor memory device according to certain embodiments of the inventive concept.

Referring to FIG. 4, a substrate 100 may be provided. The substrate 100 may be, for example, a silicon wafer, a germanium wafer, or a silicon-germanium wafer. The substrate 100 may include doped common source regions 120. The common source regions 120 may extend in a first direction D1 parallel to a top surface of the substrate 100, thereby having a line shape. The common source regions 120 may be disposed spaced apart from in a second direction D2 crossing the first direction D1.

Insulating layers 110 and gate electrodes 155 may be alternately and repeatedly stacked on the substrate 100 to form a stack SS. In certain embodiments, a plurality of stacks SS may be provided on the substrate 100, but for the sake of simplicity, following descriptions will refer to an example of single stack. In a plan view, the stack SS may be a line-shaped structure extending parallel to the first direction D1. The common source regions 120 may be provided at both sides of the stack SS. A lower insulating layer 105 may be provided between the substrate 100 and the stack SS. The lower insulating layer 105 may include, for example, a silicon nitride layer or a high-k dielectric layer (e.g., aluminum oxide or hafnium oxide). The lower insulating layer 105 may have a thickness smaller than that of the insulating layers 110.

The gate electrodes 155 may be stacked in a third direction D3, which are perpendicular to both the first and second directions D1 and D2. The gate electrodes 155 may be vertically separated from each other by the insulating layers 110 interposed therebetween. In certain embodiments, the lowermost one of the gate electrodes 155 may serve as gate electrodes of the ground selection transistors GST and/or ground selection lines which are described with reference to FIG. 3. The uppermost ones of the gate electrodes 155 may serve as gate electrodes of the string selection transistors SST and/or string selection lines which are described with reference to FIG. 3. The remaining ones of the gate electrodes 155, except for the uppermost and lowermost ones, may be used as gate electrodes of the memory cell transistors MCT described with reference to FIG. 3. The gate electrodes 155 may include, for example, at least one of doped silicon, metals (e.g., tungsten), metal nitrides, metal silicides, or combinations thereof. The insulating layers 110 may include a silicon oxide layer.

A plurality of channel structures CS may penetrate the stack SS to be formed through the stack SS, and may be electrically connected to the substrate 100. In a plan view, the channel structures CS may be arranged along the first direction D1. In certain embodiments, the channel structures CS may be disposed to have a zigzag arrangement in the first direction D1.

Each of the channel structures CS may include a first semiconductor pattern 130 and a second semiconductor pattern 135. The first semiconductor pattern 130 may cover an inner side surface of the stack SS. The first semiconductor pattern 130 may be shaped like a hollow pipe or macaroni. The first semiconductor pattern 130 may be provided spaced apart from the substrate 100. The second semiconductor pattern 135 may be shaped like a bottom-closed pipe or an elongated cup. The second semiconductor pattern 135 may be provided to cover not only an inner side surface of the first semiconductor pattern 130 but also a top surface of the substrate 100. The second semiconductor pattern 135 may have a bottom surface that is lower than that of the first semiconductor pattern 130. For example, the second semiconductor pattern 135 may connect the first semiconductor pattern 130 electrically to the substrate 100.

The first and second semiconductor patterns 130 and 135 may be in an undoped state or may be doped to have the same conductivity type as the substrate 100. Each of the first and second semiconductor patterns 130 and 135 may include a semiconductor material having a poly or single crystalline structure. The first and second semiconductor patterns 130 and 135 may be or include a silicon layer. An inner empty space of the second semiconductor pattern 135 may be filled with an insulating filling pattern 150.

A vertical insulator 145 may be interposed between the stack SS and each of the channel structures CS. The vertical insulator 145 may extend parallel to the third direction D3. The vertical insulator 145 may be shaped like a hollow pipe or macaroni. A structure of the vertical insulator 145 may be variously changed, as will be described below. For example, unlike shown in FIG. 4, the vertical insulator 145 may be omitted, as will be described with reference to FIG. 11F.

Horizontal insulators 185 may be interposed between the gate electrodes 155 and the vertical insulator 145. Each of the horizontal insulators 185 may include a horizontal portion extending between the gate electrode 155 and the insulating layer 110 and a vertical portion extending between the gate electrode 155 and the channel structure CS. The structure of the horizontal insulators 185 may be variously changed, as will be described in more detail below. For example, unlike shown in FIG. 4, the horizontal insulators 185 may be omitted, as will be described with reference to FIG. 9E.

Each of conductive pads 160 may be connected to the channel structure CS through the stack SS. The conductive pad 160 may have a top surface, which is substantially coplanar with that of the stack SS, and have a bottom surface, which is in contact with the channel structure CS. The vertical insulator 145 may be disposed between the conductive pad 160 and the insulating layers 110 adjacent thereto. The conductive pad 160 may be a doped region or include a conductive material.

Bit lines BL may be provided on the stack SS to cross the stack SS. The bit lines BL may be connected to the conductive pads 160 through bit line plugs BPLG.

FIGS. 5A through 5J are sectional views illustrating a method of fabricating a 3D semiconductor memory device, according to certain embodiments of the inventive concept. FIGS. 6A through 6D are enlarged views of portions A of FIGS. 5C, 5G, 5H, and 5J, respectively. In the present embodiment, a 3D semiconductor memory device may include a reverse-type tunnel insulating layer. In the present specification, the reverse-type tunnel insulating layer may refer to a tunnel insulating layer formed in advance of a semiconductor layer serving as a channel structure.

Figure 5A:
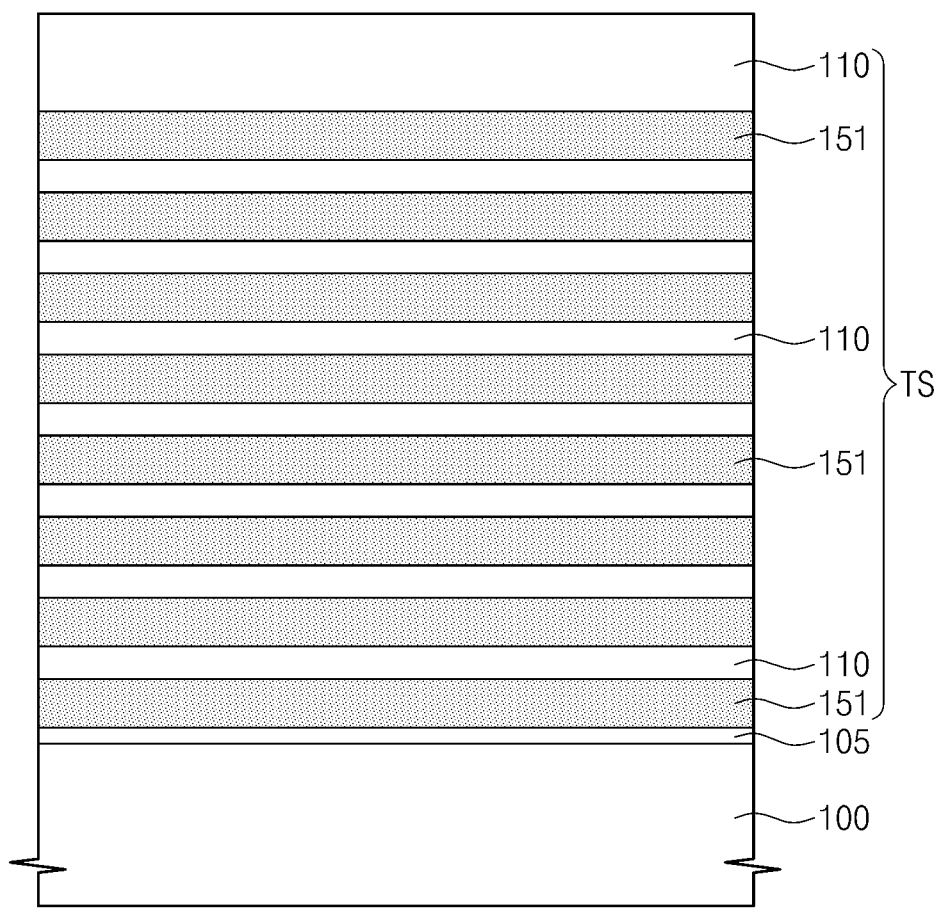
FIGS. 5A through 5J are sectional views illustrating a method of fabricating a 3D semiconductor memory device, according to certain embodiments of the inventive concept.

Referring to FIG. 5A, sacrificial layers 151 and insulating layers 110 may be alternately and repeatedly deposited on a substrate 100 to form a layered structure TS. The substrate 100 may be, for example, a silicon wafer, a germanium wafer, or a silicon-germanium wafer.

In certain embodiments, the sacrificial layers 151 may be formed to have substantially the same thickness. However, in some other embodiments, the lowermost and uppermost ones of the sacrificial layers 151 may be formed to be thicker than the others therebetween. The insulating layers 110 may be formed to have substantially the same thickness, but in certain embodiments, at least one of the insulating layers 110 may be formed to have a thickness different from the others.

The sacrificial layers 151 and the insulating layers 110 may be deposited using, for example, a thermal chemical vapor deposition (Thermal CVD) process, a plasma-enhanced CVD process, a physical CVD process, or an atomic layer deposition (ALD) process.

The sacrificial layers 151 may be formed of or include a silicon nitride layer, a silicon oxynitride layer, or a silicon layer. The sacrificial layers 151 may have a poly or single crystalline structure. The insulating layers 110 may be formed of or include, for example, a silicon oxide layer.

Furthermore, a lower insulating layer 105 may be formed between the substrate 100 and the layered structure TS. In certain embodiments, the lower insulating layer 105 may be formed of a material having high etch selectivity with respect to the sacrificial layers 151 and the insulating layers 110. For example, the lower insulating layer 105 may include a silicon nitride layer or high-k dielectric layer (e.g., aluminum oxide or hafnium oxide). The lower insulating layer 105 may be formed to have a thickness smaller than those of the sacrificial layers 151 and the insulating layers 110.

Figure 5B:
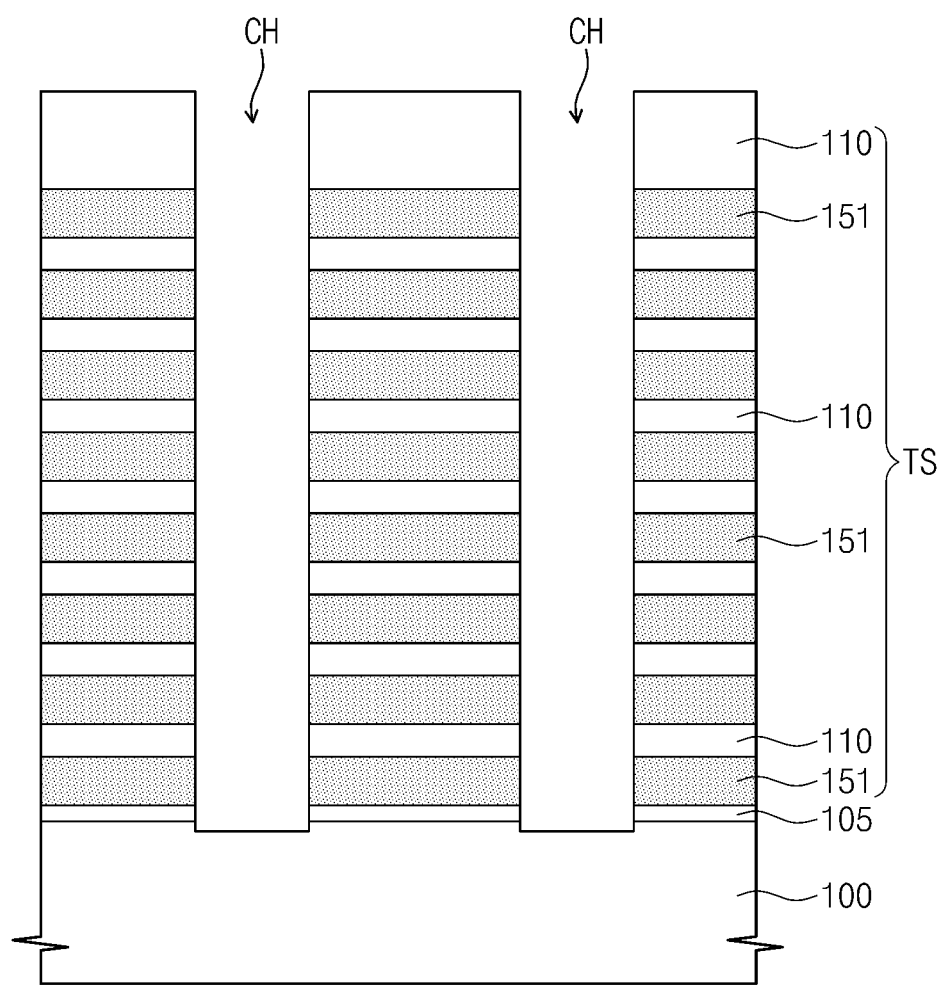

Referring to FIG. 5B, channel holes CH may be formed through the layered structure TS to expose the substrate 100. The channel holes CH may be formed to have the same arrangement as that of the channel structures CS described with reference to FIG. 4.

The formation of the channel holes CH may include forming a mask pattern (not shown) on the layered structure TS and etching the layered structure TS using the mask pattern as an etch mask. Here, the mask pattern may be formed to have openings defining positions and shapes of the channel holes CH. In certain embodiments, during the etching of the layered structure TS, the top surface of the substrate 100 may be over-etched to have a recessed portion. Thereafter, the mask pattern may be removed.

Figure 5C:
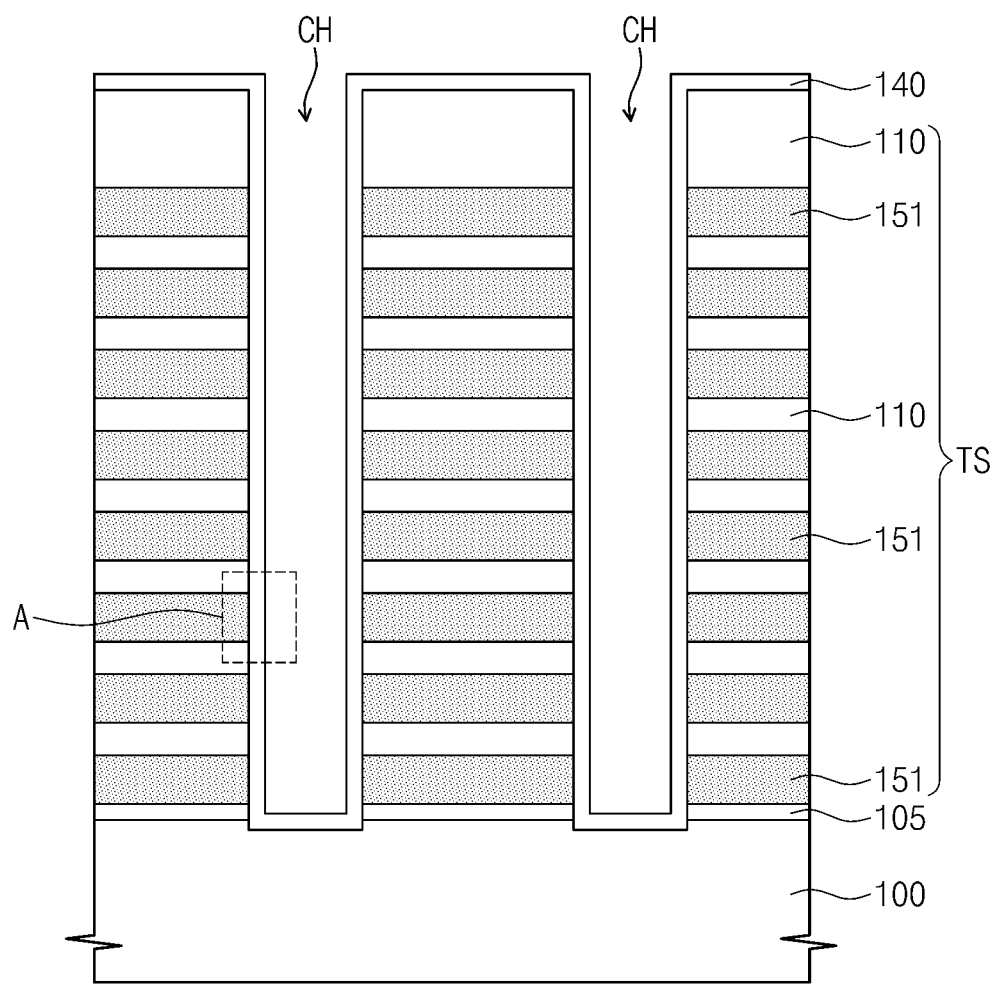
Figure 6A:
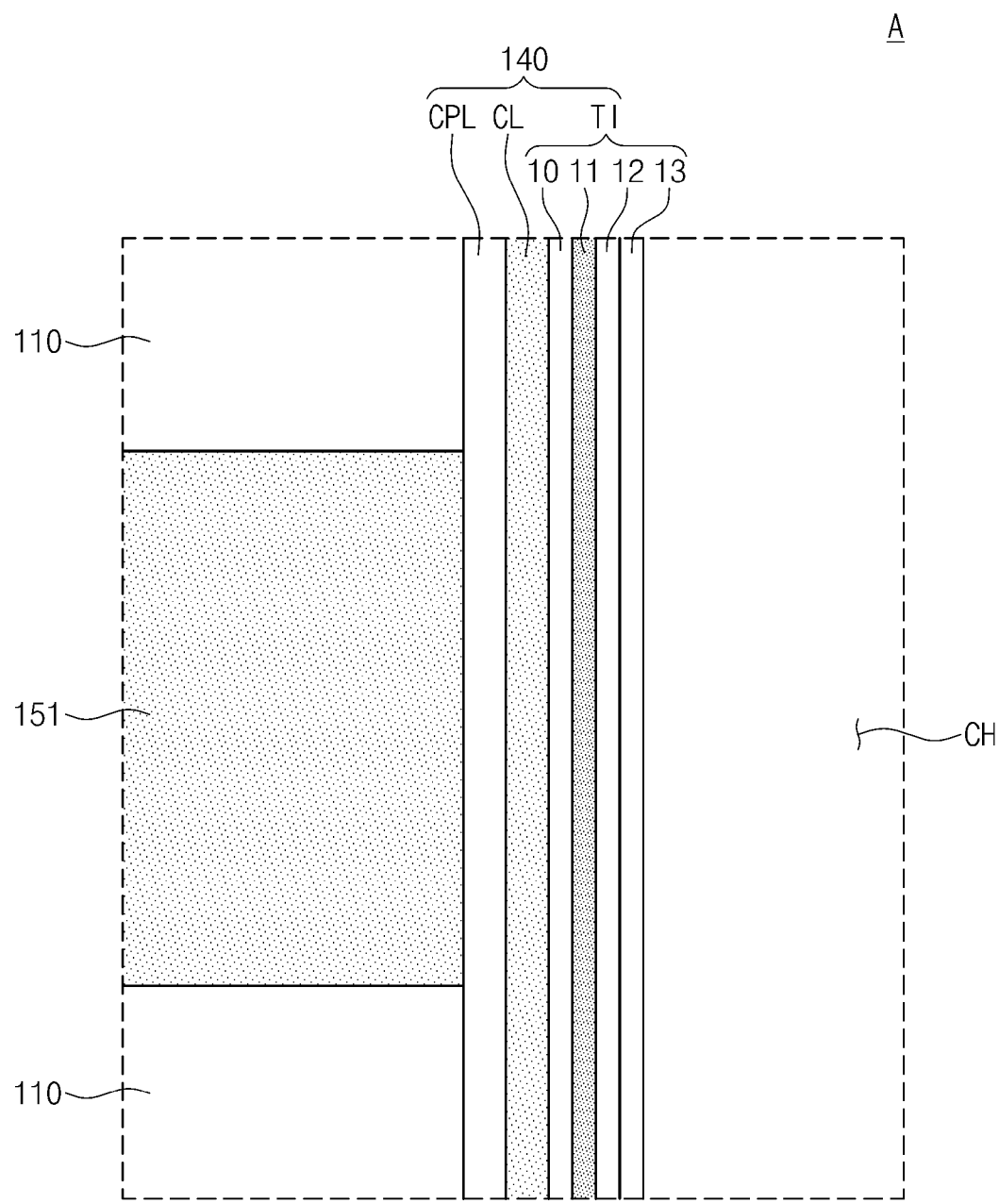
FIGS. 6A through 6D are enlarged exemplary sectional views of portions A of FIGS. 5C, 5G, 5H, and 5J, respectively, when a 3D semiconductor memory device is fabricated by a method according to certain embodiments of the inventive concept.

Referring to FIGS. 5C and 6A, a vertical insulating layer 140 may be formed on inner surfaces of the channel holes CH. For example, a capping layer CPL may be formed on the inner surfaces of the channel holes CH. The capping layer CPL may be a material different from the insulating layers 110. The capping layer CPL may be selected, for example, from a group consisting of a silicon layer, a silicon oxide layer, a poly-silicon layer, a silicon carbide layer, and a silicon nitride layer. A charge storing layer CL may be formed on the capping layer CPL. The charge storing layer CL may be a charge trap layer or an insulating layer with conductive nano particles in it. As an example, the charge storing layer CL may include a silicon nitride layer, a silicon oxynitride layer, a silicon-rich nitride layer, a nanocrystalline silicon layer, or a laminated trap layer. In certain embodiments, each of the capping layer CPL and the charge storing layer CL may be formed using an ALD process.

A tunnel insulating layer TI may be formed on the charge storing layer CL. The tunnel insulating layer TI may include a first tunnel insulating layer 10, a high-k dielectric layer 11, a second tunnel insulating layer 12, and a third tunnel insulating layer 13. The tunnel insulating layer TI may be formed using the same method as that described with reference to FIG. 2, and thus, it may have substantially the same technical features as those of the tunnel insulating layer TI of FIG. 2.

The formation of the tunnel insulating layer TI may include a curing process, which may be performed on the resulting structure with the first tunnel insulating layer 10, the high-k dielectric layer 11, the second tunnel insulating layer 12, and the third tunnel insulating layer 13. Here, the second tunnel insulating layer 12 may prevent the high-k dielectric layer 11 from being oxidized in the curing process. The curing process may be performed in the same manner as that described with reference to FIG. 2.

Figure 5D:
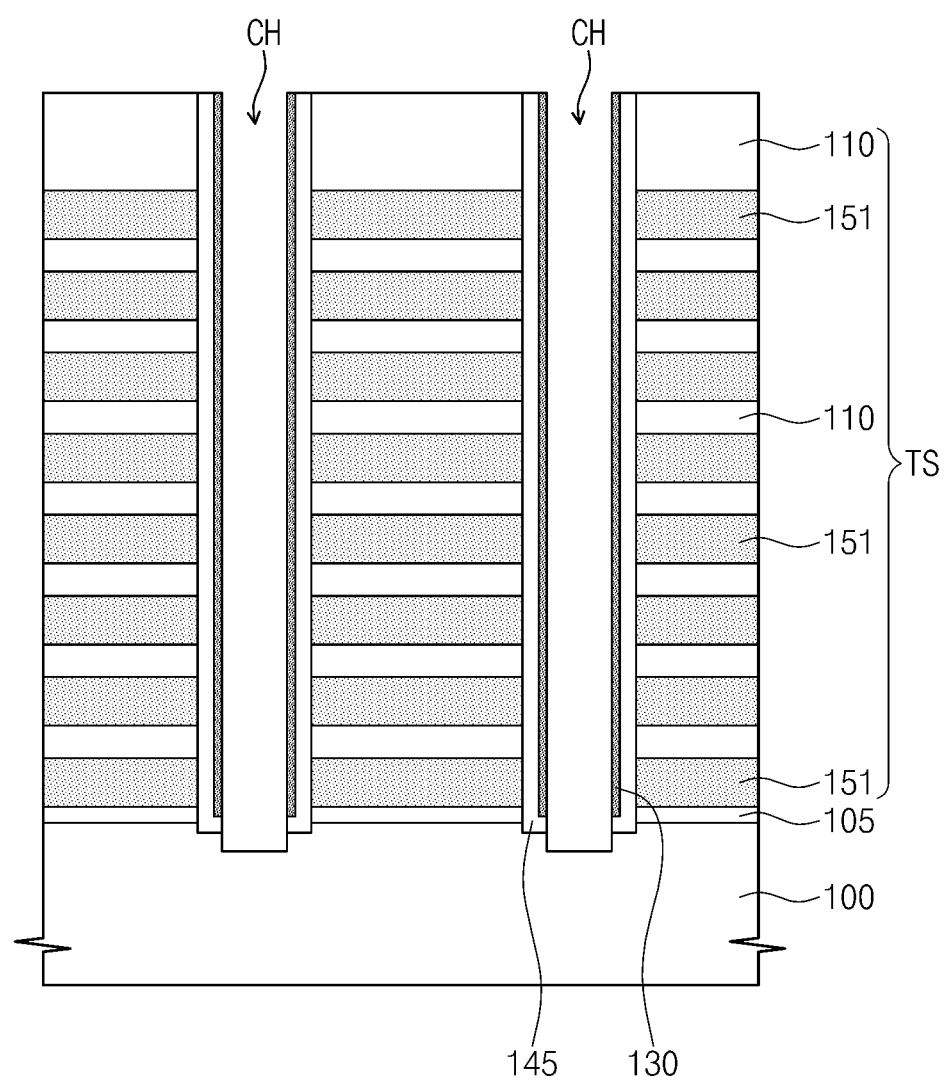

Referring to FIG. 5D, vertical insulators 145 and first semiconductor patterns 130 may be formed to cover inner side surfaces of the channel holes CH and expose the top surface of the substrate 100. For example, a first semiconductor layer (not shown) may be formed on the vertical insulating layer 140 covering the inner surfaces of the channel holes CH. In certain embodiments, the first semiconductor layer may be formed to conformally cover the channel holes CH provided with the vertical insulating layer 140. For example, the channel holes CH may not be completely filled with the vertical insulating layer 140 and the first semiconductor layer.

The first semiconductor layer may be formed using an ALD or CVD process. The first semiconductor layer may be formed to have a poly crystalline structure or a single crystalline structure. For example, the first semiconductor layer may include a poly crystalline silicon layer, a single crystalline silicon layer, or an amorphous silicon layer.

After the formation of the first semiconductor layer, the first semiconductor layer and the vertical insulating layer 140 may be anisotropically etched to partially expose the substrate 100. For example, the first semiconductor patterns 130 and the vertical insulators 145 may be formed on the inner side surfaces of the channel holes CH. For example, each of the vertical insulators 145 and the first semiconductor patterns 130 may be formed to have a hollow cylindrical shape. The anisotropic etching of the first semiconductor layer and the vertical insulating layer 140 may be performed in an over-etch manner. For example, the top surface of the substrate 100 exposed by the first semiconductor patterns 130 may be partially recessed.

The anisotropic etching of the first semiconductor layer and the vertical insulating layer 140 may be performed to expose the top surface of the layered structure TS. For example, the vertical insulators 145 and the first semiconductor patterns 130 may be locally formed within the channel holes CH.

Figure 5E:
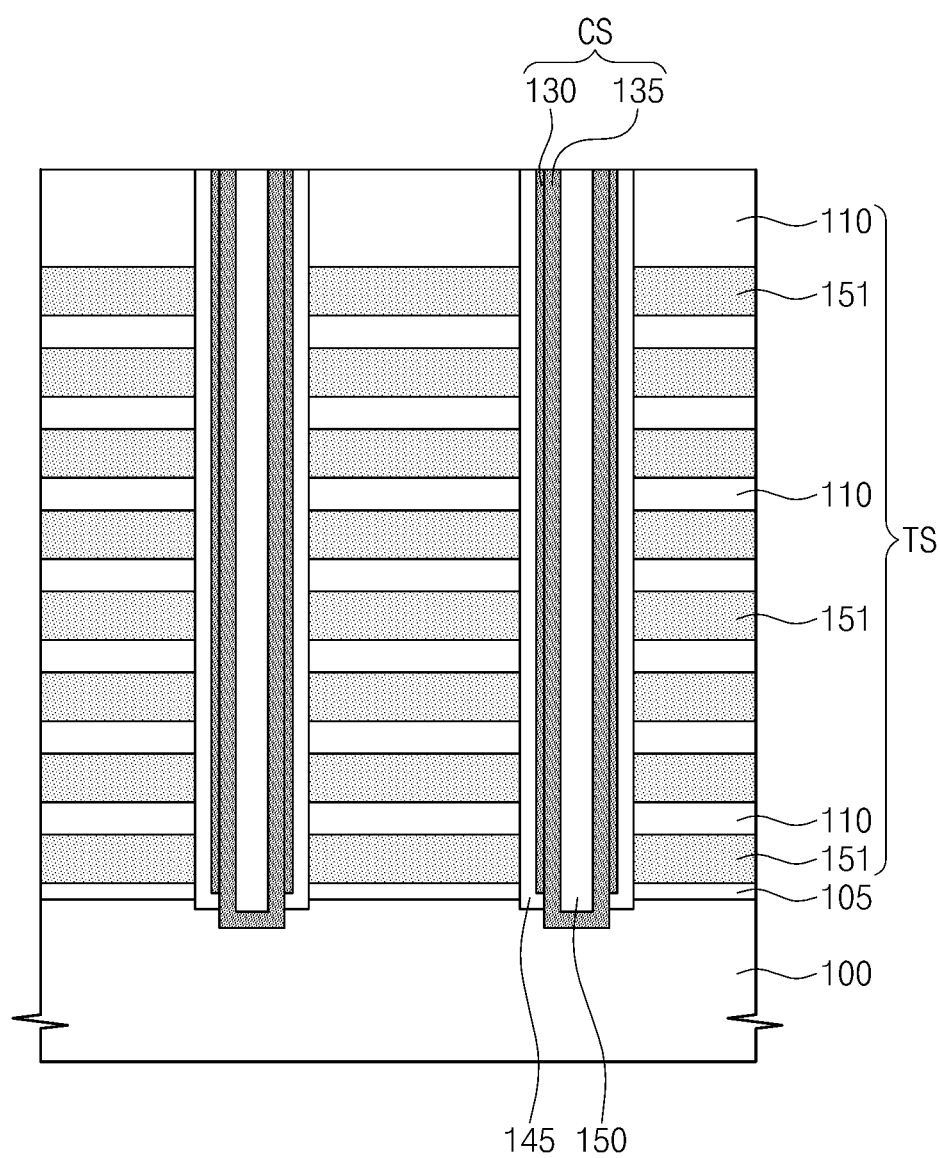

Referring to FIG. 5E, second semiconductor patterns 135 and insulating filling patterns 150 may be formed on the structure provided with the vertical insulators 145 and the first semiconductor patterns 130.

For example, a second semiconductor layer (not shown) and an insulating filling layer (not shown) may be sequentially formed in the channel holes CH provided with the vertical insulators 145 and the first semiconductor patterns 130.

The second semiconductor layer may be formed to conformally cover the channel holes CH and have a thickness smaller than half of a width of the channel holes CH. The width of a channel hole may refer to the diameter of the hole in case the channel hole has a circular cross-section, and the smallest distance that can be formed between two opposite parallel lines tangent to its boundary in case the channel hole has an ellipse, an oval or a similar cross-section. The second semiconductor layer may be formed to connect the substrate 100 to the first semiconductor pattern 130. The second semiconductor layer may be formed using an atomic layer deposition (ALD) or a chemical vapor deposition (CVD) process. In certain embodiments, the second semiconductor layer may have a poly crystalline structure or a single crystalline structure. For example, the second semiconductor layer may include a poly crystalline silicon layer, a single crystalline silicon layer, or an amorphous silicon layer.

The insulating filling layer may be formed to fill the remaining empty spaces of the channel holes CH. The insulating filling layer may be a silicon oxide layer or another insulating layer, and may be formed using a spin-on-glass (SOG) technique. Thereafter, the second semiconductor layer and the insulating filling layer may be planarized to expose a top surface of the layered structure TS, and thus, the second semiconductor patterns 135 and the insulating filling patterns 150 may be localized within the channel holes CH.

Each of the second semiconductor patterns 135 may be shaped like a bottom-closed pipe, a bottom-closed cylinder, or a cup. The insulating filling patterns 150 may be formed to fill inner spaces of the channel holes CH provided with the second semiconductor patterns 135. The first and second semiconductor patterns 130 and 135 may constitute a channel structure CS.

Figure 5F:
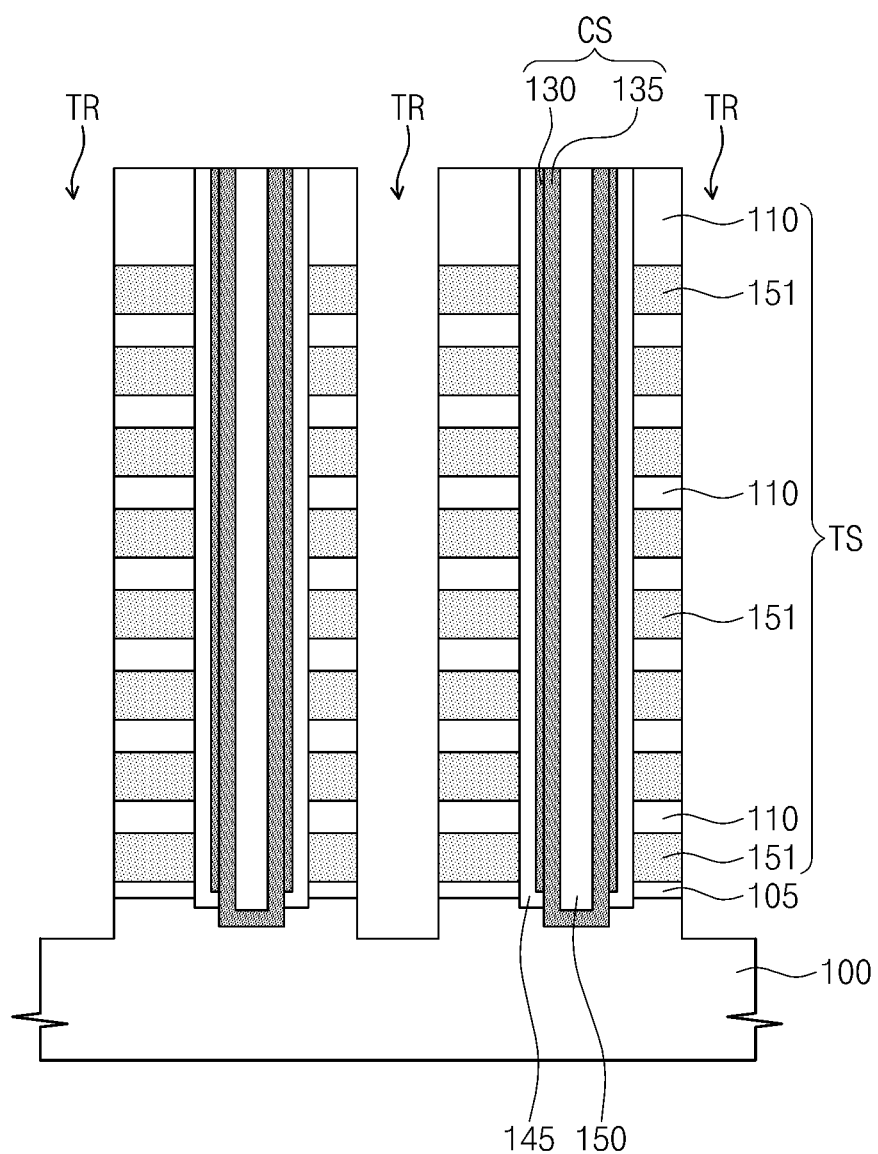

Referring to FIG. 5F, the layered structure TS may be patterned to form trenches TR exposing the substrate 100 between the channel holes CH.

For example, the formation of the trenches TR may include forming mask patterns (not shown) on the layered structure TS to define planar positions and shapes of the trenches TR, and then, etching the layered structure TS using the mask patterns as an etch mask.

The trenches TR may be formed to expose sidewalls of the sacrificial layers 151 and the insulating layers 110. In certain embodiments, the trenches TR may be formed to have a vertical depth that is larger than that of the lower insulating layer 105. For example, the trenches TR may be formed to expose at least a sidewall of the lower insulating layer 105. Although not shown, in practice, it may be hard to perform the etching process in a completely anisotropic manner, and thus, the trenches TR may be formed to have a width varying depending on the distance from the substrate 100.

For example, the layered structure TS may have a line shape extending parallel to the trenches TR. In certain embodiments, each layered structure TS may be penetrated by a plurality of the channel structures CS.

Figure 5G:
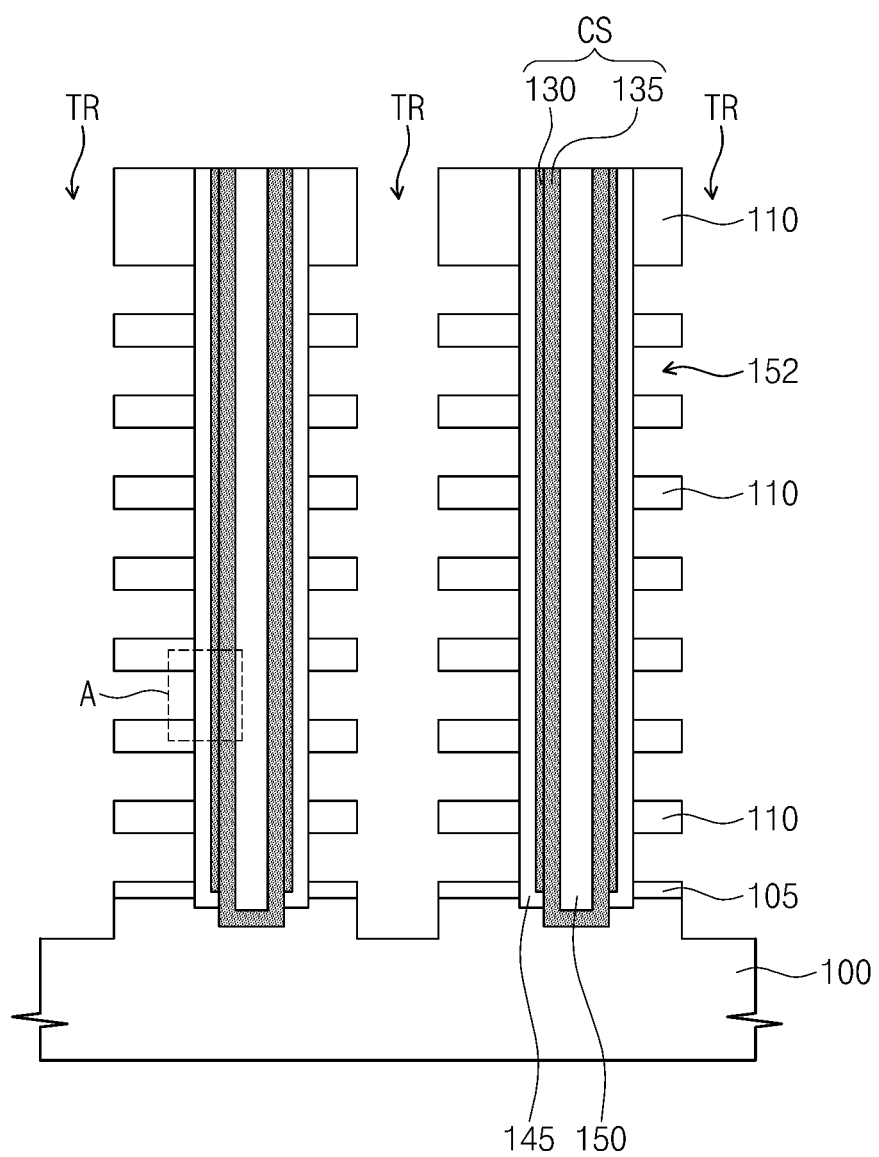
Figure 6B:
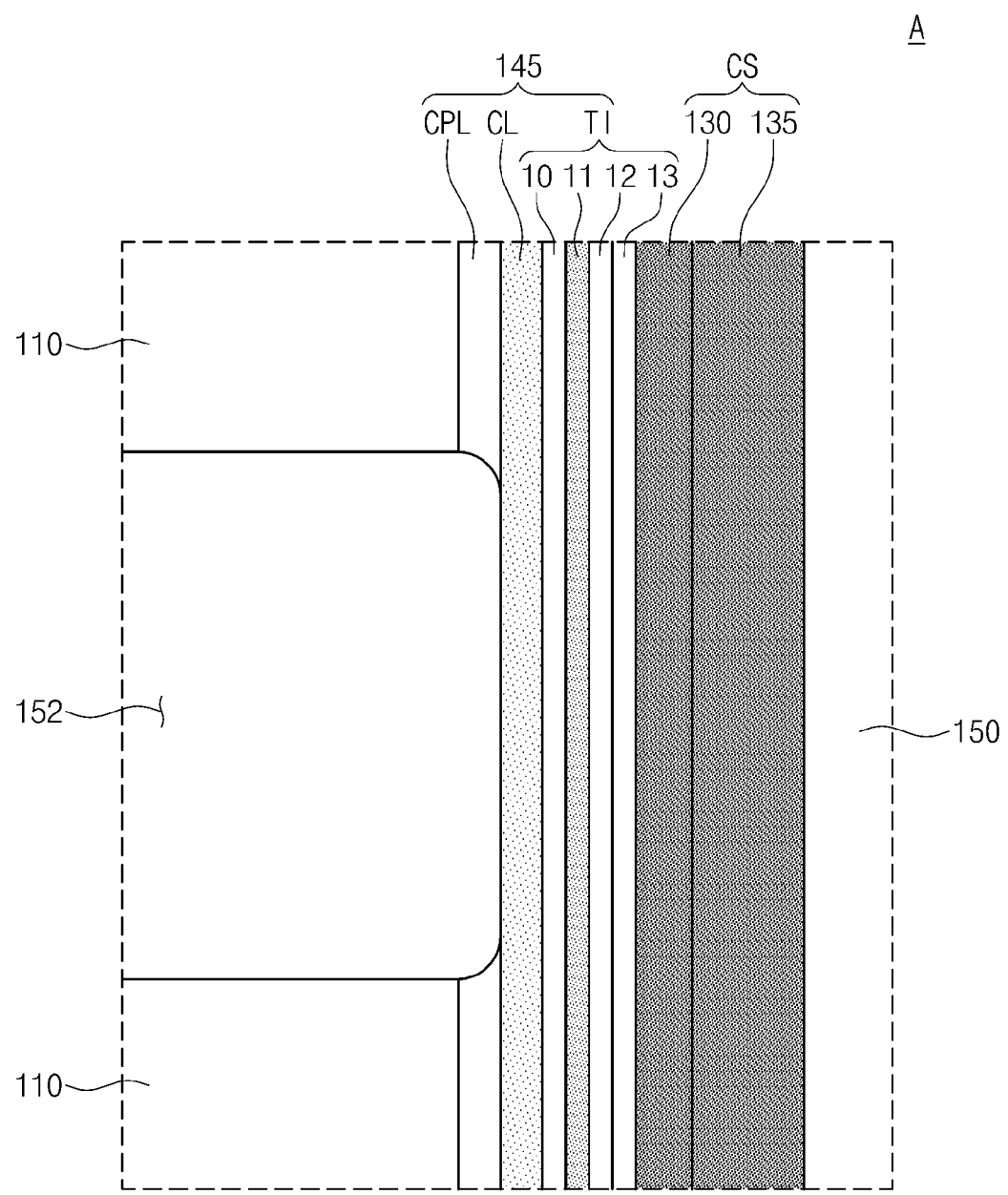

Referring to FIGS. 5G and 6B, the sacrificial layers 151 exposed by the trenches TR may be selectively removed to form recess regions 152. For example, the recess regions 152 may be formed between the insulating layers 110. In the case where the sacrificial layers 151 include a silicon nitride layer or a silicon oxynitride layer, the removal of the sacrificial layers 151 may be performed by an etching solution containing, for example, phosphoric acid. A sidewall of the capping layer CPL may be partially exposed through the recess regions 152. The capping layer CPL may make it possible to prevent the charge storing layer CL from being damaged by the etching solution. The capping layer CPL may be selectively removed, and thus, the charge storing layer CL may be exposed through the recess regions 152.

Figure 5H:
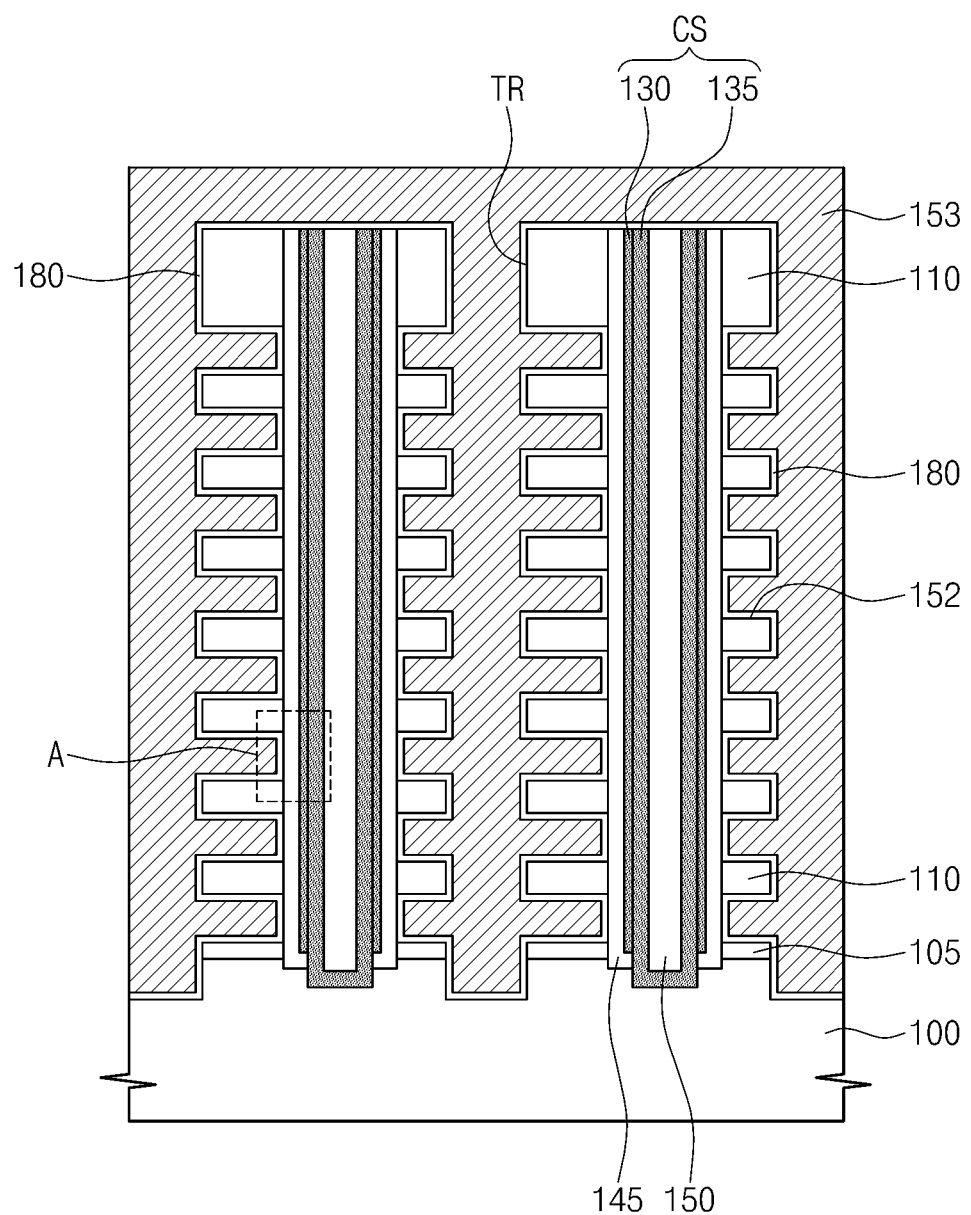
Figure 6C:
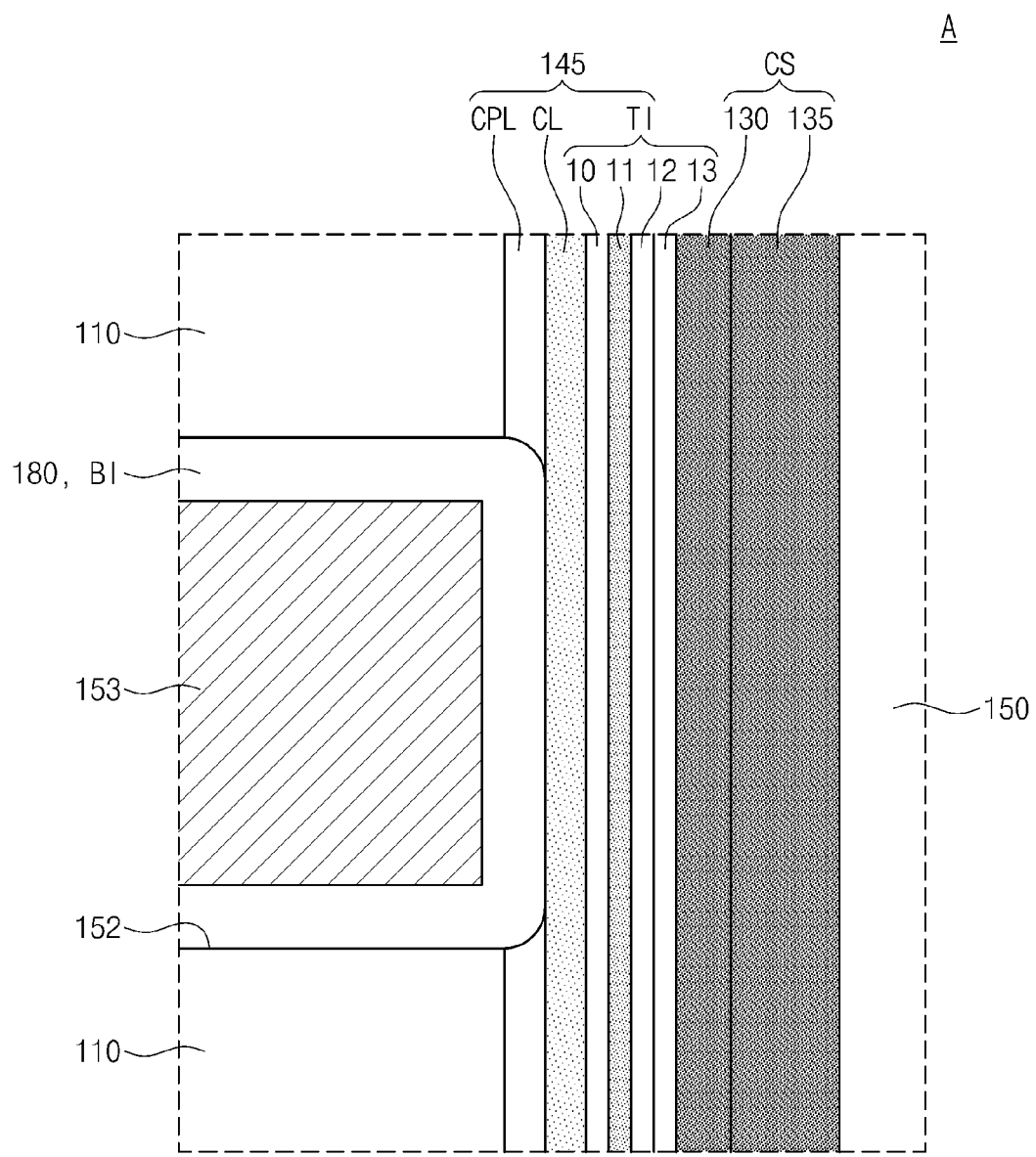

Referring to FIGS. 5H and 6C, a horizontal insulating layer 180 may be formed to conformally cover the recess regions 152. In certain embodiments, the horizontal insulating layer 180 may include a blocking insulating layer BI. The blocking insulating layer BI may be a multi-layered structure including a plurality of thin layers. For example, the blocking insulating layer BI may include an aluminum oxide layer and a silicon oxide layer, which are stacked sequentially or reversely. The blocking insulating layer BI may be formed using an atomic layer deposition process.

A gate layer 153 may be formed to fill the remaining spaces of the recess regions 152 provided with the horizontal insulating layer 180. The gate layer 153 may be formed, for example, of one or more of a doped poly-silicon layer, metal (e.g., tungsten) layers, and metal nitride layers.

Figure 5I:
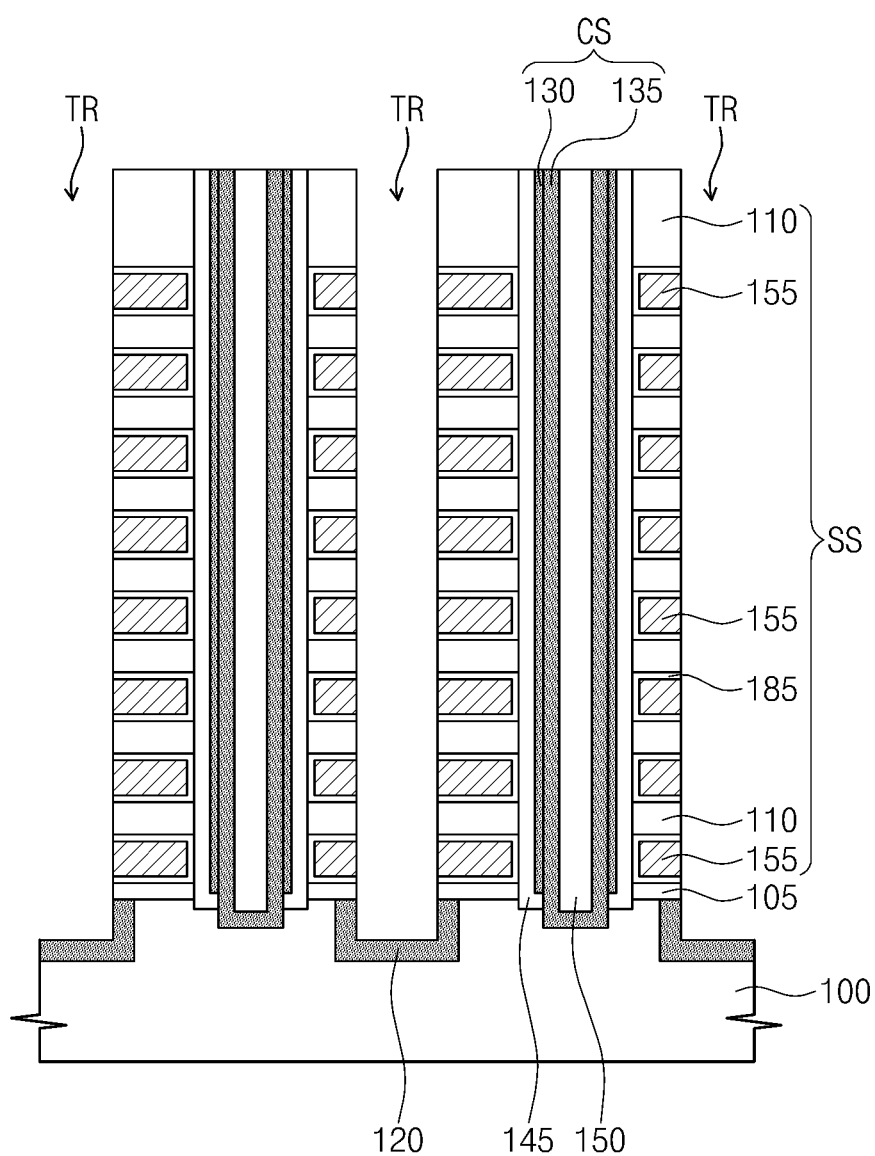

Referring to FIG. 5I, the horizontal insulating layer 180 and the gate layer 153 may be removed from the trenches TR. Accordingly, horizontal insulator 185 and gate electrodes 155 may be formed in the recess regions 152. Here, the gate electrodes 155 and the insulating layers 110 alternately stacked on the substrate 100 may constitute a stack SS.

After the formation of the gate electrodes 155, common source regions 120 may be formed in the substrate 100. The common source regions 120 may be formed in portions of the substrate 100 exposed by the trenches TR, using an ion implantation process. The common source regions 120, in conjunction with the substrate 100, may constitute PN junctions. In certain embodiments, the common source regions 120 may be electrically connected to each other to be in an equipotential state. In some other embodiments, the common source regions 120 may be electrically separated from each other to have at least two different electric potentials. In still other embodiments, the common source regions 120 may include a plurality of source groups, each of which includes at least one of the common source regions 120, and which are electrically separated from each other to have electric potentials different from each other.

Figure 5J:
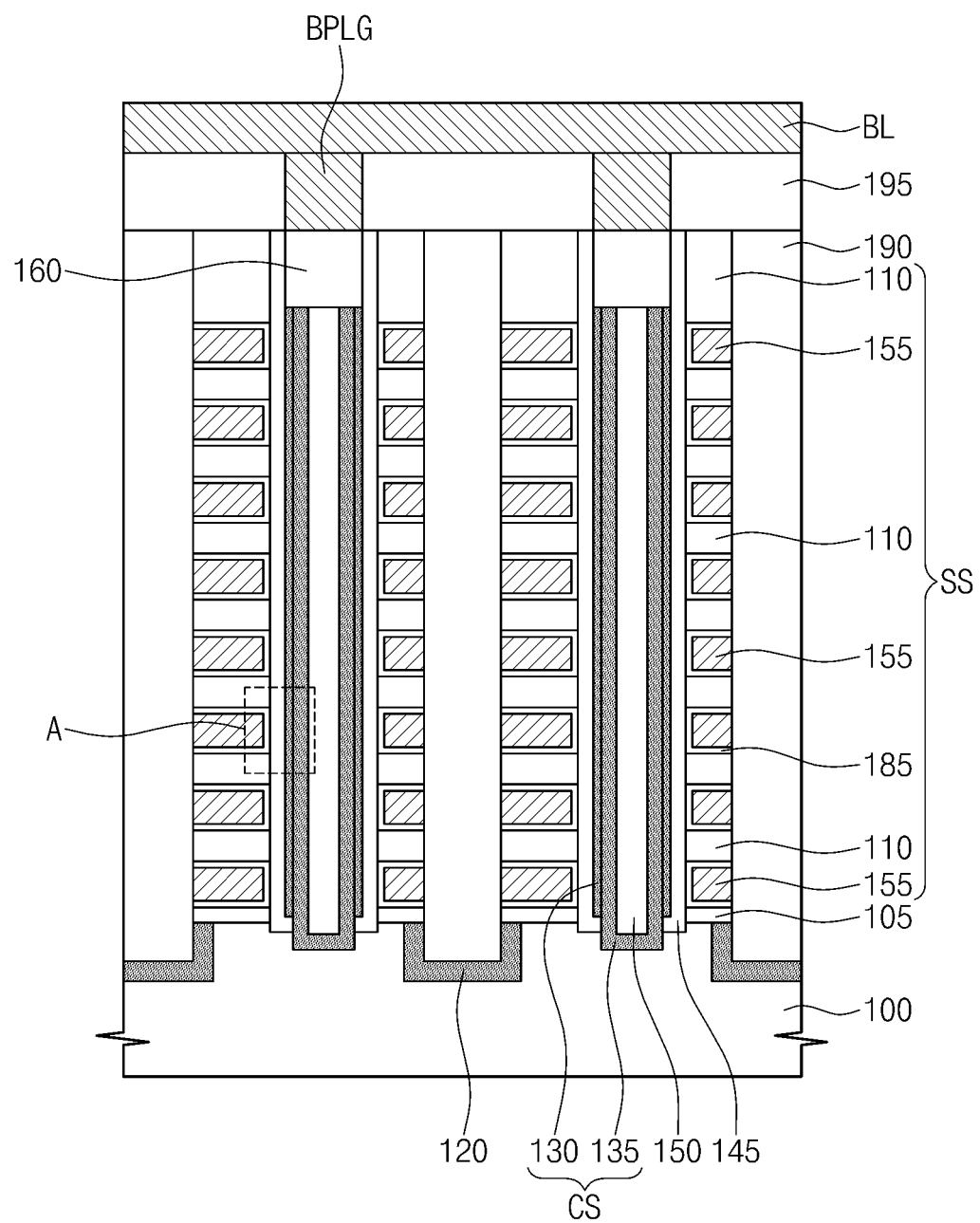
Figure 6D:
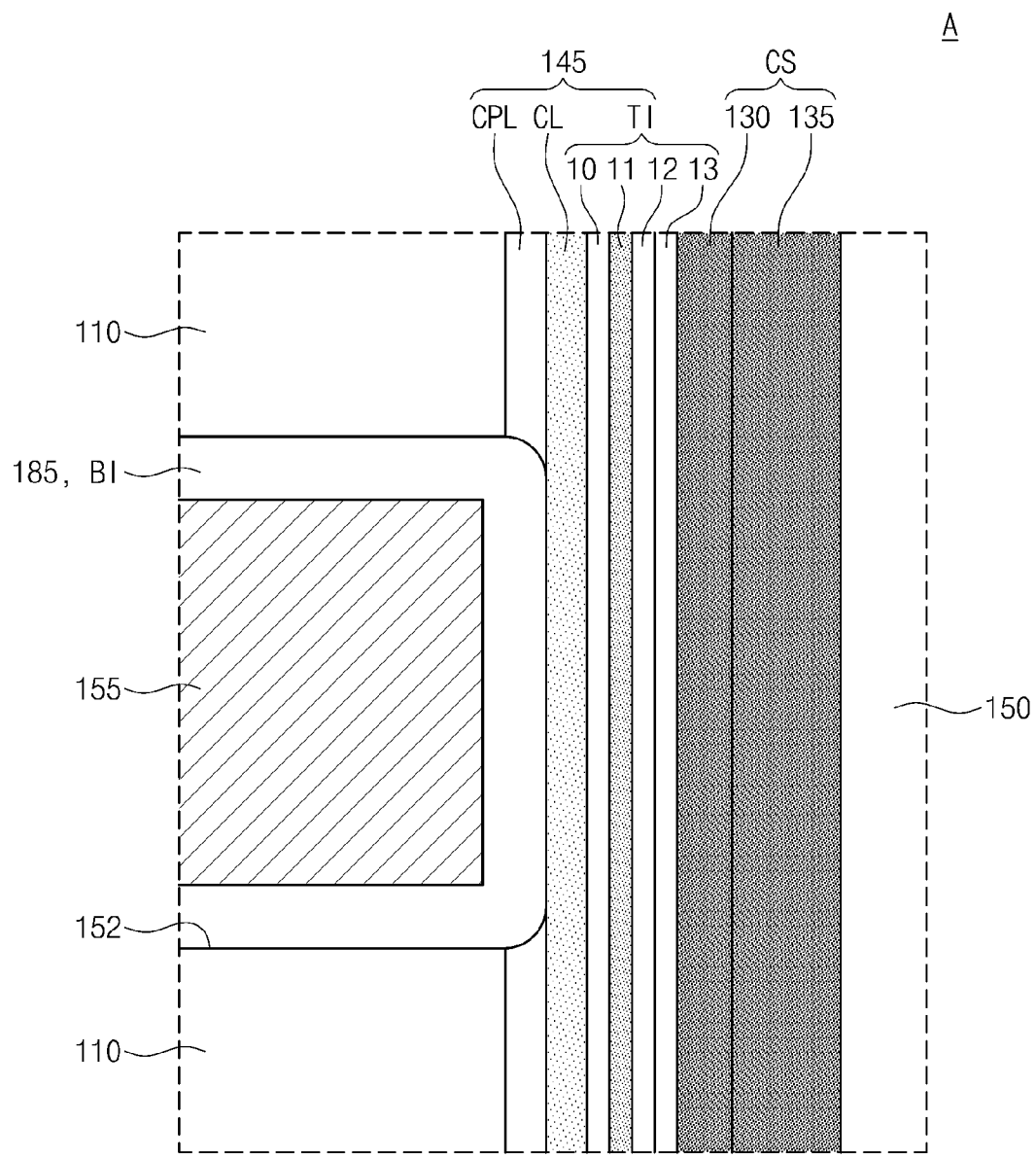

Referring to FIGS. 5J and 6D, an electrode separation pattern 190 may be formed on the common source regions 120 to fill the trenches TR. The electrode separation pattern 190 may be formed, for example, of at least one of a silicon oxide layer, a silicon nitride layer, and a silicon oxynitride layer.

Furthermore, conductive pads 160 may be formed on and connected to the channel structures CS. The conductive pads 160 may be formed by recessing upper portions of the channel structures CS and forming a conductive material in the recessed regions. Alternatively, the conductive pads 160 may be formed by doping the upper portions of the channel structures CS with impurities, and in this case, the conductive pads 160 may be formed to have a conductivity type different from that of the first and second semiconductor patterns 130 and 135.

Bit line plugs BPLG may be formed on the conductive pads 160 and bit lines BL may be formed on the bit line plugs BPLG. The bit line BL may be electrically connected to the channel structures CS through the bit line plugs BPLG. The bit line BL may be formed to cross the stack SS.

FIG. 5J is a sectional view illustrating a 3D semiconductor memory device according to certain embodiments of the inventive concept. FIG. 6D is an enlarged sectional view of a portion A of FIG. 5J.

Referring to FIGS. 4, 5J, and 6D, insulating layers 110 and gate electrodes 155 may be alternately and repeatedly stacked on the substrate 100 to form a stack SS. Channel structures CS may be connected to the substrate 100 through the stack SS. A charge storing layer CL may be provided between the channel structures CS and the gate electrodes 155, a tunnel insulating layer TI may be provided between the charge storing layer CL and the channel structures CS, and a blocking insulating layer BI may be provided between the charge storing layer CL and the gate electrodes 155. In certain embodiments, as shown in FIG. 6D, the charge storing layer CL and the tunnel insulating layer TI may constitute a vertical insulator 145, and the blocking insulating layer BI may constitute a horizontal insulator 185.

The blocking insulating layer BI may include a multi-layered structure including a plurality of thin layers. For example, the blocking insulating layer BI may include an aluminum oxide layer and a silicon oxide layer, which are stacked sequentially or reversely. The blocking insulating layer BI may include portions interposed between the insulating layers 110 and the gate electrodes 155.

The charge storing layer CL may be a charge trap layer or an insulating layer with conductive nano particles. As an example, the charge storing layer CL may include a silicon nitride layer, a silicon oxynitride layer, a silicon-rich nitride layer, a nanocrystalline silicon layer, or a laminated trap layer. The charge storing layer CL may extend between the insulating layers 110 and the channel structures CS.

The tunnel insulating layer TI may be configured to have substantially the same features as that described with reference to FIG. 2. For example, the tunnel insulating layer TI may include a first tunnel insulating layer 10, a high-k dielectric layer 11, a second tunnel insulating layer 12, and a third tunnel insulating layer 13, which are sequentially stacked on the charge storing layer CL. The second tunnel insulating layer 12 may have an energy band gap smaller than those of the first and third tunnel insulating layers 10 and 13. The third tunnel insulating layer 13 may have an energy band gap greater or smaller than that of the first tunnel insulating layer 10, but the invention is not limited thereto. Further, the high-k dielectric layer 11 may have an energy band gap smaller than those of the first to third tunnel insulating layers 10, 12, and 13.

The first tunnel insulating layer 10, the high-k dielectric layer 11, and the second tunnel insulating layer 12 may be formed to have charge trap sites 20 therein. Here, since the second tunnel insulating layer 12 has nitrogen concentration higher than that of the first tunnel insulating layer 10, the density of the charge trap sites 20 of the second tunnel insulating layer 12 may be higher than that of the first tunnel insulating layer 10. The charge trap site density of the high-k dielectric layer 11 may be lower than those of the first and second tunnel insulating layers 10 and 12. For example, the density of charge trap sites 20 of the high-k dielectric layer 11 may be between $1.0 \times E17/cm^3$ and $1.0 \times E19/cm^3$.

The first tunnel insulating layer 10 and the second tunnel insulating layer 12 may include a nitrogen-containing material (e.g., silicon nitride or silicon oxynitride). The second tunnel insulating layer 12 may have a nitrogen concentration higher than that of the first tunnel insulating layer 10. The third tunnel insulating layer 13 may include, for example, a silicon oxide layer. The high-k dielectric layer 11 may include ScAlO, HfAlO, or a multiple layer of HfO/Oxide/HfO.

The tunnel insulating layer TI may extend between the insulating layers 110 and the channel structures CS. For example, the first tunnel insulating layer 10, the high-k dielectric layer 11, the second tunnel insulating layer 12, and the third tunnel insulating layer 13 may constitute a single structure extending between the insulating layers 110 and the channel structures CS.

The vertical insulator 145 may further include a capping layer CPL between the insulating layers 110 and the charge storing layer CL. The capping layer CPL may include a material selected, for example, from a group consisting of a silicon layer, a silicon oxide layer, a poly-silicon layer, a silicon carbide layer, and a silicon nitride layer. The capping layer CPL may be a different material from the insulating layers 110.

According to certain embodiments, a 3D semiconductor memory device can be fabricated using a method different from those of the previous embodiments. FIGS. 7A through 7D are enlarged sectional views of portions A of FIGS. 5C, 5G, 5H, and 5J, respectively, when a 3D semiconductor memory device is fabricated by a method according to certain embodiments of the inventive concept. A 3D semiconductor memory device may include a reverse-type tunnel insulating layer. For concise description, an element or a step previously described with reference to FIGS. 5A through 5J and FIGS. 6A through 6D may be identified by a similar or identical reference number without repeating an overlapping description thereof.

Figure 7A:
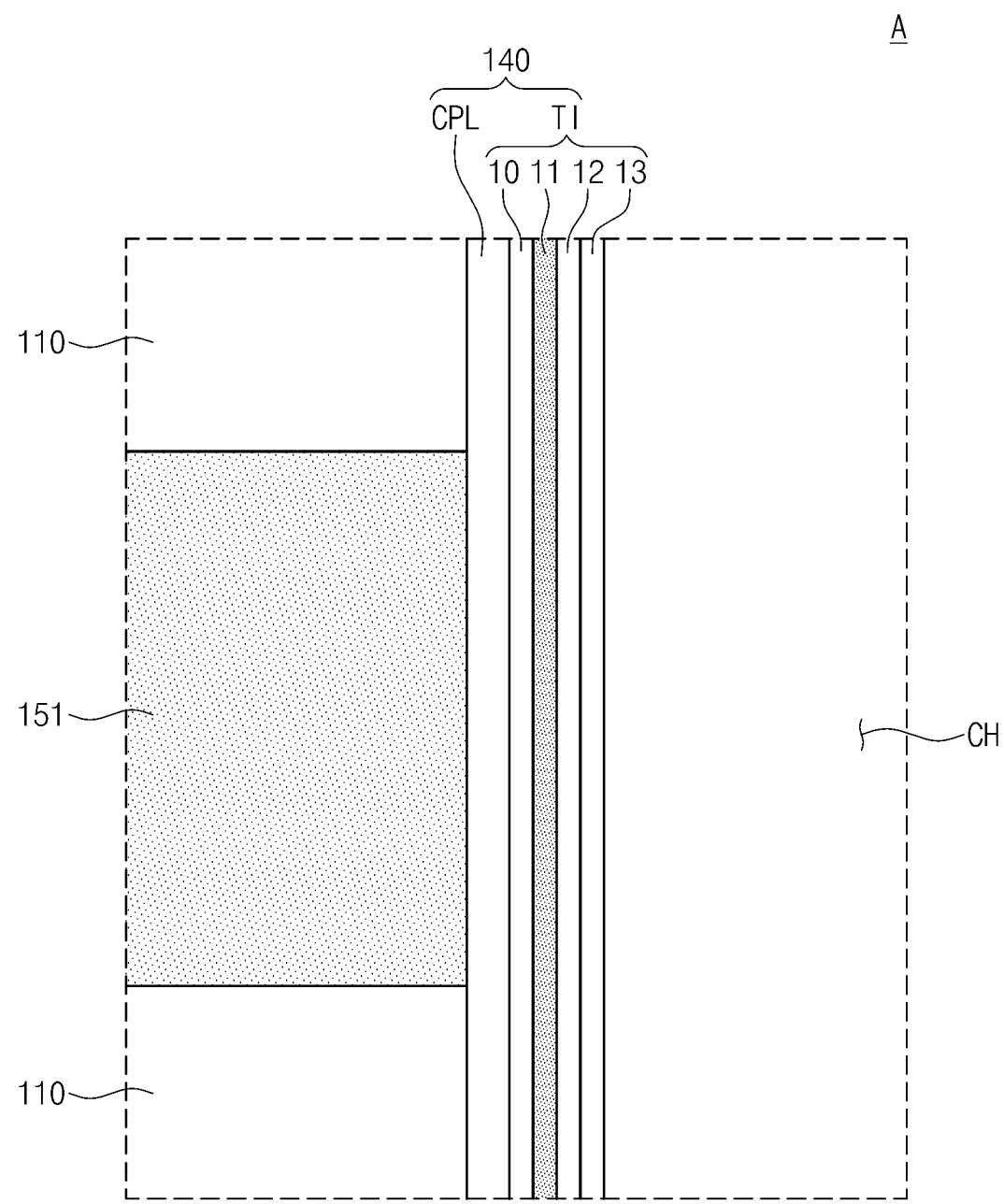
FIGS. 7A through 7D are enlarged exemplary sectional views of portions A of FIGS. 5C, 5G, 5H, and 5J, respectively, when a 3D semiconductor memory device is fabricated by a method according to some other embodiments of the inventive concept.

Referring to FIGS. 5C and 7A, a vertical insulating layer 140 may be formed on the structure of FIG. 5B. The vertical insulating layer 140 may be formed on inner surfaces of the channel holes CH. For example, a capping layer CPL may be formed on the inner surfaces of the channel holes CH. A tunnel insulating layer TI may be formed on the capping layer CPL. The tunnel insulating layer TI may include a first tunnel insulating layer 10, a high-k dielectric layer 11, a second tunnel insulating layer 12, and a third tunnel insulating layer 13. The tunnel insulating layer TI may be formed using the same method as that described with reference to FIG. 2, and thus, it may have substantially the same technical features as those of the tunnel insulating layer TI of FIG. 2. However, according to certain embodiments, the vertical insulating layer 140 may be formed not to include the charge storing layer CL of FIG. 6A.

The formation of the tunnel insulating layer TI may include a curing process, which may be performed on the resulting structure with the first tunnel insulating layer 10, the high-k dielectric layer 11, the second tunnel insulating layer 12, and the third tunnel insulating layer 13. Here, the second tunnel insulating layer 12 may prevent the high-k dielectric layer 11 from being oxidized in the curing process. The curing process may be performed in the same manner as that described with reference to FIG. 2.

Figure 7B:
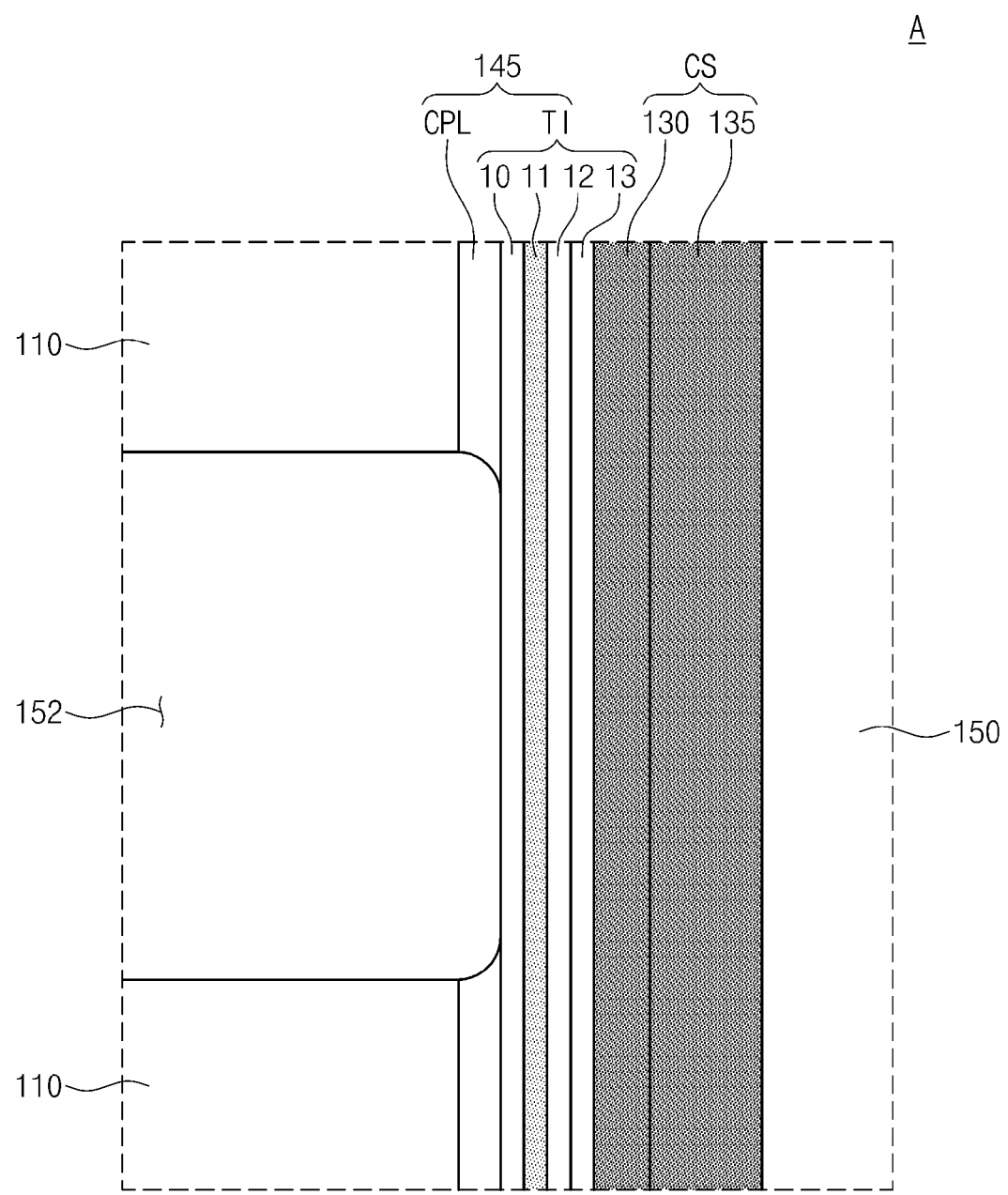

Referring to FIGS. 5G and 7B, an etching process may be performed on the structure of FIG. 5F to form recess regions 152. The recess regions 152 may be formed to expose a portion of a sidewall of the capping layer CPL. Here, the capping layer CPL may prevent the tunnel insulating layer TI from being damaged by an etching solution used in the etching process. Thereafter, the capping layer CPL may be selectively etched to expose the first tunnel insulating layer 10 through the recess regions 152.

Figure 7C:
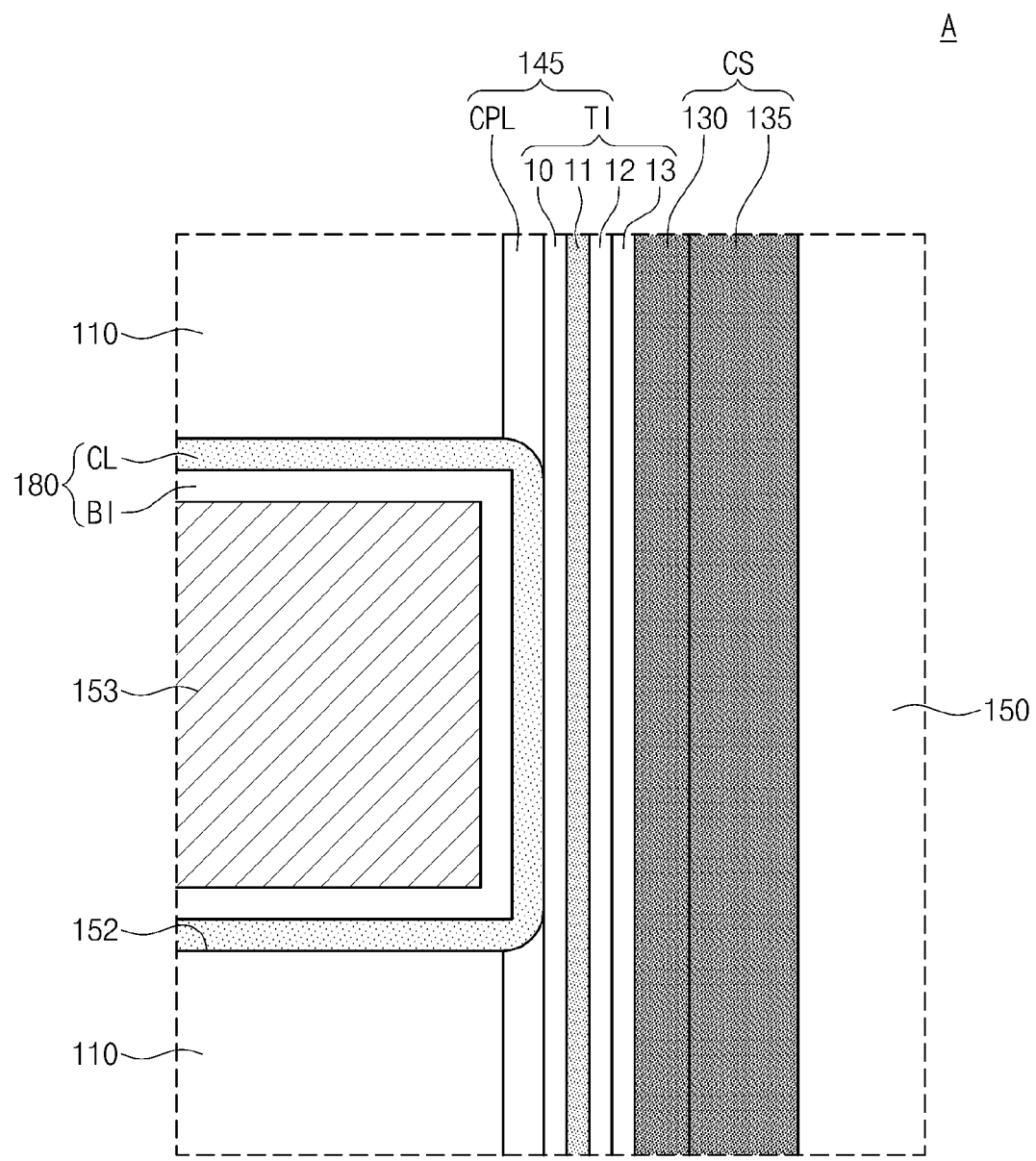

Referring to FIGS. 5H and 7C, a horizontal insulating layer 180 may be formed to cover the recess regions 152. For example, the horizontal insulating layer 180 may be formed to conformally cover inner surfaces of the recess regions 152. The formation of the horizontal insulating layer 180 may include forming a charge storing layer CL to cover the inner surfaces of the recess regions 152 and forming a blocking insulating layer BI to cover the charge storing layer CL. The charge storing layer CL and the blocking insulating layer BI may be formed using an atomic layer deposition process.

For example, unlike the description with reference to FIG. 6C, a horizontal insulating layer 180 may include not only the blocking insulating layer BI but also the charge storing layer CL interposed between the blocking insulating layer BI and the tunnel insulating layer TI.

A gate layer 153 may be formed to cover the blocking insulating layer BI and fill the remaining empty spaces of the recess regions 152.

Referring to FIG. 5I, the horizontal insulating layer 180 and the gate layer 153 may be removed from the trenches TR. Accordingly, horizontal insulator 185 and gate electrodes 155 may be formed in the recess regions 152. Here, the gate electrodes 155 and the insulating layers 110 alternately stacked on the substrate 100 may constitute a stack SS.

After the formation of the gate electrodes 155, common source regions 120 may be formed in the substrate 100.

Figure 7D:
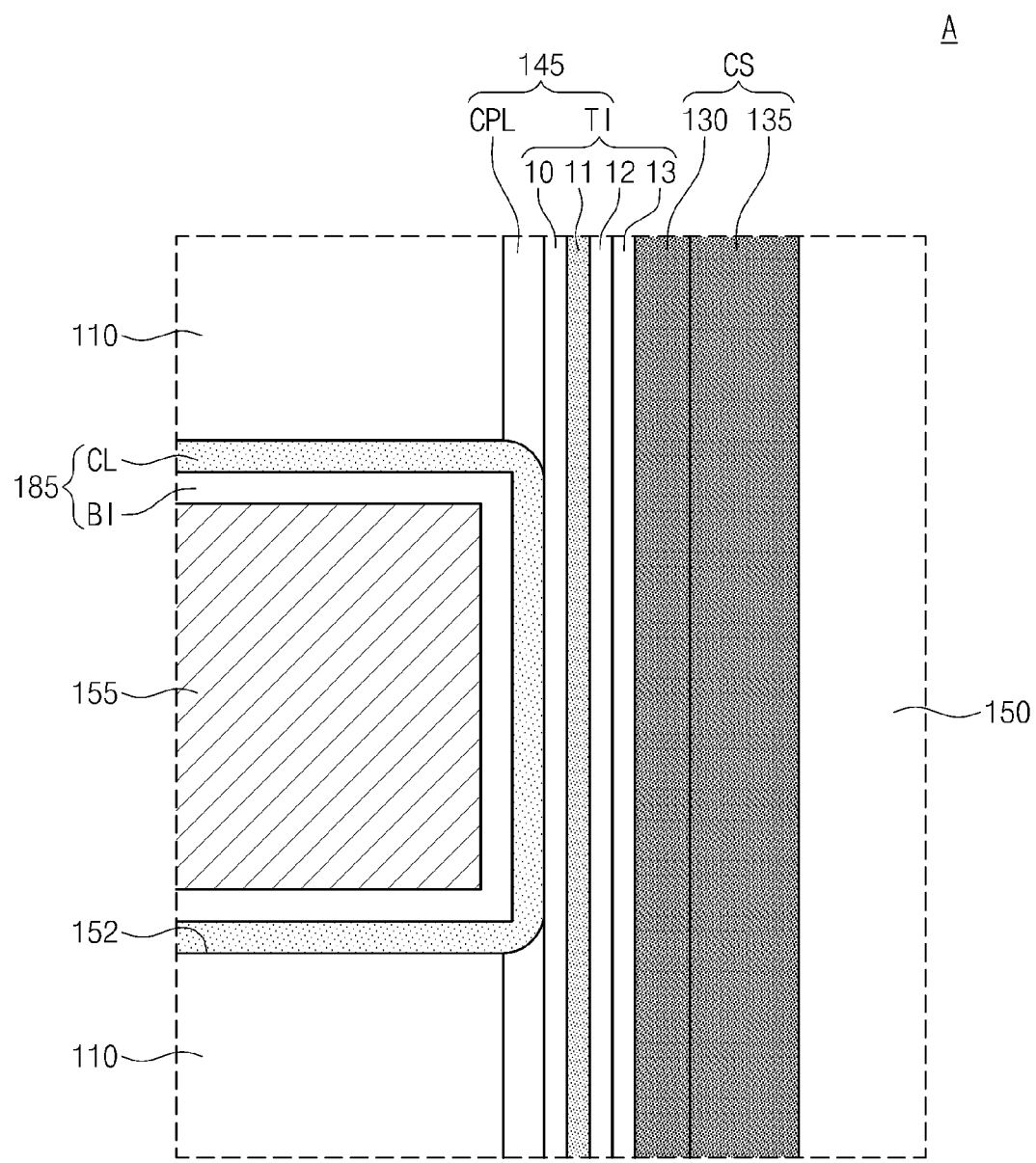

Referring to FIGS. 5J and 7D, an electrode separation pattern 190 may be formed on the common source regions 120 to fill the trenches TR. Furthermore, conductive pads 160 may be formed on and connected to the channel structures CS. Bit line plugs BPLG may be formed on the conductive pads 160 and bit lines BL may be formed on the bit line plugs BPLG.

Hereinafter, a 3D semiconductor memory device according to some other embodiments of the inventive concept will be described with reference to FIG. 7D which is an enlarged view of a portion A of FIG. 5J. In the following description, for concise description, an element previously described with reference to FIGS. 4, 5J, and 6D may be identified by a similar or identical reference number without repeating an overlapping description thereof.

Referring to FIGS. 4, 5J, and 7D, insulating layers 110 and gate electrodes 155 may be alternately and repeatedly stacked on the substrate 100 to form a stack SS. Channel structures CS may be connected to the substrate 100 through the stack SS. A charge storing layer CL may be provided between the channel structures CS and the gate electrodes 155, a tunnel insulating layer TI may be provided between the charge storing layer CL and the channel structures CS, and a blocking insulating layer BI may be provided between the charge storing layer CL and the gate electrodes 155. In certain embodiments, as shown in FIG. 7D, the tunnel insulating layer TI may constitute a vertical insulator 145, and the charge storing layer CL and the blocking insulating layer BI may constitute a horizontal insulator 185.

The charge storing layer CL and the blocking insulating layer BI may extend between the insulating layers 110 and the gate electrodes 155. The tunnel insulating layer TI may extend between the insulating layers 110 and the channel structures CS.

According to certain embodiments of the inventive concept, the 3D semiconductor memory device may be fabricated using a method different from those of the previous embodiments. FIGS. 8A through 8D are enlarged sectional views of portions A of FIGS. 5C, 5G, 5H, and 5J, respectively, when a 3D semiconductor memory device is fabricated by a method according to certain embodiments. A 3D semiconductor memory device may include a reverse-type tunnel insulating layer. For concise description, an element or a step previously described with reference to FIGS. 5A through 5J and FIGS. 6A through 6D may be identified by a similar or identical reference number without repeating an overlapping description thereof.

Figure 8A:
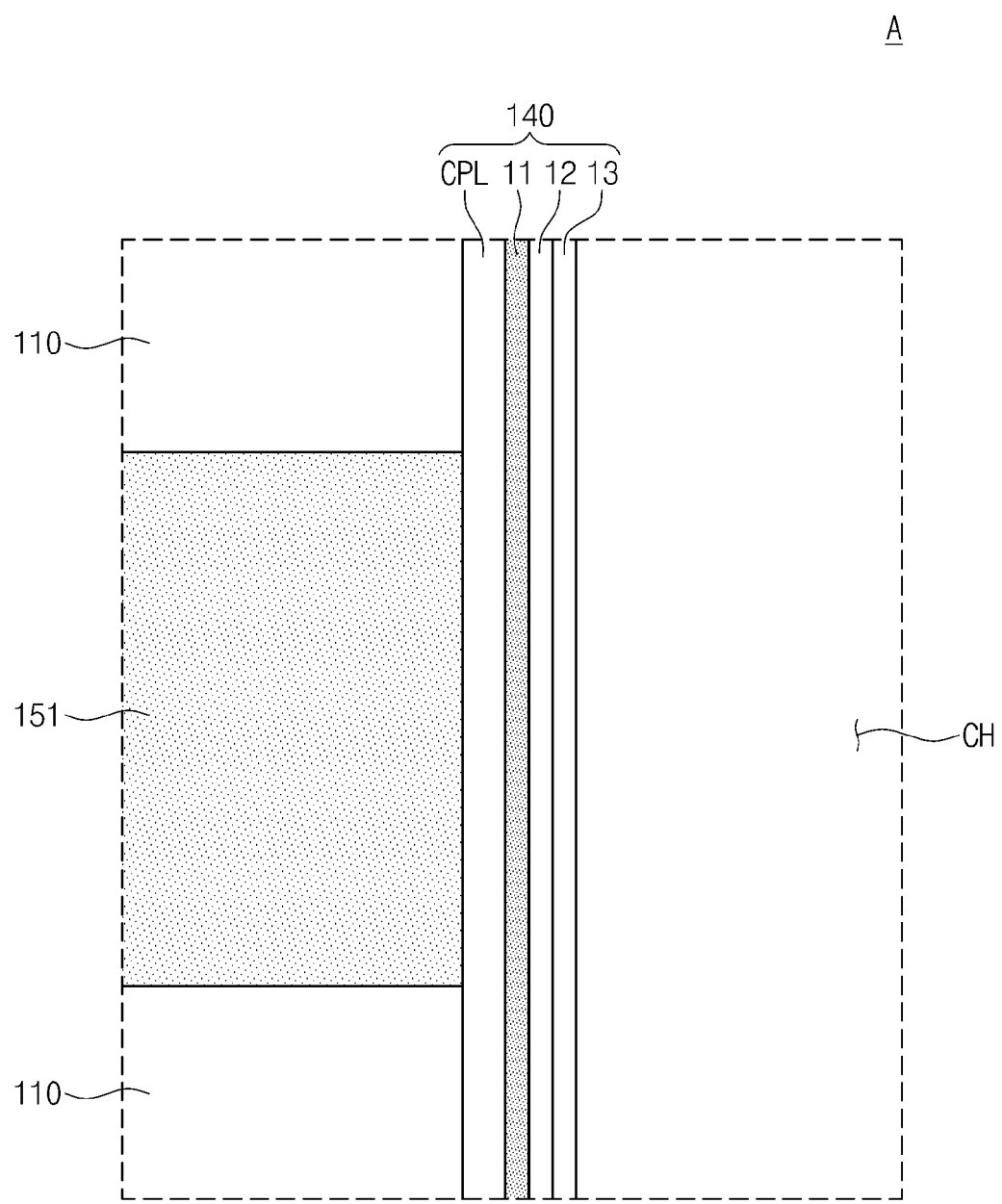
FIGS. 8A through 8D are enlarged sectional views of portions A of FIGS. 5C, 5G, 5H, and 5J, respectively, when a 3D semiconductor memory device is fabricated by a method according to some other embodiments of the inventive concept.

Referring to FIGS. 5C and 8A, a vertical insulating layer 140 may be formed on the structure of FIG. 5B. The vertical insulating layer 140 may be formed on inner surfaces of the channel holes CH. For example, a capping layer CPL may be formed on the inner surfaces of the channel holes CH. A high-k dielectric layer 11, a second tunnel insulating layer 12, and a third tunnel insulating layer 13 may be sequentially formed on the capping layer CPL. The high-k dielectric layer 11 and the second and third tunnel insulating layers 12 and 13 may be configured to have substantially the same features as those described with reference to FIG. 2. However, according to certain embodiments, the vertical insulating layer 140 may be formed not to include the charge storing layer CL and the first tunnel insulating layer 10 of FIG. 6A.

The formation of the tunnel insulating layer TI may include a curing process, which may be performed on the resulting structure with the high-k dielectric layer 11, the second tunnel insulating layer 12, and the third tunnel insulating layer 13. Here, the second tunnel insulating layer 12 may prevent the high-k dielectric layer 11 from being oxidized in the curing process. The curing process may be performed in the same manner as that described with reference to FIG. 2.

Figure 8B:
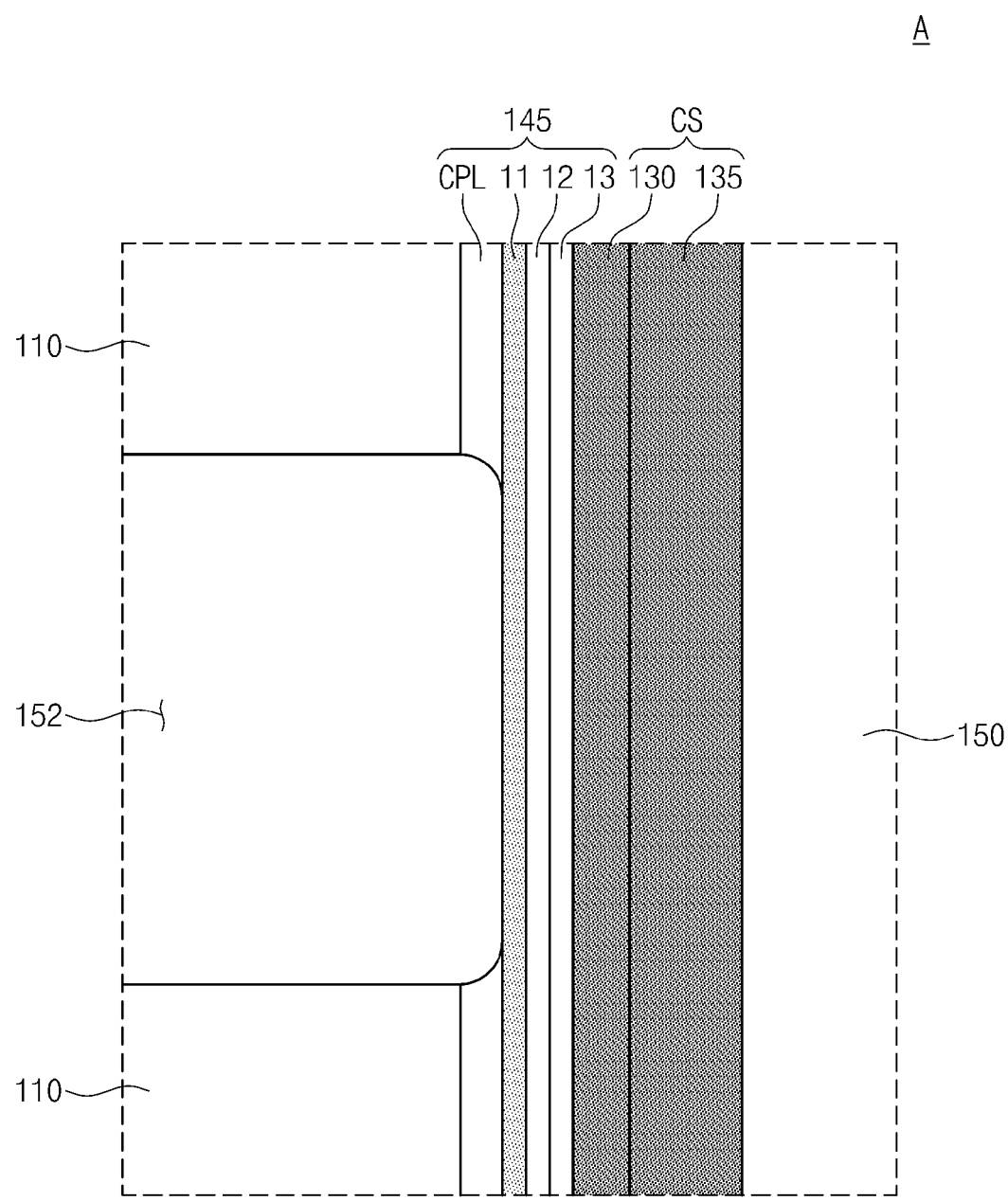

Referring to FIGS. 5G and 8B, an etching process may be performed on the structure of FIG. 5F to form recess regions 152. A sidewall of the capping layer CPL may be partially exposed through the recess regions 152. Here, the capping layer CPL may prevent the high-k dielectric layer 11 from being damaged by an etching solution used in the etching process. Thereafter, the capping layer CPL may be selectively etched to expose the high-k dielectric layer 11 through the recess regions 152.

Figure 8C:
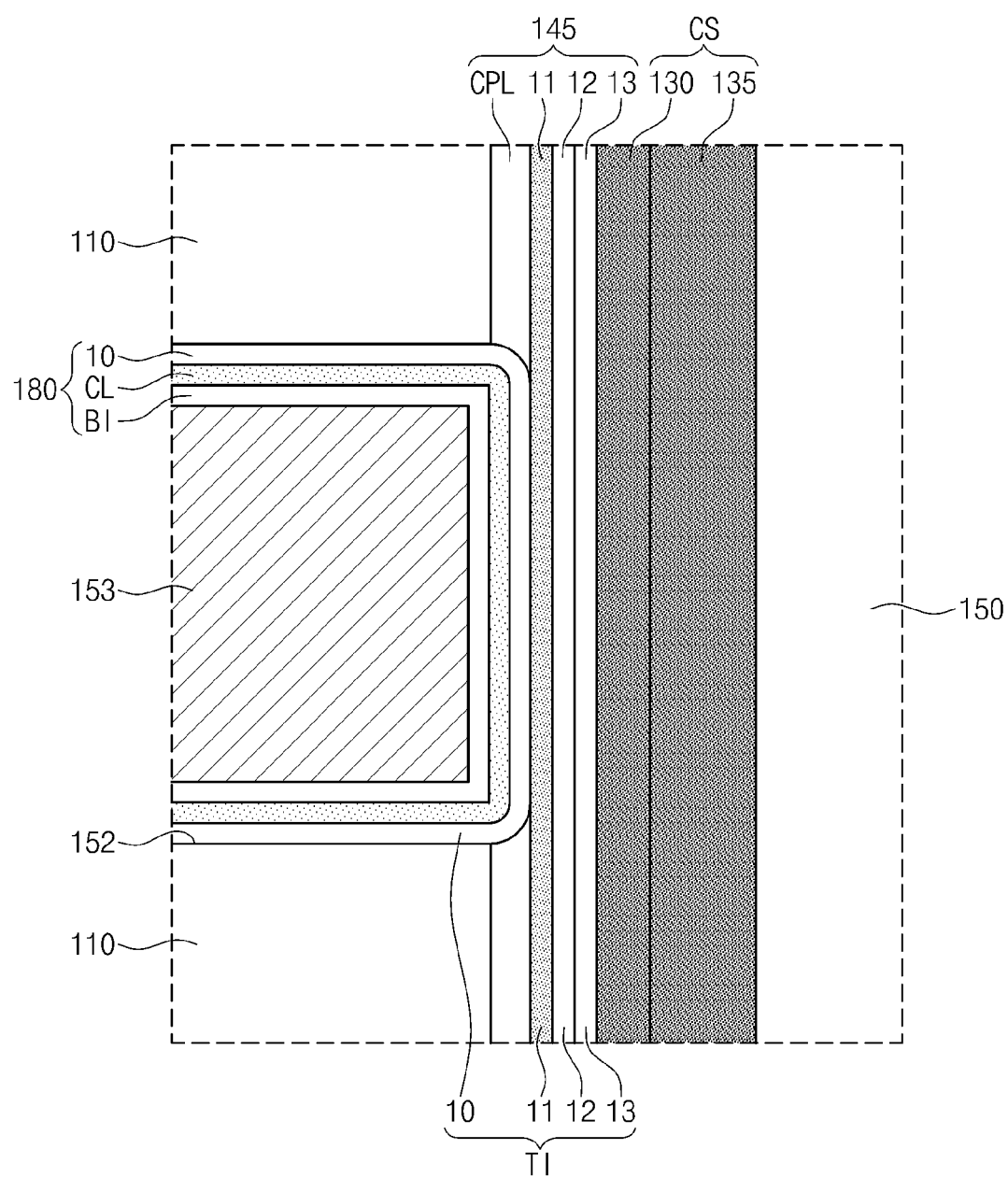

Referring to FIGS. 5H and 8C, a horizontal insulating layer 180 may be formed to conformally cover the recess regions 152. The formation of the horizontal insulating layer 180 may include forming a first tunnel insulating layer 10 to conformally cover inner surfaces of the recess regions 152 and sequentially forming a charge storing layer CL and a blocking insulating layer BI to cover the first tunnel insulation layer 10. The charge storing layer CL, the blocking insulating layer BI, and the first tunnel insulating layer 10 may be formed using an atomic layer deposition process.

For example, unlike the description with reference to FIG. 6C, the horizontal insulating layer 180 may include the blocking insulating layer BI, the charge storing layer CL, and the first tunnel insulating layer 10. The first tunnel insulating layer 10 may contact the high-k dielectric layer 11. The first tunnel insulating layer 10, the high-k dielectric layer 11, the second tunnel insulating layer 12, and the third tunnel insulating layer 13 may constitute a tunnel insulating layer TI interposed between the charge storing layer CL and the channel structure CS.

A gate layer 153 may be formed to fill the remaining spaces of the recess regions 152 provided with the horizontal insulating layer 180.

Referring to FIG. 5I, the horizontal insulating layer 180 and the gate layer 153 may be removed from the trenches TR. Accordingly, horizontal insulator 185 and gate electrodes 155 may be formed in the recess regions 152. Here, the gate electrodes 155 and the insulating layers 110 alternately stacked on the substrate 100 may constitute a stack SS.

After the formation of the gate electrodes 155, common source regions 120 may be formed in the substrate 100.

Figure 8D:
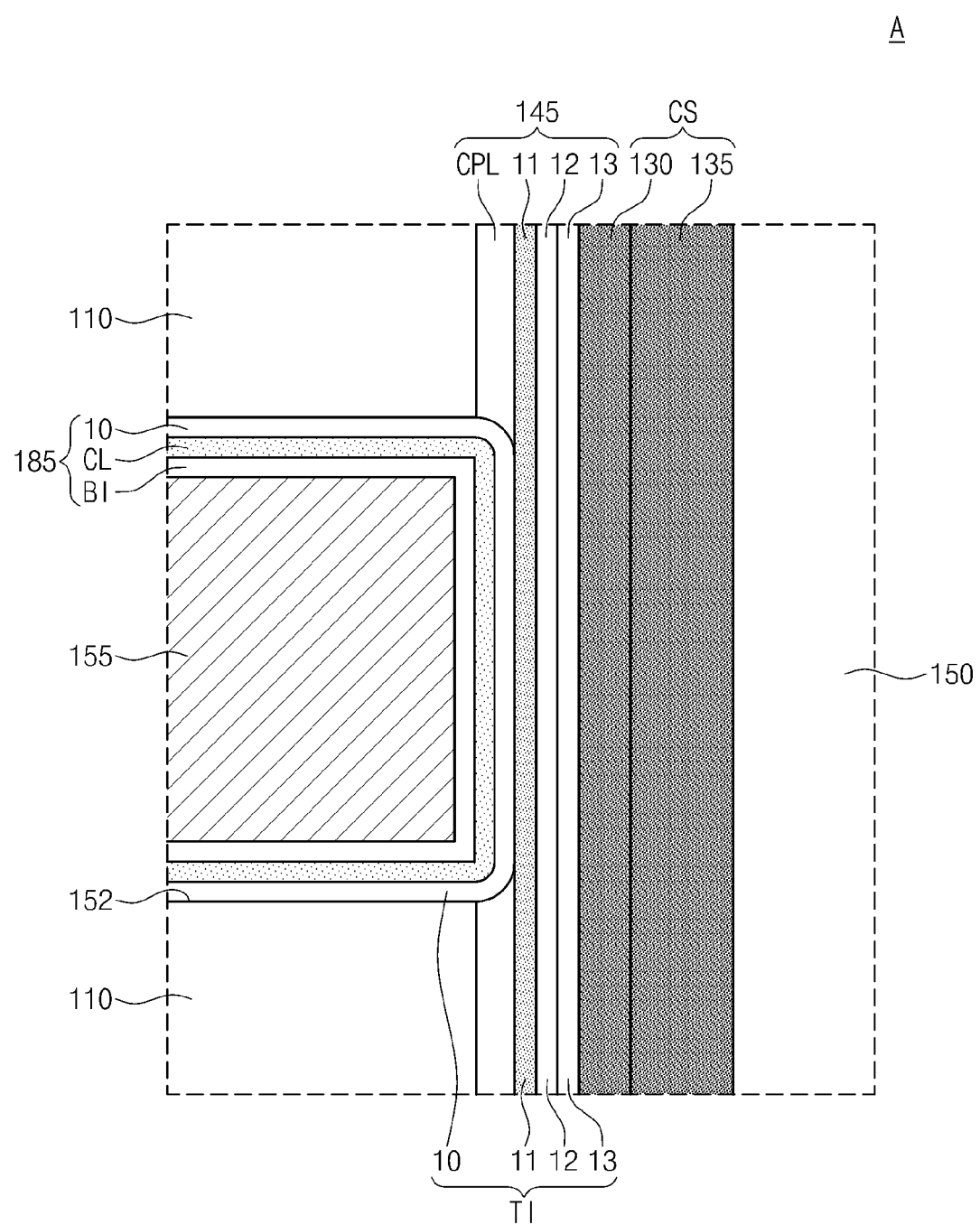

Referring to FIGS. 5J and 8D, an electrode separation pattern 190 may be formed on the common source regions 120 to fill the trenches TR. Furthermore, conductive pads 160 may be formed on and connected to the channel structures CS. Bit line plugs BPLG may be formed on the conductive pads 160 and bit lines BL may be formed on the bit line plugs BPLG.

Hereinafter, a 3D semiconductor memory device according to some embodiments of the inventive concept will be described with reference to FIG. 8D which is an enlarged view of a portion A of FIG. 5J. In the following description, for concise description, an element previously described with reference to FIGS. 4, 5J, and 6D may be identified by a similar or identical reference number without repeating an overlapping description thereof.

Referring to FIGS. 4, 5J, and 8D, insulating layers 110 and gate electrodes 155 may be alternately and repeatedly stacked on the substrate 100 to form a stack SS. Channel structures CS may be connected to the substrate 100 through the stack SS. A charge storing layer CL may be provided between the channel structures CS and the gate electrodes 155, a tunnel insulating layer TI may be provided between the charge storing layer CL and the channel structures CS, and a blocking insulating layer BI may be provided between the charge storing layer CL and the gate electrodes 155.

As shown in FIG. 8D, the tunnel insulating layer TI may include a first tunnel insulating layer 10, a high-k dielectric layer 11, a second tunnel insulating layer 12, and a third tunnel insulating layer 13. Here, the first tunnel insulating layer 10 may extend between the insulating layers 110 and the gate electrodes 155. The high-k dielectric layer 11, the second tunnel insulating layer 12, and the third tunnel insulating layer 13 may constitute a single structure extending between the insulating layers 110 and the channel structures CS. For example, the high-k dielectric layer 11, the second tunnel insulating layer 12, and the third tunnel insulating layer 13 may constitute a vertical insulator 145, and the first tunnel insulating layer 10, the charge storing layer CL, and the blocking insulating layer BI may constitute a horizontal insulator 185. The charge storing layer CL and the blocking insulating layer BI, along with the first tunnel insulating layer 10, may extend between the insulating layers 110 and the gate electrodes 155.

FIGS. 9A through 9E are sectional views illustrating a method of fabricating a 3D semiconductor memory device, according to some embodiments of the inventive concept. FIGS. 10A through 10D are enlarged sectional views of portions A of FIGS. 9A, 9B, 9C, and 9E, respectively. A 3D semiconductor memory device may include a reverse-type tunnel insulating layer. For concise description, an element or a step previously described with reference to FIGS. 5A through 5J and FIGS. 6A through 6D may be identified by a similar or identical reference number without repeating an overlapping description thereof.

Figure 9A:
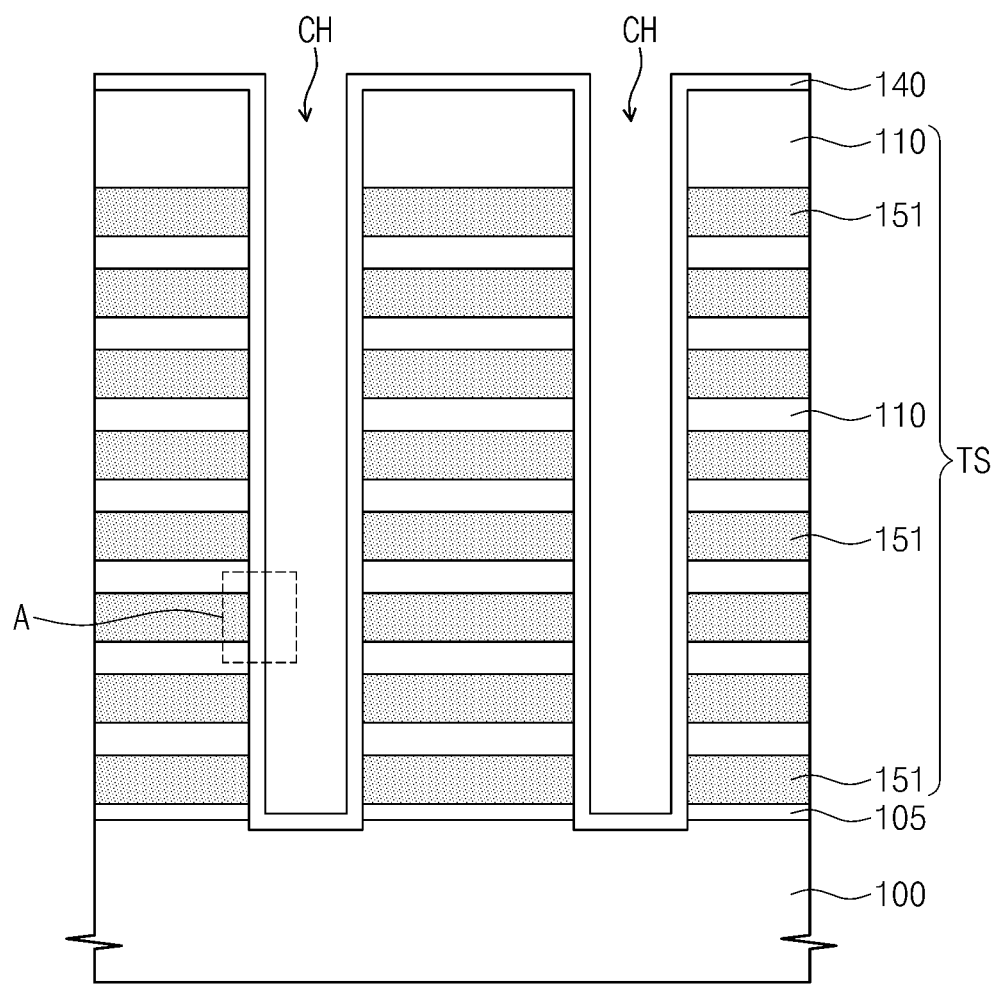
FIGS. 9A through 9E are sectional views illustrating a method of fabricating a 3D semiconductor memory device, according to some embodiments of the inventive concept.
Figure 10A:
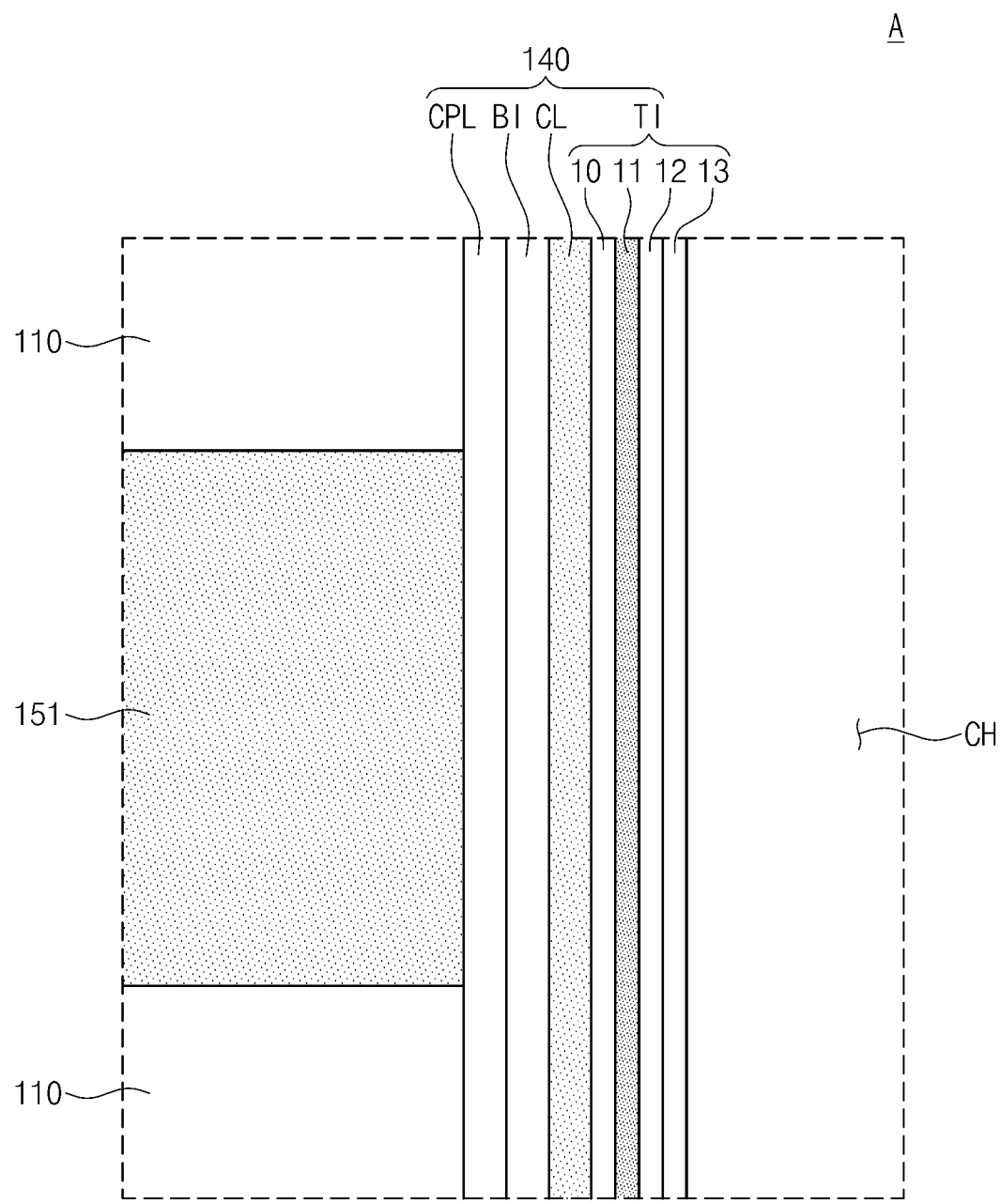

Referring to FIGS. 9A and 10A, a vertical insulating layer 140 may be formed on the structure of FIG. 5B. The vertical insulating layer 140 may be formed on inner surfaces of the channel holes CH. For example, a capping layer CPL may be formed on the inner surfaces of the channel holes CH. Thereafter, a blocking insulating layer BI, a charge storing layer CL, and a tunnel insulating layer TI may be sequentially formed on the capping layer CPL. The tunnel insulating layer TI may include a first tunnel insulating layer 10, a high-k dielectric layer 11, a second tunnel insulating layer 12, and a third tunnel insulating layer 13. The tunnel insulating layer TI may be formed using the same method as that described with reference to FIG. 2, and thus, it may have substantially the same technical features as those of the tunnel insulating layer TI of FIG. 2.

The formation of the tunnel insulating layer TI may include a curing process, which may be performed on the resulting structure with the first tunnel insulating layer 10, the high-k dielectric layer 11, the second tunnel insulating layer 12, and the third tunnel insulating layer 13. Here, the second tunnel insulating layer 12 may prevent the high-k dielectric layer 11 from being oxidized in the curing process. The curing process may be performed in the same manner as that described with reference to FIG. 2.

Figure 9B:
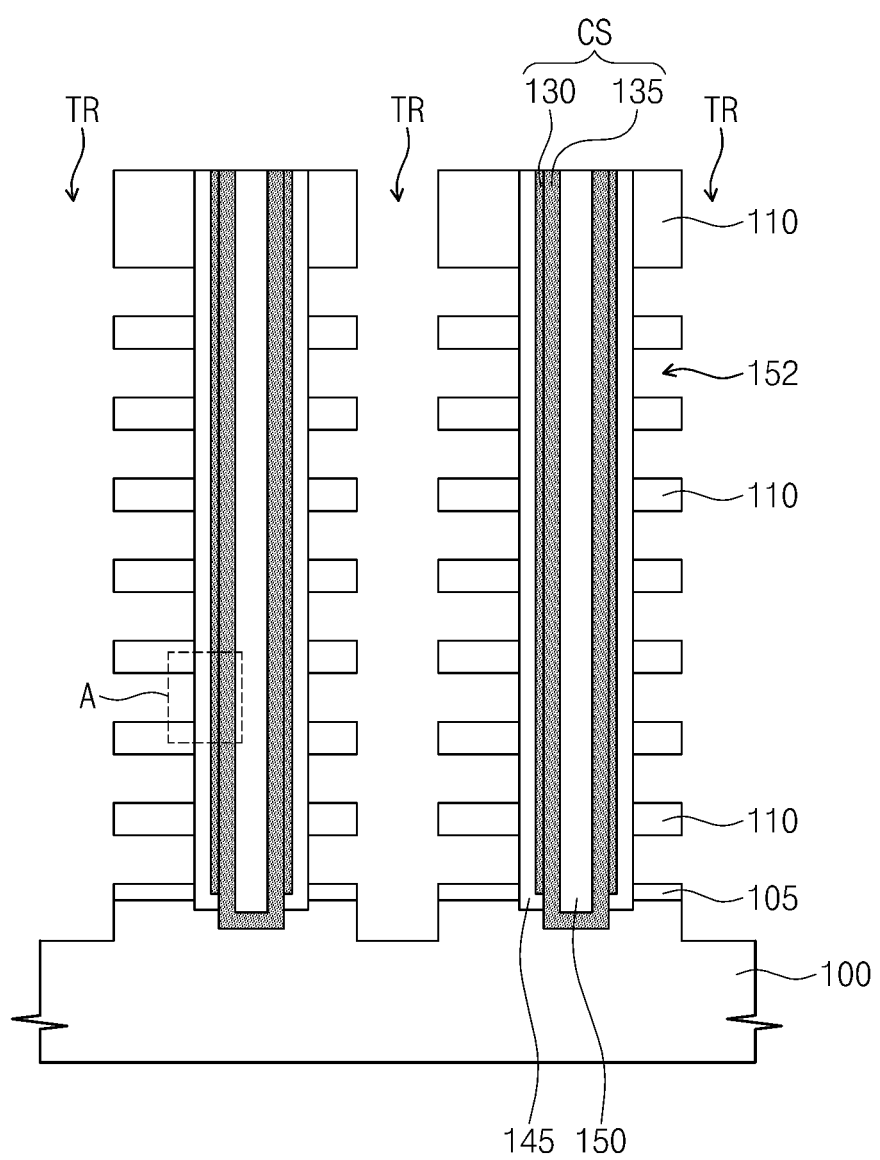
Figure 10B:
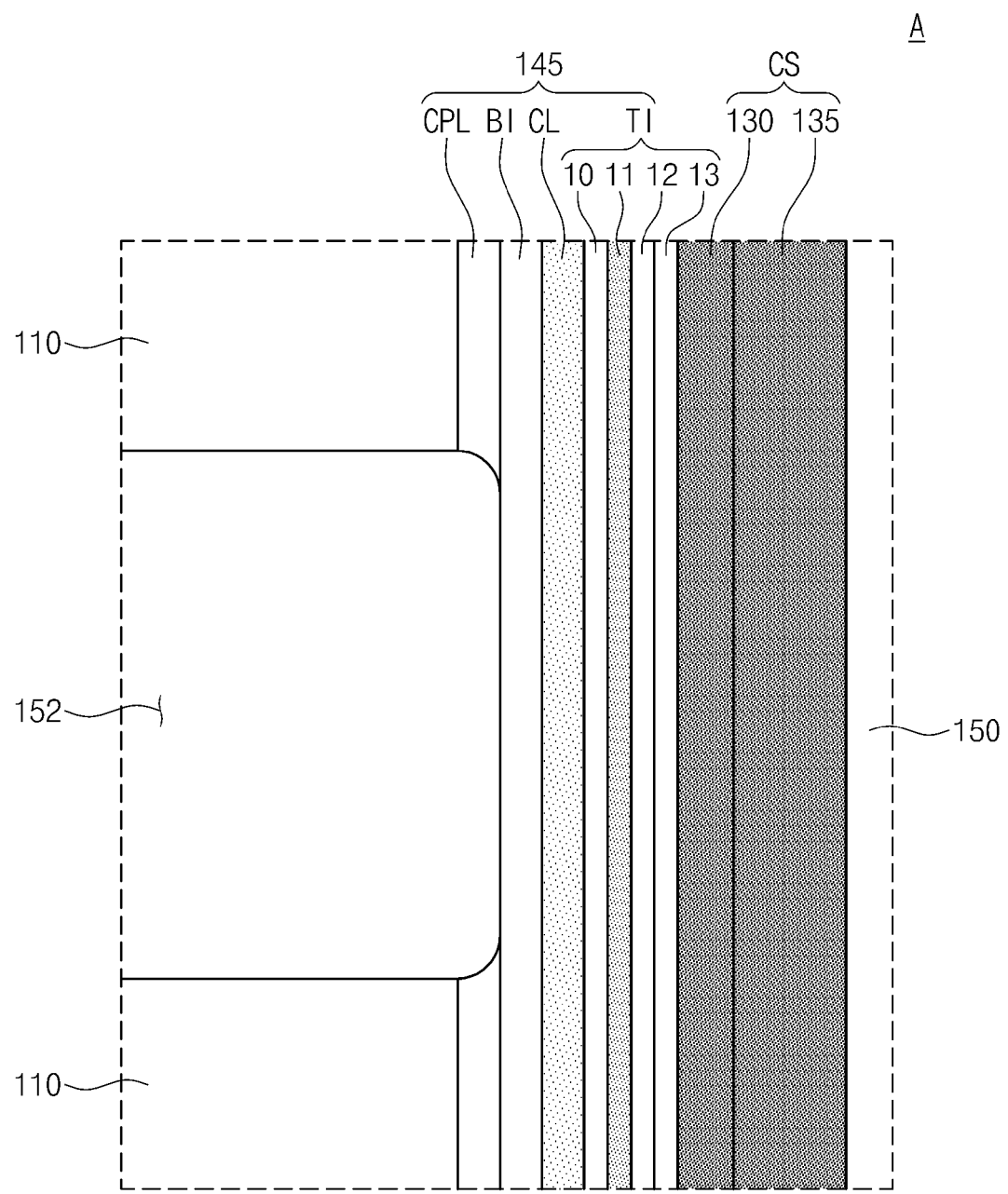

Referring to FIGS. 9B and 10B, an etching process may be performed on the structure of FIG. 5F to form recess regions 152. A sidewall of the capping layer CPL may be partially exposed through the recess regions 152. Here, the capping layer CPL may prevent the high-k dielectric layer 11 from being damaged by an etching solution used in the etching process. The capping layer CPL may be selectively removed, and thus, the blocking insulating layer BI may be exposed through the recess regions 152.

Figure 9C:
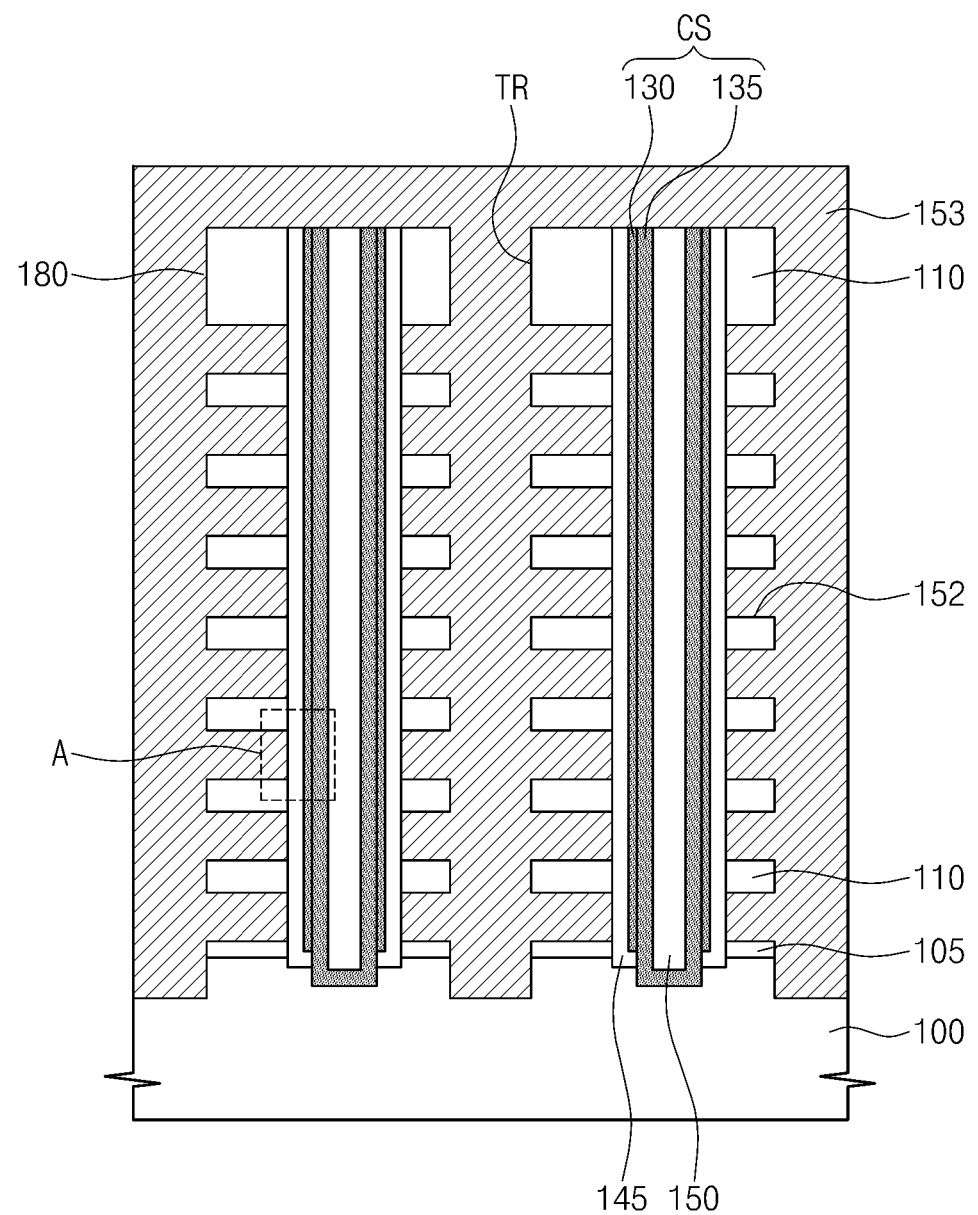

Referring to FIGS. 9C and 10C, a gate layer 153 may be formed to fill the recess regions 152. The gate layer 153 may be formed to contact top and bottom surfaces of the insulating layers 110. For example, unlike the description with reference to FIG. 6C, the horizontal insulating layer 180 may be omitted, and thus, the gate layer 153 may contact the vertical insulator 145.

Figure 9D:
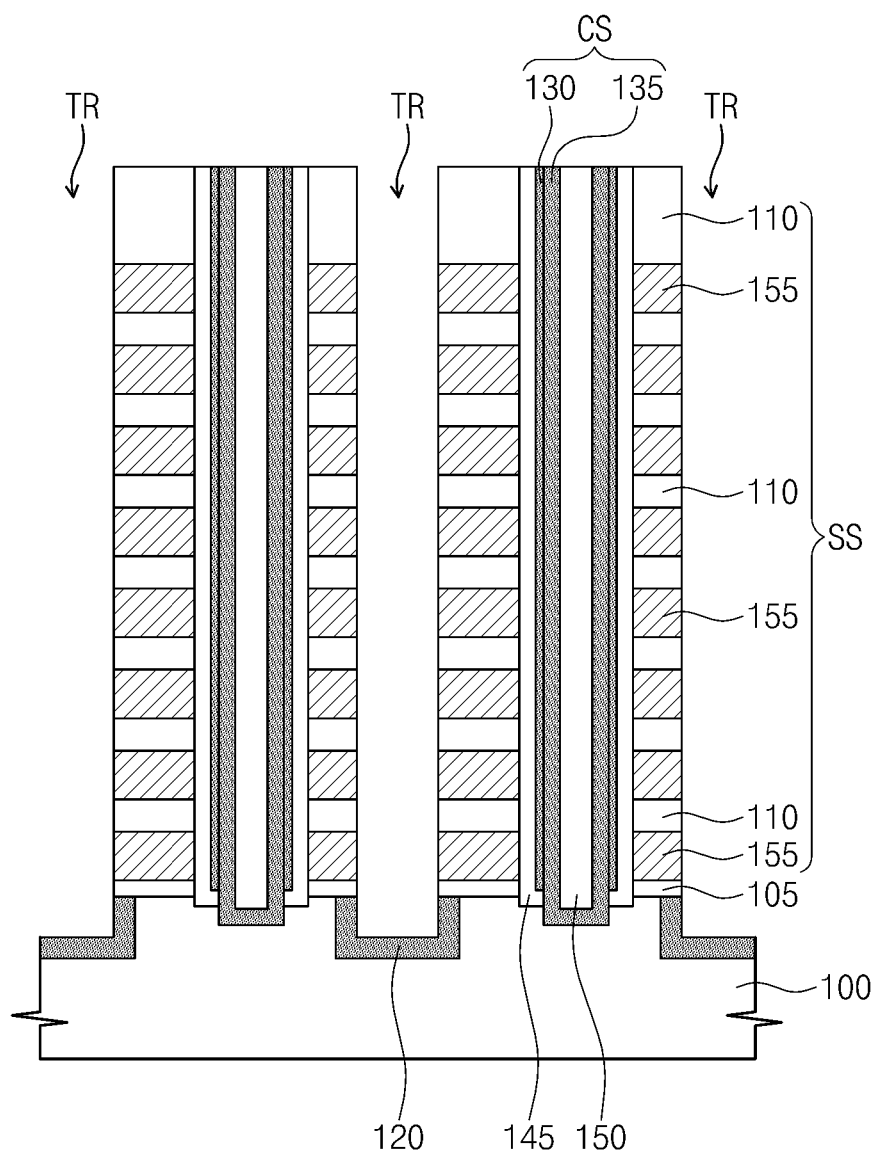

Referring to FIG. 9D, the gate layer 153 may be removed from the trenches TR. Accordingly, gate electrodes 155 may be formed in the recess regions 152. Here, the gate electrodes 155 and the insulating layers 110 alternately stacked on the substrate 100 may constitute a stack SS.

After the formation of the gate electrodes 155, common source regions 120 may be formed in the substrate 100.

Figure 9E:
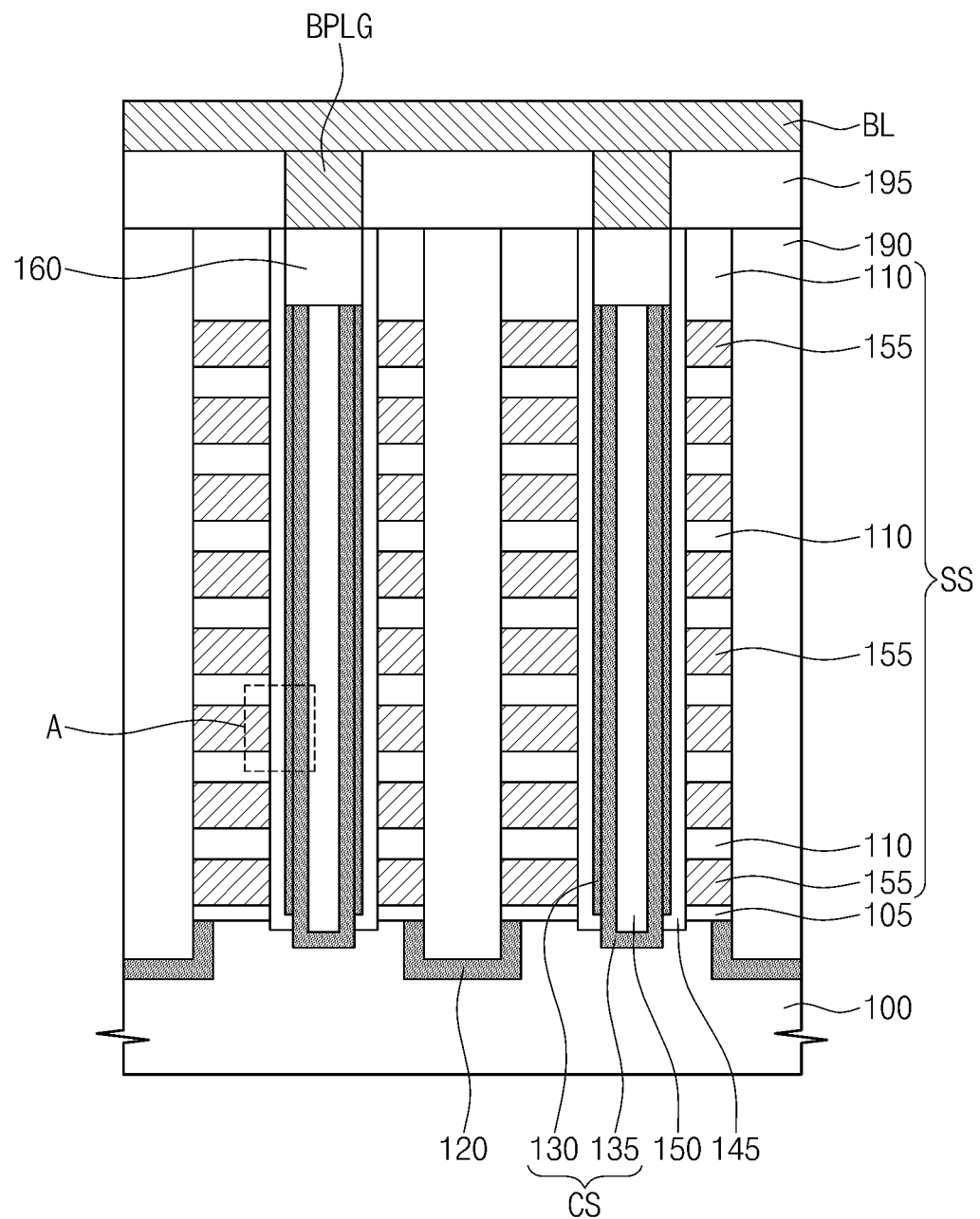
Figure 10D:
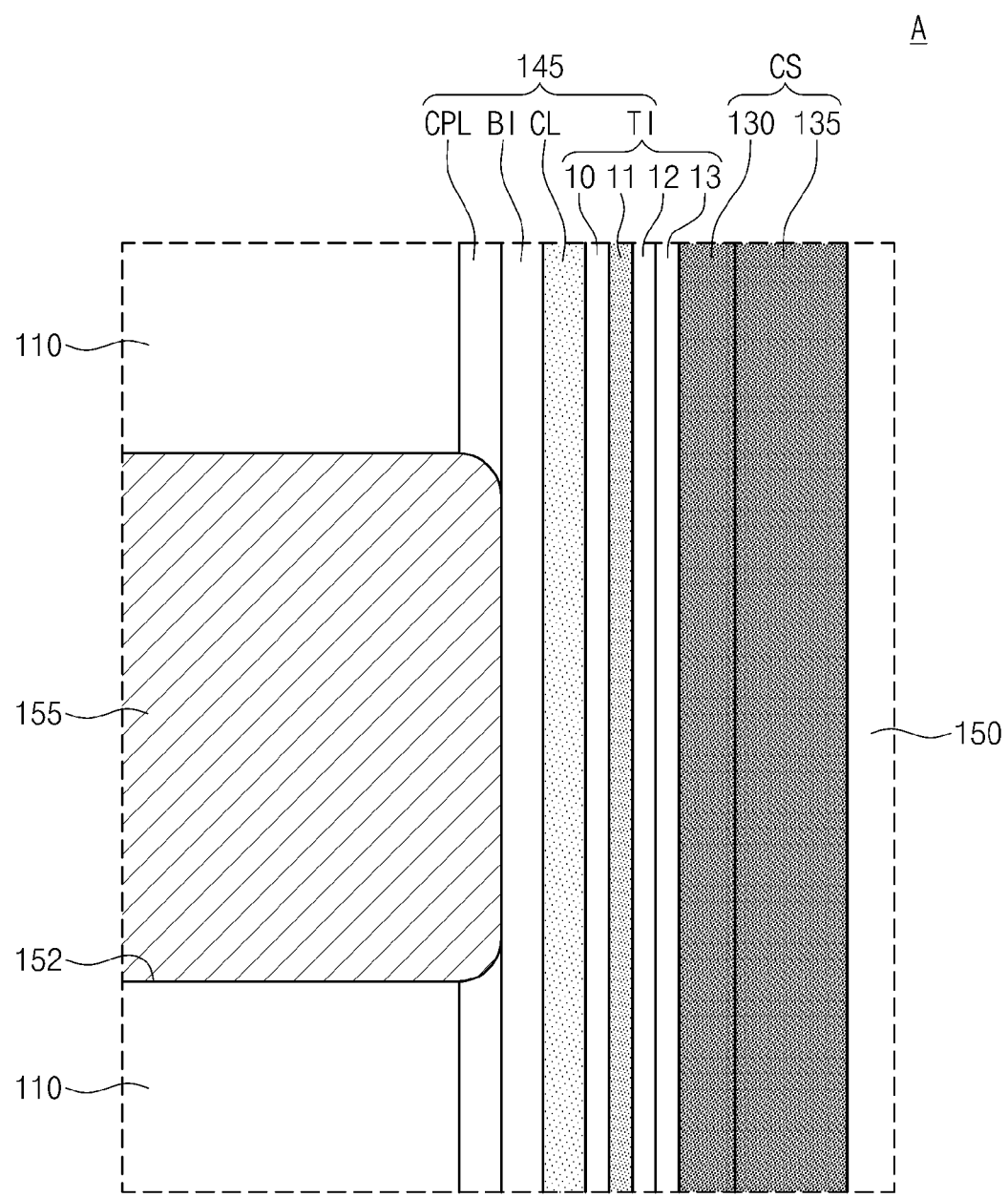

Referring to FIGS. 9E and 10D, an electrode separation pattern 190 may be formed on the common source regions 120 to fill the trenches TR. Furthermore, conductive pads 160 may be formed on and connected to the channel structures CS. Bit line plugs BPLG may be formed on the conductive pads 160 and bit lines BL may be formed on the bit line plugs BPLG.

FIG. 9E is a sectional view illustrating a 3D semiconductor memory device according to some embodiments of the inventive concept. FIG. 10D is an enlarged sectional view of a portion A of FIG. 9E. In the following description, for concise description, an element previously described with reference to FIGS. 4, 5J, and 6D may be identified by a similar or identical reference number without repeating an overlapping description thereof.

Referring to FIGS. 9E and 10D, insulating layers 110 and gate electrodes 155 may be alternately and repeatedly stacked on the substrate 100 to form a stack SS. Channel structures CS may be connected to the substrate 100 through the stack SS, and vertical insulators 145 may be provided between the channel structures CS and the gate electrodes 155. Each of the vertical insulators 145 may include a charge storing layer CL, a tunnel insulating layer TI between the charge storing layer CL and the channel structures CS, and a blocking insulating layer BI between the charge storing layer CL and the gate electrodes 155.

The gate electrodes 155 may contact top and bottom surfaces of the insulating layers 110. For example, unlike the description with reference to FIGS. 5J and 6D, the horizontal insulator 185 may be omitted.

The charge storing layer CL, the blocking insulating layer BI and the tunnel insulating layer TI may constitute a single structure extending between the insulating layers 110 and the channel structures CS.

FIGS. 11A through 11F are sectional views illustrating a method of fabricating a 3D semiconductor memory device according to some embodiments of the inventive concept. FIGS. 12A and 12B are enlarged sectional views of portions A of FIGS. 11D and 11F, respectively. A 3D semiconductor memory device may include a tunnel insulating layer TI that is different from the afore-described reverse-type tunnel insulating layer. For example, the tunnel insulating layer TI may be formed after forming a semiconductor layer serving as the channel structure CS.

For concise description, an element or a step previously described with reference to FIGS. 5A through 5J and FIGS. 6A through 6D may be identified by a similar or identical reference number without repeating an overlapping description thereof.

Figure 11A:
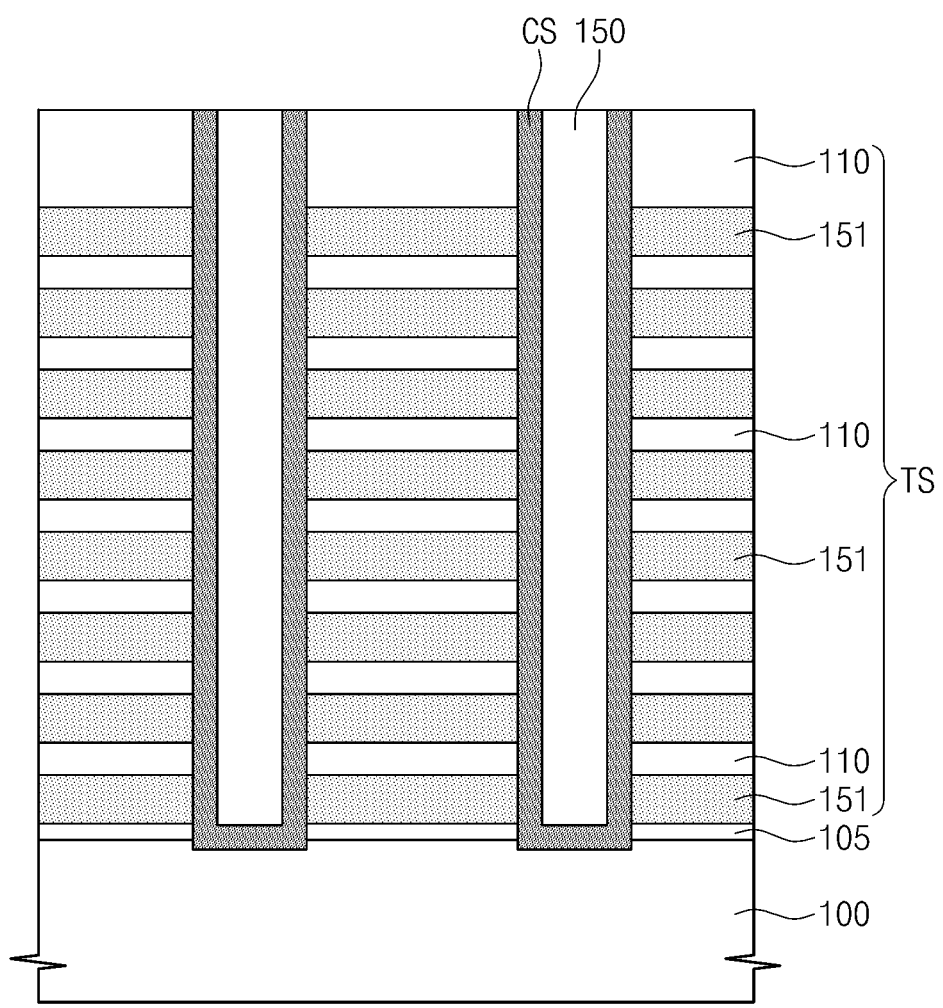
FIGS. 11A through 11F are sectional views illustrating a method of fabricating a 3D semiconductor memory device, according to some other embodiments of the inventive concept.
Figure 12A:
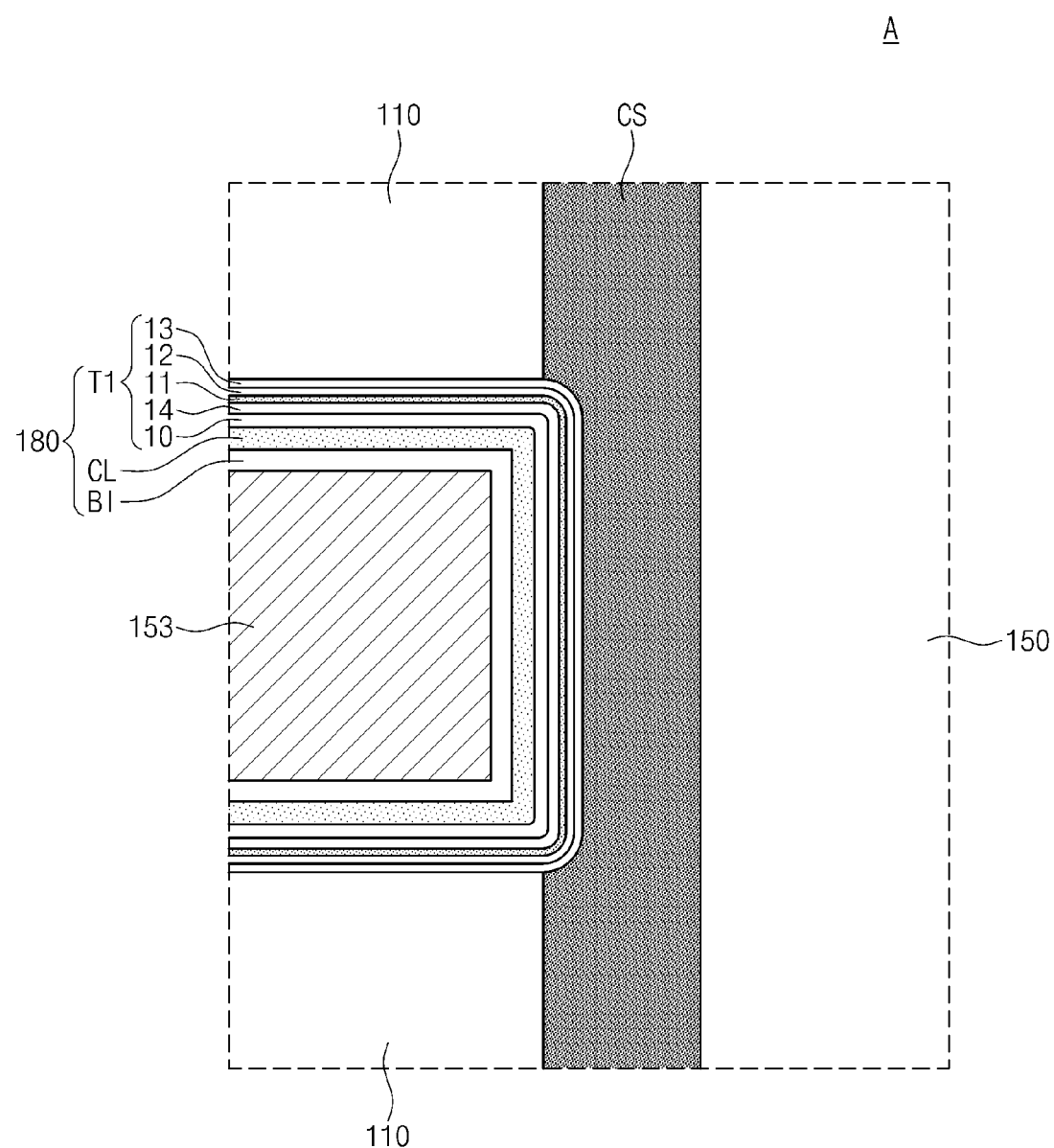
FIGS. 12A and 12B are enlarged sectional views of portions A of FIGS. 11D and 11F, respectively.
Figure 12B:
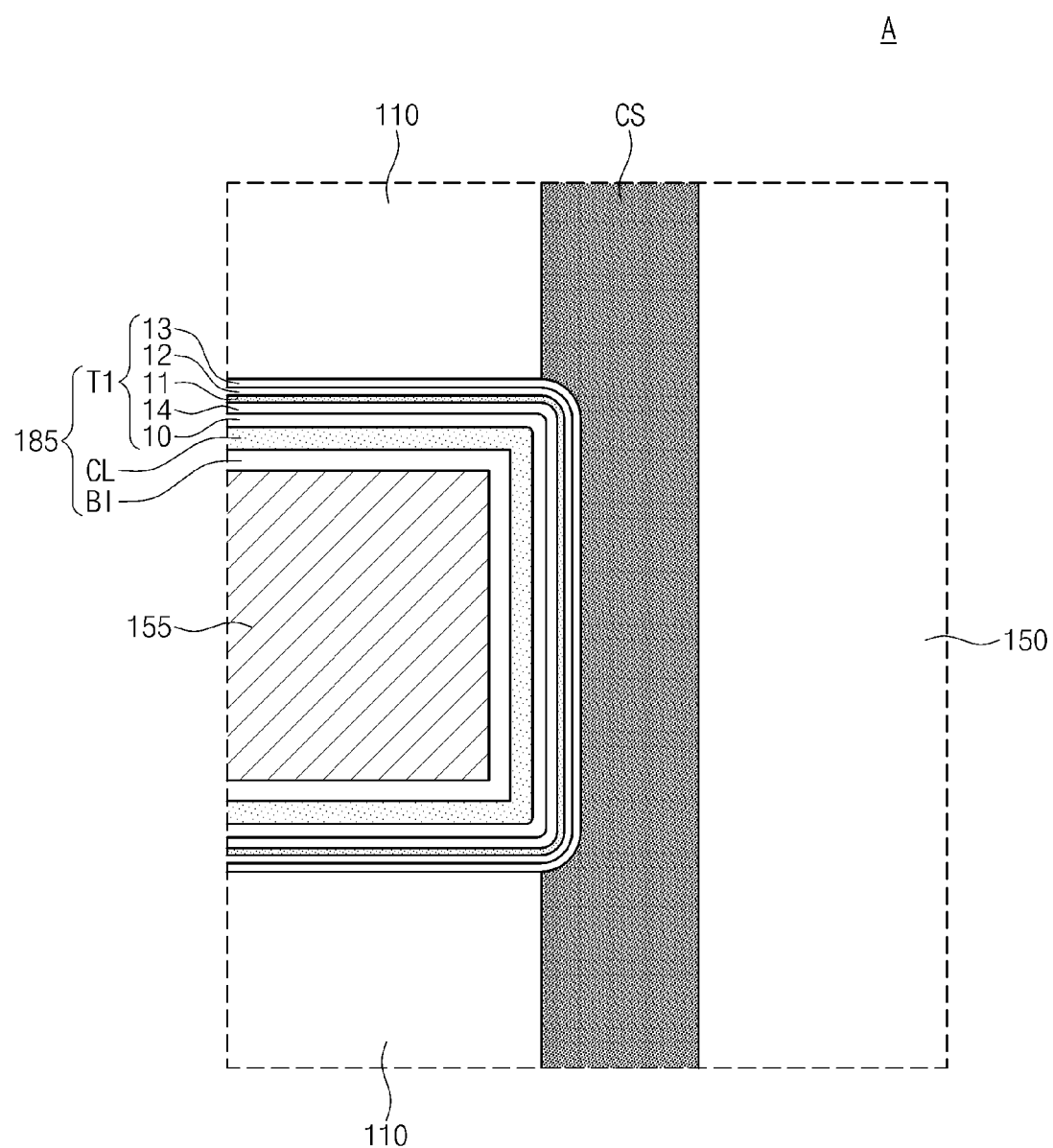

Referring to FIG. 11A, channel structures CS and insulating filling patterns 150 may be formed on the structure of FIG. 5B. The channel structures CS may be formed to cover inner surfaces channel holes CH, and the insulating filling patterns 150 may be formed to fill the channel holes CH provided with the channel structures CS.

For example, a semiconductor layer (not shown) may be formed to cover the inner surfaces of the channel holes CH. The semiconductor layer may be formed to partially fill the channel holes CH. For example, the channel holes CH may not be completely filled with the semiconductor layer. Thereafter, an insulating filling layer (not shown) may be formed in the channel holes CH provided with the semiconductor layer. The insulating filling layer may be formed to fill the remaining empty spaces of the channel holes CH. Thereafter, a planarization process may be performed on the semiconductor layer and the insulating filling layer to expose a top surface of the layered structure TS, and thus, the channel structures CS and the insulating filling patterns 150 may be locally formed in the channel holes CH. For example, unlike the description with reference to FIG. 5E, the vertical insulator may be omitted, and the channel holes CH may be filled with the channel structures CS and the insulating filling patterns 150.

Figure 11B:
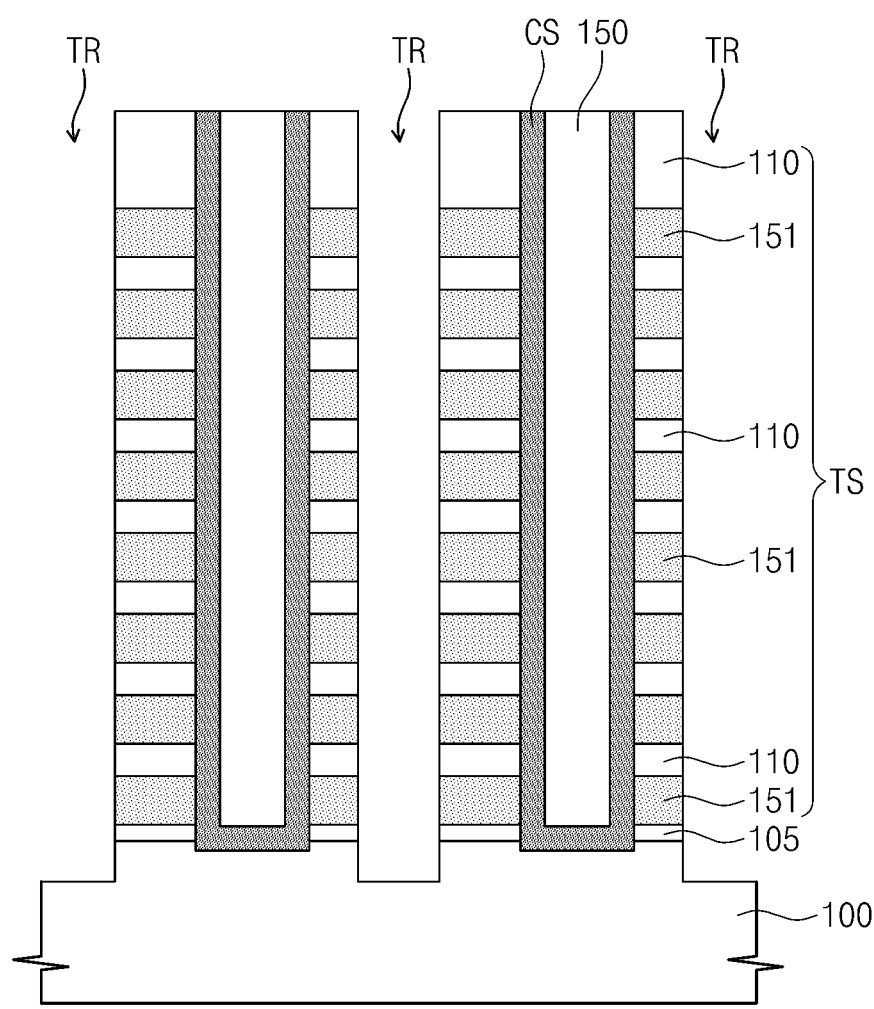

Referring to FIG. 11B, the layered structure TS may be patterned to form trenches TR exposing the substrate 100 between the channel holes CH. The trenches TR may be formed to define both side surfaces of the layered structure TS, and thus, the layered structure TS may have a line shape extending parallel to the trenches TR. In certain embodiments, each layered structure TS may be penetrated by a plurality of the channel structures CS.

Figure 11C:
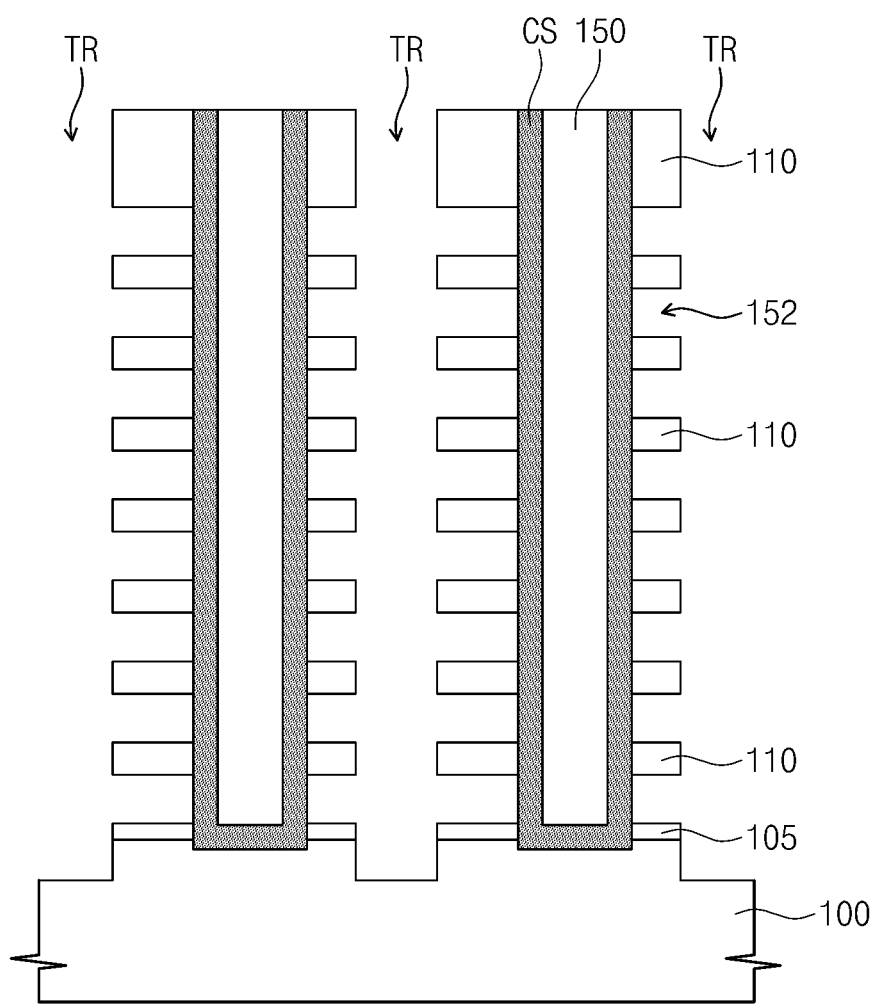

Referring to FIG. 11C, the sacrificial layers 151 exposed by the trenches TR may be selectively removed to form recess regions 152. For example, the recess regions 152 may be formed to partially expose sidewalls of the channel structures CS. Here, the sidewalls of the channel structures CS may be partially recessed by an etching solution used in the process of removing the sacrificial layers 151.

Figure 11D:
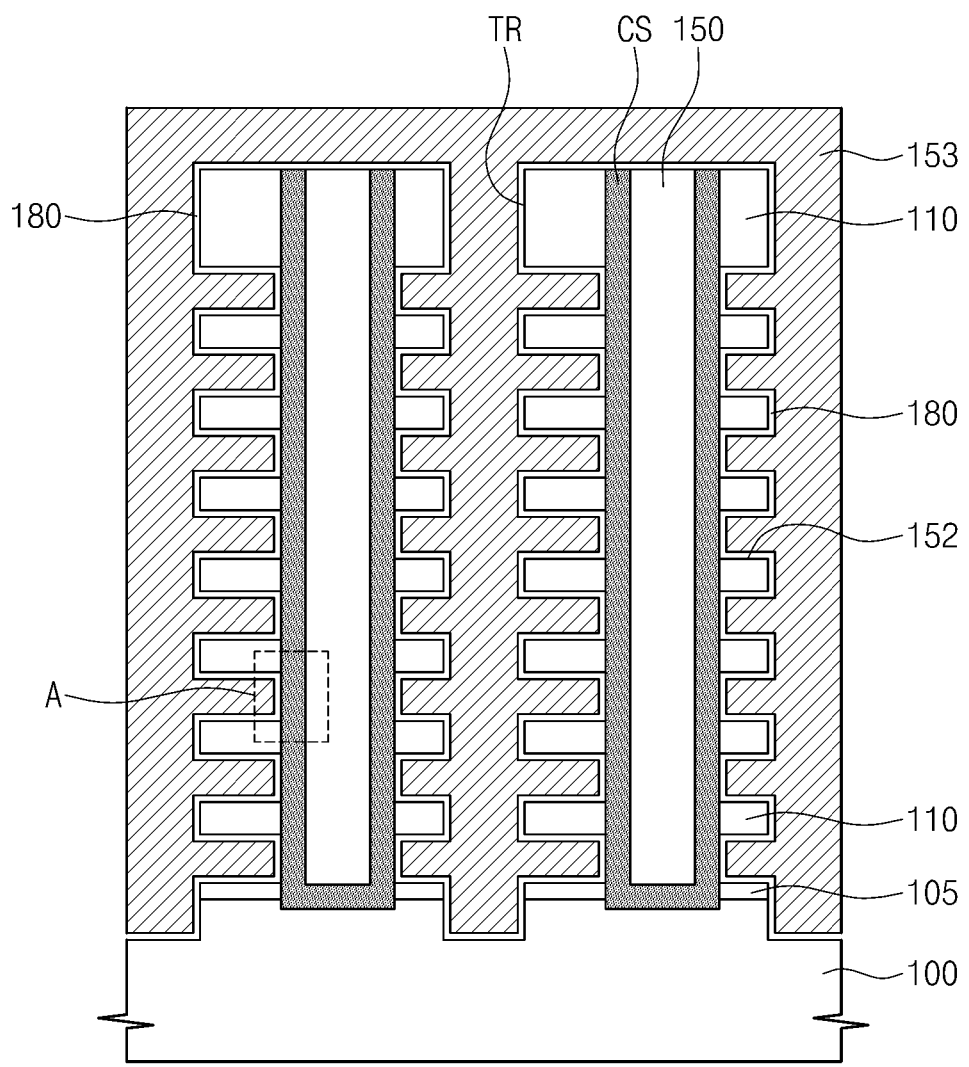

Referring to FIGS. 11D and 12A, a horizontal insulating layer 180 may be formed to conformally cover the recess regions 152. For example, the horizontal insulating layer 180 may include a tunnel insulating layer TI, a charge storing layer CL, and a blocking insulating layer BI. Thereafter, a gate layer 153 may be formed on the blocking insulating layer BI to fill the remaining spaces of the recess regions 152. For example, the blocking insulating layer BI may be in direct contact with the gate layer 153, and the tunnel insulating layer TI may be in direct contact with the channel structure CS exposed by the recess regions 152. The charge storing layer CL may be provided between the blocking insulating layer BI and the tunnel insulating layer TI.

In detail, the formation of the tunnel insulating layer TI may include sequentially forming a third tunnel insulating layer 13, a second tunnel insulating layer 12, a high-k dielectric layer 11, a fourth tunnel insulating layer 14, and a first tunnel insulating layer 10 on the channel structure CS exposed by the recess regions 152. The fourth tunnel insulating layer 14 may include a nitrogen-containing material (e.g., silicon nitride or silicon oxynitride).

The tunnel insulating layer TI may be formed in a similar manner as that of FIG. 2, except for the fourth tunnel insulating layer 14 interposed between the first tunnel insulating layer 10 and the high-k dielectric layer 11. The formation sequence of the layers may be different from the embodiment described with reference to FIGS. 5A through 5J and FIGS. 6A through 6D in that the tunnel insulating layer TI is not the reverse-type tunnel insulating layer; for example, the tunnel insulating layer TI may be formed after the formation of the channel structures CS. For example, the first to fourth tunnel insulating layers 10, 12, 13, and 14 and the high-k dielectric layer 11 may be formed in a reverse order, compared to the forming order of the embodiment described with reference to FIGS. 5A through 5J and FIGS. 6A through 6D. The tunnel insulating layer of the embodiment described with reference to FIGS. 5A through 5J and FIGS. 6A through 6D is called reverse-type tunnel insulating layer.

After the formation of the tunnel insulating layer TI, a curing process may be performed on the first tunnel insulating layer 10. Here, the second and fourth tunnel insulating layers 12 and 14 may prevent the high-k dielectric layer 11 from being oxidized during the curing process. Except for this difference, the curing process may be performed in the same manner as that of FIG. 2.

Figure 11E:
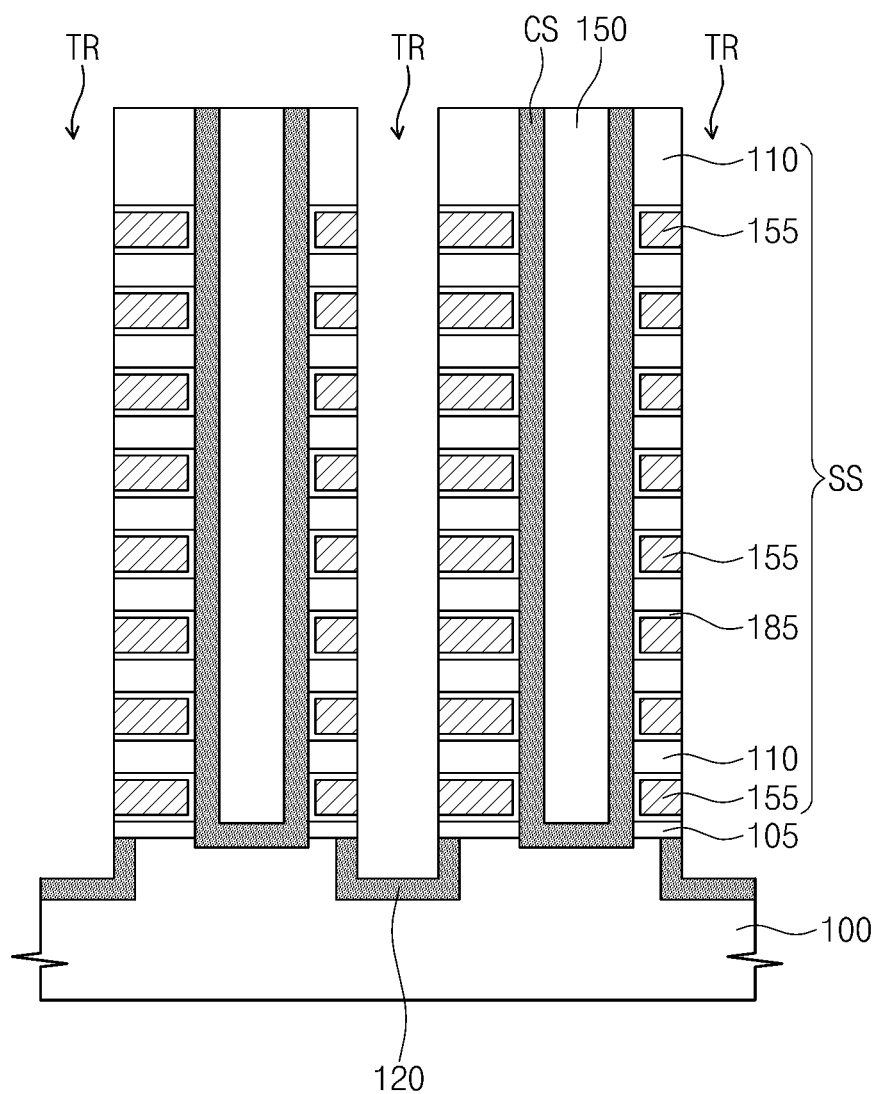

Referring to FIG. 11E, the horizontal insulating layer 180 and the gate layer 153 may be removed from the trenches TR. Accordingly, horizontal insulator 185 and gate electrodes 155 may be formed in the recess regions 152. Here, the gate electrodes 155 and the insulating layers 110 alternately stacked on the substrate 100 may constitute a stack SS.

After the formation of the gate electrodes 155, common source regions 120 may be formed in the substrate 100.

Figure 11F:
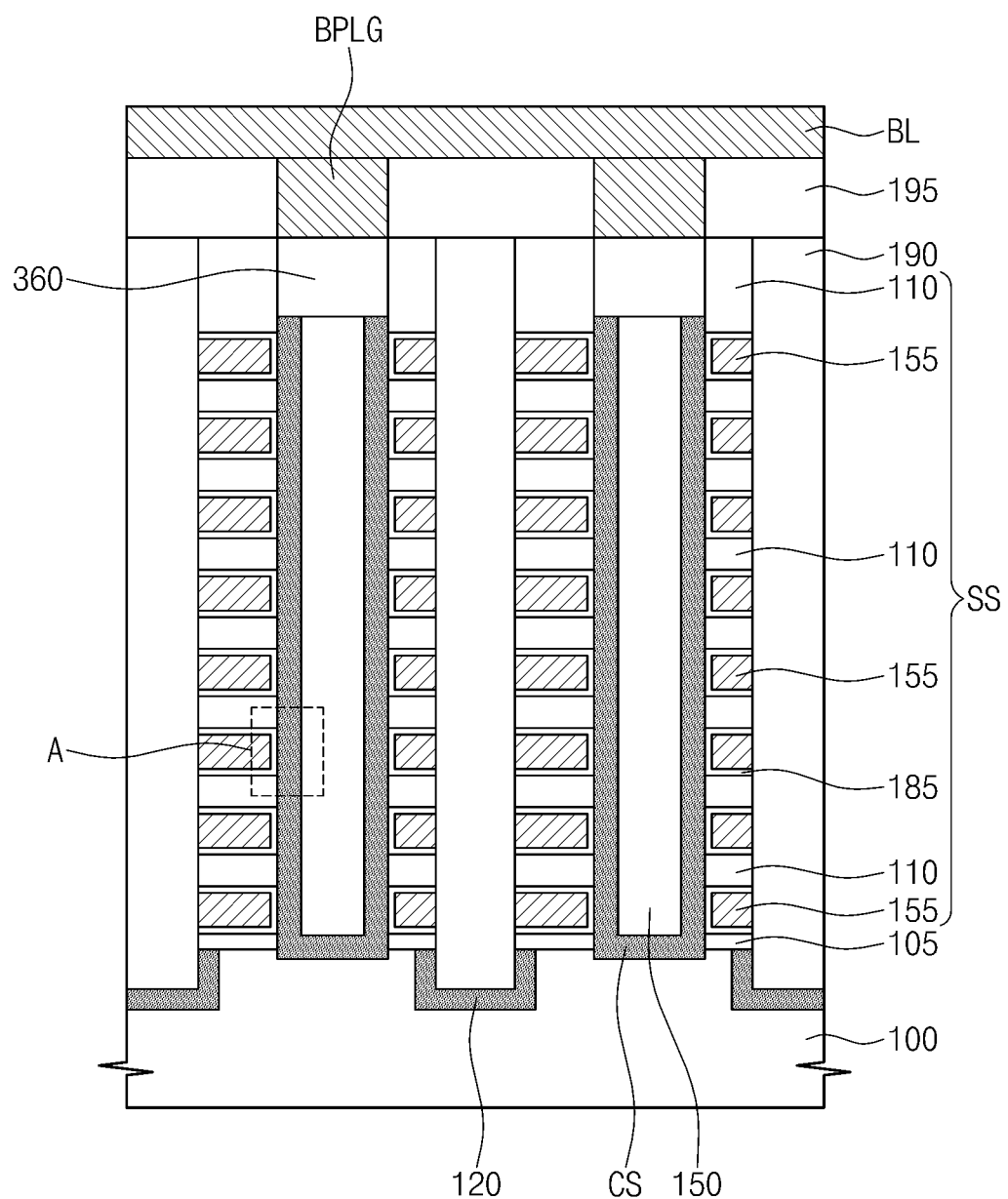

Referring to FIGS. 11F and 12B, an electrode separation pattern 190 may be formed on the common source regions 120 to fill the trenches TR. Furthermore, conductive pads 160 may be formed on and connected to the channel structures CS. Bit line plugs BPLG may be formed on the conductive pads 160 and bit lines BL may be formed on the bit line plugs BPLG.

FIG. 11F is a sectional view illustrating a 3D semiconductor memory device according to some embodiments of the inventive concept. FIG. 12B is an enlarged sectional view of a portion A of FIG. 11F. In the following description, for concise description, an element previously described with reference to FIGS. 4, 5J, and 6D may be identified by a similar or identical reference number without repeating an overlapping description thereof.

Referring to FIGS. 11F and 12B, insulating layers 110 and gate electrodes 155 may be alternately and repeatedly stacked on the substrate 100 to form a stack SS. Channel structures CS may be connected to the substrate 100 through the stack SS. Unlike the description with reference to FIGS. 4, 5J, and 6D, vertical insulators between the channel structures CS and the gate electrodes 155 may be omitted.

Horizontal insulators 185 may be interposed between the gate electrodes 155 and the channel structures CS. Each of the horizontal insulators 185 may include a horizontal portion extending between the gate electrode 155 and the insulating layer 110 and a vertical portion extending between the gate electrode 155 and the channel structure CS.

Each of the horizontal insulators 185 may include a tunnel insulating layer TI, a charge storing layer CL, and a blocking insulating layer BI. The tunnel insulating layer TI may be adjacent to the channel structure CS, the blocking insulating layer BI may be adjacent to the gate electrode 155, and the charge storing layer CL may be interposed between the tunnel insulating layer TI and the blocking insulating layer BI.

For example, the tunnel insulating layer TI may include a third tunnel insulating layer 13, a second tunnel insulating layer 12, a high-k dielectric layer 11, a fourth tunnel insulating layer 14, and a first tunnel insulating layer 10 which are sequentially stacked on the channel structure CS. The fourth tunnel insulating layer 14 may include a nitrogen-containing material (e.g., silicon nitride or silicon oxynitride). For example, except for the fourth tunnel insulating layer 14 interposed between the first tunnel insulating layer 10 and the high-k dielectric layer 11, the tunnel insulating layer TI may be similar to that of FIG. 2.

Figure 13:
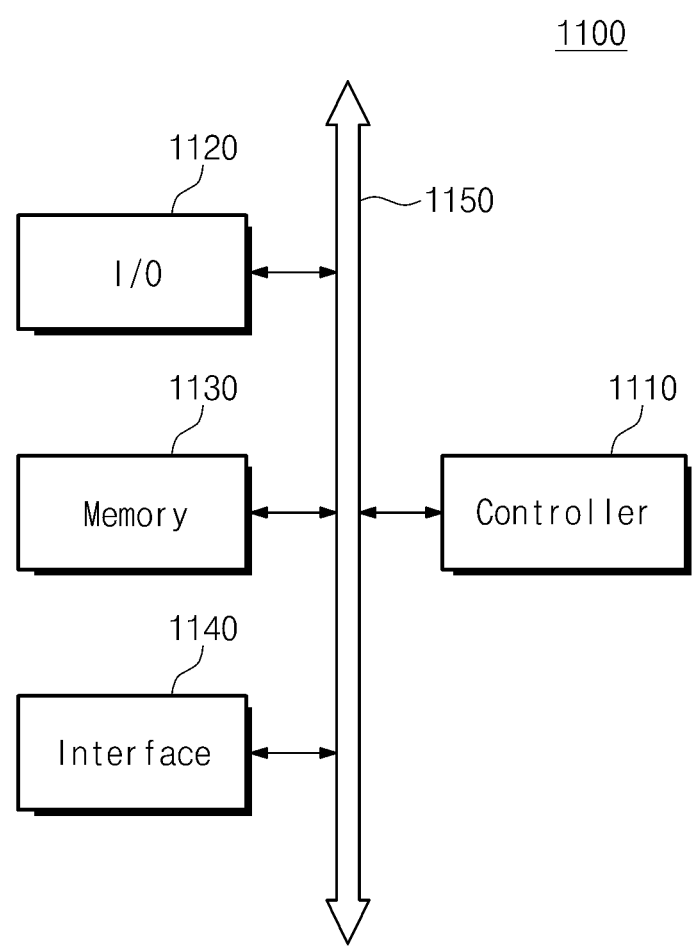
FIG. 13 is a block diagram illustrating an example of a memory system including a three-dimensional semiconductor memory device according to some embodiments of the inventive concept.

FIG. 13 is a block diagram illustrating an example of a memory system including a three-dimensional semiconductor memory device according to some embodiments of the inventive concept.

Referring to FIG. 13, a memory system 1100 can be applied to an electronic device such as a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a display device, a memory device 1130, an interface 1140 and a bus 1150. The memory device 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory device 1130 may be used to store an instruction executed by the controller 1110. The input/output device 1120 may receive data or a signal from the outside of the system 1100 or transmit data or a signal to the outside of the system 1100. For example, the input/output device 1120 may include a keyboard, a keypad and/or a display.

The memory device 1130 includes at least one of the three-dimensional semiconductor memory devices according to some embodiments of the inventive concept. The memory device 1130 may further include other memory devices, such as randomly-accessible volatile memory devices.

The interface 1140 transmits data to a communication network or receives data from a communication network.

For example, a three-dimensional semiconductor memory device according to an embodiment of the inventive concept or a memory system comprising the same may be packaged in various kinds of ways. For instance, the three-dimensional semiconductor memory device or the memory system may be employed in a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique. The package in which the three-dimensional semiconductor device according to one of the above embodiments is mounted may further include at least one semiconductor device (e.g., a controller and/or a logic device) that controls the three-dimensional semiconductor device.

Figure 14:
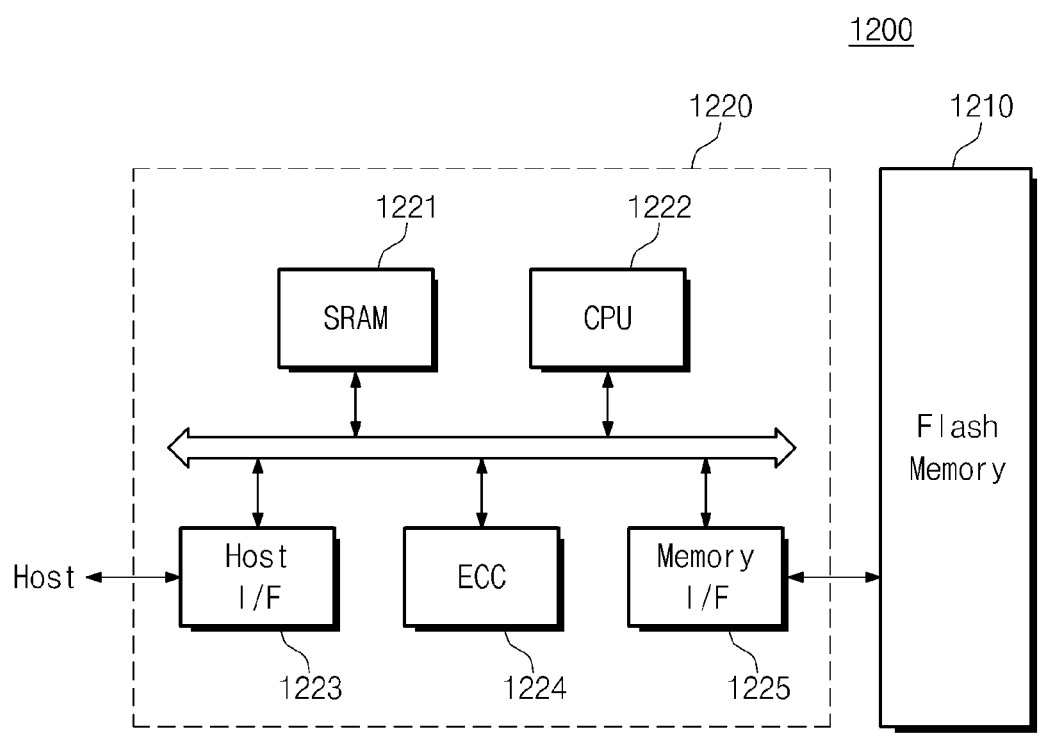
FIG. 14 is a block diagram illustrating an example of a memory card including a three-dimensional semiconductor memory device according to some embodiments of the inventive concept.

FIG. 14 is a block diagram illustrating a memory card including a three-dimensional semiconductor memory device according to some embodiments of the inventive concept.

Referring to FIG. 14, a memory card 1200 may be configured to include a semiconductor memory device 1210, which may be a three-dimensional semiconductor memory devices according to some embodiments of the inventive concept. The memory card 1200 includes a memory controller 1220 configured to control a data exchange operation between a host and the semiconductor memory device 1210.

A static random access memory (SRAM) 1221 may be used as an operation memory of a processing unit 1222. A host interface 1223 may include data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. Even though not depicted in drawings, it is apparent to one of ordinary skill in the art that the memory card 1200 according to some embodiments of the inventive concept may further include a ROM ((not shown)) storing code data for interfacing with the host.

Figure 15:
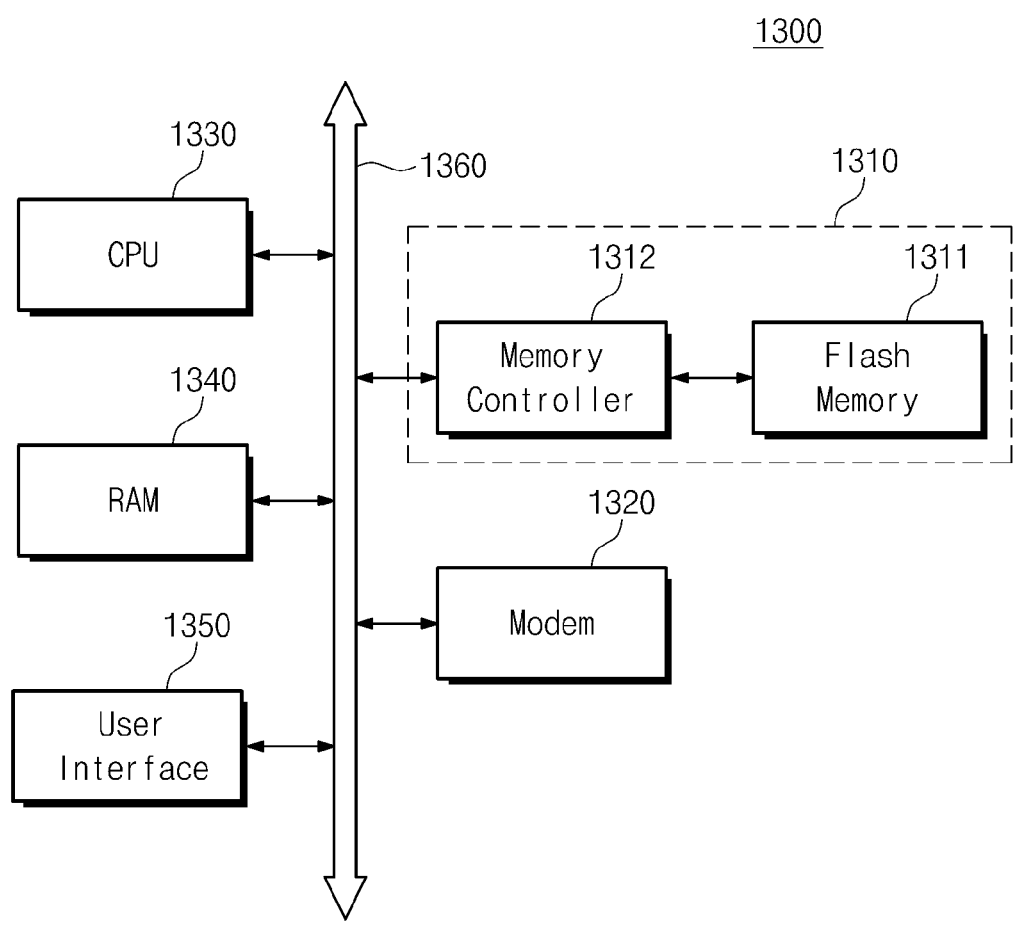
FIG. 15 is a schematic block diagram illustrating an information processing system including a three-dimensional semiconductor memory device according to some embodiments of the inventive concept.

FIG. 15 is a schematic block diagram illustrating an information processing system including a three-dimensional semiconductor memory device according to some embodiments of the inventive concept.

Referring to FIG. 15, an information processing system 1300 may be realized using a memory system 1310 including at least one of the three-dimensional semiconductor memory devices according to some embodiments of the inventive concept. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identically to the memory card 1200 described with respect to FIG. 14. Data processed by the CPU 1330 and/or input from the outside may be stored in the memory system 1310. In some embodiments, the memory system 1310 may be used as a portion of a solid state drive SSD, and in this case, the information processing system 1300 may stably and reliably store a large amount of data in the memory system 1310. Although not illustrated, an application chipset, a camera image sensor, a camera image signal processor (ISP), an input/output device, or the like may further be included in the information processing system 1300 according to certain embodiments of the inventive concept.

According to certain embodiments of the inventive concept, a three-dimensional semiconductor memory device may include a tunnel insulating layer, in which a high-k dielectric with a low charge trap site density is additionally provided. Accordingly, the three-dimensional semiconductor memory device may have improved retention and endurance characteristics.

The example embodiments of this disclosure are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

What is claimed is:

1. A semiconductor device, comprising:
    a stack including gate electrodes and insulating layers alternately and repeatedly stacked on a substrate;
    a channel structure connected to the substrate and extending through the stack; for each gate electrode:
        a charge storing layer between the channel structure and the gate electrode;
        a tunnel insulating layer between the charge storing layer and the channel structure; and
        a blocking insulating layer between the charge storing layer and the gate electrode,
    wherein the tunnel insulating layer comprises a first tunnel insulating layer between the charge storing layer and the channel structure, a high-k dielectric layer between the charge storing layer and the first tunnel insulating layer, and a second tunnel insulating layer between the first tunnel insulating layer and the high-k dielectric layer,
    the first tunnel insulating layer comprises a silicon oxide layer, and
    the second tunnel insulating layer comprises a silicon nitride layer or a silicon oxynitride layer,
    wherein, at each gate electrode, the blocking insulating layer extends between the gate electrode and its corresponding insulating layers.

2. The device of claim 1, wherein the high-k dielectric layer has an energy band gap smaller than those of the first and second tunnel insulating layers.

3. The device of claim 1, wherein the high-k dielectric layer comprises ScAlO, HfAlO, or a multiple layer of HfO/Oxide/HfO.

4. The device of claim 1, wherein the high-k dielectric layer has a charge trap site density smaller than that of the second tunnel insulating layer.

5. The device of claim 1, wherein the tunnel insulating layer further comprises a third tunnel insulating layer between the charge storing layer and the high-k dielectric layer, and the third tunnel insulating layer has an energy band gap greater than that of the second tunnel insulating layer.

6. The device of claim 5, wherein the third tunnel insulating layer comprises a silicon nitride layer or a silicon oxynitride layer, and the third tunnel insulating layer has a nitrogen concentration lower than that of the second tunnel insulating layer.

7. The device of claim 1, wherein the first tunnel insulating layer, the second tunnel insulating layer, and the high-k dielectric layer constitute a single continuous structure extending between the stack and the channel structure.

8. The device of claim 7, wherein the charge storing layer extends between the stack and the channel structure.

9. The device of claim 8, wherein the blocking insulating layer extends between the stack and the channel structure.

10. The device of claim 7, wherein, at each gate electrode, the charge storing layer and the blocking insulating layer extend between the gate electrode and its corresponding insulating layers.

11. The device of claim 5, wherein, at each gate electrode, the charge storing layer, the blocking insulating layer, and the third tunnel insulating layer extend between the gate electrode and its corresponding insulating layers, and the first tunnel insulating layer, the second tunnel insulating layer, and
    the high-k dielectric layer constitute a single structure extending between the stack and the channel structure.

12. The device of claim 1, wherein, at each gate electrode, the charge storing layer, the blocking insulating layer, and the tunnel insulating layer constitute a single structure extending between the gate electrode and its corresponding insulating layers.

13. A method of fabricating a semiconductor device, comprising:
    alternately and repeatedly stacking sacrificial layers and insulating layers on a substrate to form a layered structure;
    forming a channel hole to penetrate the layered structure and expose the substrate; and
    sequentially forming a tunnel insulating layer and a channel structure in the channel hole,
    wherein the forming of the tunnel insulating layer comprises sequentially forming a high-k dielectric layer, a second tunnel insulating layer, and a first tunnel insulating layer on an inner side surface of the channel hole,
    the first tunnel insulating layer comprises a silicon oxide layer, and
    the second tunnel insulating layer comprises a silicon nitride layer or a silicon oxynitride layer, and
    wherein, before the forming of the channel structure, performing a curing process on the first tunnel insulating layer, and
    wherein the second tunnel insulating layer prevents the high-k dielectric layer from being oxidized during the curing process.

14. An electronic device, comprising:
a stack including gate electrodes and insulating layers alternately and repeatedly stacked in a first direction on a substrate;
a channel structure connected to the substrate and extending in the first direction through the stack; and
a blocking insulating layer, a charge storing layer, and a tunnel insulating layer sequentially stacked in a second direction perpendicular to the first direction between a gate electrode and the channel structure,
wherein the tunnel insulating layer comprises a high-k dielectric layer, a first tunnel insulating layer, and a second tunnel insulating layer sequentially stacked in the second direction,
the first tunnel insulating layer comprises a silicon nitride layer or a silicon oxynitride layer, and
the second tunnel insulating layer comprises a silicon oxide layer.

15. The electronic device of claim 14, wherein the second tunnel insulating layer has a thickness greater than that of the first tunnel insulating layer.

16. The electronic device of claim 14, wherein the high-k dielectric layer has an energy band gap smaller than those of the first and second tunnel insulating layers.

17. The electronic device of claim 14, wherein the tunnel insulating layer further comprises a third tunnel insulating layer between the charge storing layer and the high-k dielectric layer, and
the third tunnel insulating layer has an energy band gap greater than that of the first tunnel insulating layer.

18. The electronic device of claim 14, wherein the stack of gate electrodes forms a part of a memory cell array, and further comprising:
a memory controller, a modem, or a central processing unit in communication with the memory cell array.

* * * * *